(12) United States Patent
Kim

(10) Patent No.: US 12,480,039 B2
(45) Date of Patent: Nov. 25, 2025

(54) LIGHT-EMITTING DEVICE HAVING IMPROVED LUMINESCENCE EFFICIENCY AND LIFESPAN AND AN ELECTRONIC APPARATUS INCLUDING THE LIGHT-EMITTING DEVICE

(71) Applicant: Samsung Display Co., Ltd., Yongin-si (KR)

(72) Inventor: Hyeongpil Kim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 1045 days.

(21) Appl. No.: 17/528,187

(22) Filed: Nov. 16, 2021

(65) Prior Publication Data

US 2022/0199903 A1   Jun. 23, 2022

(30) Foreign Application Priority Data

Dec. 22, 2020   (KR) .................. 10-2020-0181180

(51) Int. Cl.
*C09K 11/06*   (2006.01)
*H10K 30/80*   (2023.01)
(Continued)

(52) U.S. Cl.
CPC .............. *C09K 11/06* (2013.01); *H10K 50/17* (2023.02); *H10K 59/873* (2023.02);
(Continued)

(58) Field of Classification Search
CPC .. H10K 50/17; H10K 59/873; H10K 59/8793; H10K 85/322; H10K 85/633;
(Continued)

(56) References Cited

U.S. PATENT DOCUMENTS

| 6,023,073 A | 2/2000 | Strite |
| 7,164,151 B2 * | 1/2007 | Yamazaki ............ H10K 50/171 257/E27.111 |

(Continued)

FOREIGN PATENT DOCUMENTS

| JP | 4789209 | 10/2011 |
| KR | 10-0332186 B1 | 5/2002 |

(Continued)

*Primary Examiner* — Caleb E Henry
(74) *Attorney, Agent, or Firm* — Womble Bond Dickinson (US) LLP

(57) ABSTRACT

A light-emitting device includes: a first electrode; a second electrode facing the first electrode; and an interlayer between the first electrode and the second electrode and including an emission layer, wherein the interlayer includes a hole injection layer and a hole transport layer between the first electrode and the emission layer, the hole injection layer directly contacts the first electrode, the hole injection layer has a multi-layered structure of at least two different layers that are stacked on each other, the hole injection layer includes at least one inorganic material of a post-transition metal, a metalloid, a compound including at least two post-transition metal elements, a compound including at least two metalloid elements, or a compound including a post-transition metal element and a metalloid element, the post-transition metal and the metalloid are described herein.

20 Claims, 6 Drawing Sheets

(51) Int. Cl.

| | |
|---|---|
| *H10K 50/11* | (2023.01) |
| *H10K 50/15* | (2023.01) |
| *H10K 50/17* | (2023.01) |
| *H10K 59/122* | (2023.01) |
| *H10K 59/80* | (2023.01) |
| *H10K 85/60* | (2023.01) |
| *H10K 101/20* | (2023.01) |
| *H10K 102/00* | (2023.01) |

(52) U.S. Cl.
CPC ....... *H10K 59/8793* (2023.02); *H10K 85/633* (2023.02); *H10K 85/636* (2023.02); *H10K 85/6572* (2023.02); *H10K 85/6574* (2023.02); *H10K 85/658* (2023.02); *C09K 2211/1007* (2013.01); *H10K 30/865* (2023.02); *H10K 50/11* (2023.02); *H10K 50/15* (2023.02); *H10K 59/122* (2023.02); *H10K 2101/20* (2023.02); *H10K 2102/00* (2023.02)

(58) Field of Classification Search
CPC ............. H10K 85/636; H10K 85/6572; H10K 85/6574; H10K 85/658; H10K 30/865; H10K 50/11; H10K 50/15; H10K 59/122; H10K 2101/20; H10K 2102/00; H10K 2101/30; H10K 2101/40; H10K 85/615; H10K 85/622; H10K 85/626; H10K 59/38; H10K 59/40; H10K 50/12; H10K 85/111; H10K 85/324; H10K 85/342; H10K 85/346; H10K 85/40; H10K 85/624; H10K 85/631; H10K 85/654; H10K 85/657; H10K 85/6576; C09K 11/06; C09K 2211/1007; C01F 17/00; C01G 30/002

See application file for complete search history.

(56) References Cited

U.S. PATENT DOCUMENTS

| | | | | |
|---|---|---|---|---|
| 7,771,843 B2 * | 8/2010 | Suh | ...... | H10K 50/155 |
| | | | | 428/917 |
| 7,829,205 B2 | 11/2010 | Lee et al. | | |
| 7,875,895 B2 | 1/2011 | Kwack et al. | | |
| 8,648,333 B2 * | 2/2014 | Wang | ...... | H05B 33/14 |
| | | | | 257/40 |
| 8,937,300 B2 * | 1/2015 | Wang | ...... | H05B 33/20 |
| | | | | 252/301.16 |
| 9,209,427 B2 * | 12/2015 | Yamazaki | ...... | C23C 14/24 |
| 9,458,532 B2 * | 10/2016 | Sonoda | ...... | H10K 71/191 |
| 9,553,202 B2 * | 1/2017 | Kurata | ...... | H10D 86/01 |
| 10,109,807 B2 * | 10/2018 | Kamatani | ...... | H10K 85/342 |
| 10,520,782 B2 * | 12/2019 | Busch | ...... | G02B 27/017 |
| 10,642,110 B2 * | 5/2020 | Takahashi | ...... | G06F 3/0446 |
| 10,651,388 B2 * | 5/2020 | Scheible | ...... | H10K 85/30 |
| 10,741,772 B2 * | 8/2020 | Lee | ...... | C09K 11/025 |
| 2004/0056590 A1 * | 3/2004 | Lim | ...... | H10K 50/852 |
| | | | | 313/506 |
| 2005/0258433 A1 * | 11/2005 | Djurovich | ...... | H10K 85/6572 |
| | | | | 257/79 |
| 2007/0111794 A1 | 5/2007 | Hogan et al. | | |
| 2010/0323464 A1 * | 12/2010 | Cheon | ...... | H10K 71/15 |
| | | | | 438/22 |
| 2011/0098473 A1 * | 4/2011 | Molt | ...... | C07F 15/0093 |
| | | | | 546/10 |
| 2013/0056719 A1 * | 3/2013 | Komatsu | ...... | H10K 50/17 |
| | | | | 438/34 |
| 2013/0126840 A1 * | 5/2013 | Fujimura | ...... | H10K 50/17 |
| | | | | 438/46 |
| 2013/0126842 A1 * | 5/2013 | Takeuchi | ...... | H10K 50/818 |
| | | | | 438/30 |
| 2013/0134474 A1 * | 5/2013 | Takeuchi | ...... | H10H 20/833 |
| | | | | 438/22 |
| 2013/0252364 A1 * | 9/2013 | Kawato | ...... | H10K 71/00 |
| | | | | 438/46 |
| 2013/0260501 A1 * | 10/2013 | Sonoda | ...... | H10K 50/844 |
| | | | | 438/46 |
| 2013/0295716 A1 * | 11/2013 | Kawato | ...... | C23C 14/044 |
| | | | | 438/99 |
| 2013/0337597 A1 * | 12/2013 | Kawato | ...... | C23C 14/562 |
| | | | | 438/34 |
| 2014/0167016 A1 * | 6/2014 | Yoo | ...... | H10K 59/8052 |
| | | | | 257/40 |
| 2016/0020397 A1 * | 1/2016 | Sannomiya | ...... | H10K 85/654 |
| | | | | 544/212 |
| 2016/0072078 A1 * | 3/2016 | Lee | ...... | H10K 85/6572 |
| | | | | 257/40 |
| 2016/0254330 A1 * | 9/2016 | Uchida | ...... | H10K 50/171 |
| | | | | 257/40 |
| 2016/0308131 A1 * | 10/2016 | Kobayashi | ...... | C23C 16/042 |
| 2017/0069790 A1 * | 3/2017 | Choi | ...... | H10H 20/825 |
| 2017/0133633 A1 | 5/2017 | Wang et al. | | |
| 2017/0309833 A1 * | 10/2017 | Lei | ...... | H10K 50/17 |
| 2018/0086775 A1 * | 3/2018 | Hong | ...... | C07D 333/78 |
| 2018/0226024 A1 * | 8/2018 | Tang | ...... | H10K 50/814 |
| 2018/0269421 A1 * | 9/2018 | Pan | ...... | H10K 77/111 |
| 2018/0375048 A1 | 12/2018 | Kim et al. | | |
| 2019/0081116 A1 * | 3/2019 | Kondo | ...... | H10K 59/35 |
| 2019/0096318 A1 * | 3/2019 | Kim | ...... | H10H 20/83 |
| 2019/0267438 A1 * | 8/2019 | Goto | ...... | H10K 71/00 |
| 2019/0372025 A1 * | 12/2019 | Stengel | ...... | H10K 85/321 |
| 2020/0013977 A1 * | 1/2020 | Wang | ...... | H10H 20/851 |
| 2020/0161594 A1 * | 5/2020 | Kondo | ...... | H10K 50/13 |
| 2020/0279897 A1 * | 9/2020 | Nendai | ...... | H10K 50/81 |
| 2021/0217964 A1 | 7/2021 | Kim et al. | | |
| 2021/0253618 A1 * | 8/2021 | Kwon | ...... | C07F 15/0033 |
| 2022/0093868 A1 | 3/2022 | Lee et al. | | |

FOREIGN PATENT DOCUMENTS

| | | |
|---|---|---|
| KR | 10-0873082 | 12/2008 |
| KR | 10-1030008 | 4/2011 |
| KR | 10-2019-0126097 | 11/2011 |
| KR | 10-2013-0134983 A | 12/2013 |
| KR | 10-2019-0000019 | 1/2019 |
| KR | 10-2019-0140417 | 12/2019 |
| KR | 10-2020-0021423 A | 2/2020 |
| KR | 10-2021-0064465 | 6/2021 |
| KR | 10-2021-0090331 | 7/2021 |

* cited by examiner

LIGHT-EMITTING DEVICE HAVING IMPROVED LUMINESCENCE EFFICIENCY AND LIFESPAN AND AN ELECTRONIC APPARATUS INCLUDING THE LIGHT-EMITTING DEVICE

CROSS-REFERENCE TO RELATED APPLICATION

This application claims priority from and the benefit of Korean Patent Application No. 10-2020-0181180, filed on Dec. 22, 2020, which is hereby incorporated by reference for all purposes as if fully set forth herein.

BACKGROUND

Field

Embodiments of the invention relate generally to display device and, more particularly, to a light-emitting device and an electronic apparatus including the light-emitting device.

Description of the Background

Light-emitting devices are self-emission devices that have wide viewing angles, high contrast ratios, short response times, and excellent characteristics in terms of brightness, driving voltage, and response speed.

Light-emitting devices may include a first electrode on a substrate, and a hole transport region, an emission layer, an electron transport region, and a second electrode sequentially stacked on the first electrode. Holes provided from the first electrode may move toward the emission layer through the hole transport region, and electrons provided from the second electrode may move toward the emission layer through the electron transport region. Carriers, such as holes and electrons, recombine in the emission layer to produce excitons. These excitons transition from an excited state to a ground state to thereby generate light.

The above information disclosed in this Background section is only for understanding of the background of the inventive concepts, and, therefore, it may contain information that does not constitute prior art.

SUMMARY

Light-emitting devices and electronic apparatuses including the same constructed according to the principles and illustrative implementations of the invention have significant and unexpectedly high luminescence efficiency and long lifespan compared to the related art. For example, according to one or more embodiments, it was found that when the light-emitting device includes at least one inorganic material selected from the group consisting of a post-transition metal, a metalloid, a compound including at least two post-transition metal elements, a compound including at least two metalloid elements, and a compound including a post-transition metal element and a metalloid element in the hole injection layer, the light-emitting device has significant and unexpectedly excellent characteristics such as a low driving voltage, a high current density at the same voltage, and a color purity and luminescence efficiency equal to or higher than those of devices in the related art.

Additional features of the inventive concepts will be set forth in the description which follows, and in part will be apparent from the description, or may be learned by practice of the inventive concepts.

According to one aspect of the invention, a light-emitting device includes: a first electrode; a second electrode facing the first electrode; and an interlayer between the first electrode and the second electrode and including an emission layer, wherein the interlayer includes a hole injection layer and a hole transport layer between the first electrode and the emission layer, the hole injection layer directly contacts the first electrode, the hole injection layer has a multi-layered structure of at least two different layers that are stacked on each other, the hole injection layer includes at least one inorganic material of a post-transition metal, a metalloid, a compound including at least two post-transition metal elements, a compound including at least two metalloid elements, or a compound including a post-transition metal element and a metalloid element, the post-transition metal includes aluminum, gallium, indium, thallium, tin, lead, flerovium, bismuth, polonium, or a combination thereof, and the metalloid includes boron, silicon, germanium, arsenic, antimony, tellurium, astatine, or a combination thereof.

The inorganic material may include an alloy of a post-transition metal and a metalloid or a compound including a post-transition metal element and a metalloid element.

The inorganic material may be one or more compounds described herein.

The inorganic material may include a compound including a post-transition metal element and a metalloid element, wherein the metalloid element in the inorganic material may have a metal content greater than about 0 wt % and less than about 50 wt %.

The inorganic material may have a work function with an absolute value of 4.0 eV or greater.

The hole injection layer may include a hole transporting material.

The hole transporting material may include at least one group represented by Formulae CY201 to CY217, as defined herein.

The hole injection layer may have inorganic material with a weight content in a range of about 0.01 wt % to about 49.9 wt %, based on the total weight of the hole injection layer.

The emission layer may include a host and a dopant, and the host may include an anthracene compound, as described herein.

The host may include an anthracene compound represented by Formula 1-1, as defined herein.

The emission layer may include a host and a dopant, and the dopant may include a condensed-cyclic compound represented by Formula 2, as defined herein.

The hole transport layer may include a hole transporting material and may not include the inorganic material.

The hole injection layer may include a first hole injection layer and a second hole injection layer sequentially stacked on the first electrode, the first hole injection layer may consist of the inorganic material, and the second hole injection layer may include the inorganic material and a hole transporting material.

The hole injection layer may include a first hole injection layer and a second hole injection layer that may be sequentially stacked on the first electrode, the first hole injection layer may include the inorganic material and a hole transporting material, and the second hole injection layer may consist of the inorganic material.

The hole injection layer may include a first hole injection layer, a second hole injection layer, and a third hole injection layer sequentially stacked on the first electrode, the first hole injection layer and the third hole injection layer each, independently from one another, may consist of the inorganic material, and the second hole injection layer may include the inorganic material and a hole transporting material.

The hole injection layer may include a first hole injection layer, a second hole injection layer, and a third hole injection layer sequentially stacked on the first, independently from one another, electrode, the first hole injection layer and the third hole injection layer may each, independently from one another, include the inorganic material and a hole transport material, and the second hole injection layer consists of the inorganic material.

A light-emitting device includes: a first electrode; a second electrode facing the first electrode; and an interlayer between the first electrode and the second electrode and including an emission layer, wherein the interlayer includes a hole injection layer and a hole transport layer between the first electrode and the emission layer, the hole injection layer including a single layer directly contacting the first electrode, the hole injection layer includes at least one inorganic material of a post-transition metal, a metalloid, a compound including at least two post-transition metal elements, a compound including at least two metalloid elements, or a compound including a post-transition metal element and a metalloid element, the post-transition metal includes aluminum, gallium, indium, thallium, tin, lead, flerovium, bismuth, polonium, or a combination thereof, the metalloid includes boron, silicon, germanium, arsenic, antimony, tellurium, astatine, or a combination thereof, and the emission layer includes a host and a dopant, as described herein.

An electronic apparatus may include the light-emitting device, as described herein.

The electronic apparatus may further include a functional area in the form of a touchscreen layer, a polarization layer, a color filter, a color-conversion layer, or any combination thereof.

The electronic apparatus may also further include a color-conversion layer disposed in at least one traveling direction of light to be emitted from the light-emitting device.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
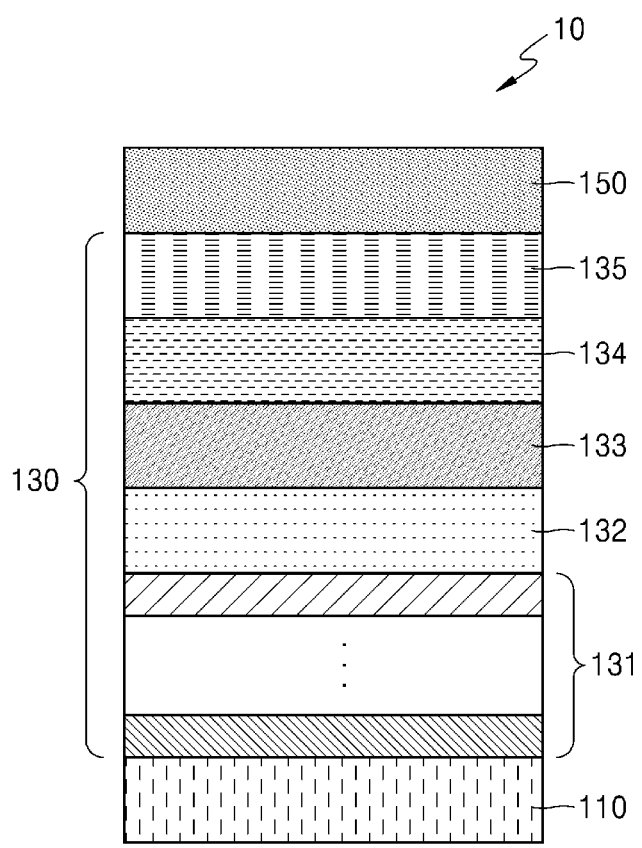
FIG. 1 is a schematic cross-sectional view of an embodiment illustrating a light-emitting device constructed according to the principles of the invention.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements. Thus, components of one illustrated embodiment that are the same or correspond to components of another illustrated embodiment may have the same reference numeral, and redundant explanations are omitted to avoid redundancy.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting. Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Description of FIG. 1

FIG. 1 is a schematic cross-sectional view of an embodiment illustrating a light-emitting device constructed according to the principles of the invention.

The light-emitting device 10 may include a first electrode 110, an interlayer 130, and a second electrode 150. Hereinafter, the structure of the light-emitting device 10 according to an embodiment and an illustrative method of manufacturing the light-emitting device 10 will be described in connection with FIG. 1.

First Electrode 110

In FIG. 1, a substrate may be additionally located under the first electrode 110 or above the second electrode 150. The substrate may be a glass substrate or a plastic substrate. The substrate may be a flexible substrate including a plastic having excellent heat resistance and durability, for example, a polyimide, a polyethylene terephthalate (PET), a polycarbonate, a polyethylene naphthalate, a polyarylate (PAR), a polyetherimide, or any combination thereof. The first electrode 110 may be formed by depositing or sputtering, on the substrate, a material for forming the first electrode 110. When the first electrode 110 is an anode, a high work function material that may easily inject holes may be used as a material for a first electrode.

The first electrode 110 may be a reflective electrode, a semi-transmissive electrode, or a transmissive electrode. When the first electrode 110 is a transmissive electrode, a material for forming the first electrode 110 may be an indium tin oxide (ITO), an indium zinc oxide (IZO), a tin oxide ($SnO_2$), a zinc oxide (ZnO), or any combinations thereof. In some embodiments, when the first electrode 110 is a semi-transmissive electrode or a reflective electrode, magnesium (Mg), silver (Ag), aluminum (Al), aluminum-lithium (Al—Li), calcium (Ca), magnesium-indium (Mg—In), magnesium-silver (Mg—Ag), or any combination thereof may be used as a material for forming the first electrode 110. The first electrode 110 may have a single-layered structure consisting of a single layer or a multi-layered structure including two or more layers. In some embodiments, the first electrode 110 may have a triple-layered structure of ITO/Ag/ITO.

Interlayer 130

The interlayer 130 may be on the first electrode 110. The interlayer 130 may include a hole injection layer 131, a hole transport layer 132, an emission layer 133, an electron transport layer 134, and an electron injection layer 135. In FIG. 1, the light-emitting device 10 is shown as including the electron transport layer 134 and the electron injection layer 135, however, at least one of the electron transport layer 134 and the electron injection layer 135 may be omitted, according to a need. The interlayer 130 may further include metal-containing compounds such as organometallic compounds, inorganic materials such as quantum dots, and the like, in addition to various organic materials.

The interlayer 130 may include: i) at least two emitting units sequentially stacked between the first electrode 110 and the second electrode 150; and ii) a charge-generation layer located between the at least two emitting units. When the interlayer 130 includes the at least two emitting units and a charge generation layer, the light-emitting device 10 may be a tandem light-emitting device.

Hole Transport Region in Interlayer 130

The hole transport region may include the hole injection layer 131 and the hole transport layer 132. The hole transport region may further include an emission auxiliary layer, an electron blocking layer, or a combination thereof. For example, the hole transport region may have a multi-layered structure, e.g., a hole injection layer 131/hole transport layer 132 structure, a hole injection layer 131/hole transport layer 132/emission auxiliary layer structure, or a hole injection layer 131/hole transport layer 132/electron blocking layer structure, wherein layers of each structure are sequentially stacked on the first electrode 110 in each stated order.

Hole Injection Layer 131

The hole injection layer 131 may be in direct contact with the first electrode 110. In some embodiments, the hole injection layer 131 may have a multi-layered structure of at least two different layers that may be stacked. In some embodiments, as shown in a light-emitting device 40 in FIG. 4 discussed below, the hole injection layer 131 may be a single layer. The hole injection layer 131 may include at least one inorganic material selected from the group consisting of a post-transition metal, a metalloid, a compound including at least two post-transition metal elements, a compound including at least two metalloid elements, and a compound including a post-transition metal element and a metalloid element.

The post-transition metal or the post-transition metal element may be aluminum (Al), gallium (Ga), indium (In), thallium (Tl), tin (Sn), lead (Pb), flerovium (Fl), bismuth (Bi), polonium (Po), or a combination thereof. The metalloid or the metalloid element may be boron (B), silicon (Si), germanium (Ge), arsenic (As), antimony (Sb), tellurium (Te), astatine (At), or a combination thereof.

In an embodiment, the hole injection layer 131 may include an alloy of at least two post-transition metals as the inorganic material. In an embodiment, the compound including at least two post-transition metal elements may be a compound consisting of at least two post-transition metal elements. In an embodiment, the hole injection layer 131 may include an alloy of at least two metalloids as the inorganic material. In an embodiment, the compound including at least two metalloid elements may be a compound consisting of at least two metalloid elements. For example, the compound including at least two metalloid elements may include $Sb_2Te_3$, $As_2Te_3$, GeSbTe, SiTe, GeTe, or SiGe.

In an embodiment, the hole injection layer 131 may include an alloy of a post-transition metal and a metalloid as the inorganic material. In an embodiment, the compound including a post-transition metal element and a metalloid element may be the compound consisting of a post-transition metal element and a metalloid element. For example, the compound including a post-transition metal element and a metalloid element may include $Bi_2Te_3$, $Bi_7Te_3$, $Bi_2Te$, $Bi_4Te_3$, BiTe, $Bi_6Te_7$, $Bi_4Te_5$, $Bi_xTe_y$ (wherein 0<x<100, 0<y<100, and 0<x+y≤100), $In_2Te_3$, $Ga_2Te_2$, $Al_2Te_3$, $Tl_2Te_3$, SnTe, PbTe, FlTe, AlInSb, AlGaSb, AlAsSb, GaAs, InSb, AlSb, AlAs, $Al_aIn_aSb$ (wherein 0<a<1), $Al_bIn_{(1-b)}Sb$ (wherein 0<b<1), AlSb, GaSb, and AlInGaAs.

In an embodiment, the inorganic material may be an alloy of a post-transition metal and a metalloid or a compound including a post-transition metal element and a metalloid element. For example, the compound including a post-transition metal element and a metalloid element may be a compound consisting of a post-transition metal element and a metalloid element.

In an embodiment, the inorganic material may be $Bi_2Te_3$, $Bi_7Te_3$, $Bi_2Te$, $Bi_4Te_3$, BiTe, $Bi_6Te_7$, $Bi_4Te_5$, $Bi_xTe_y$ (wherein 0<x<100, 0<y<100, and 0<x+y≤100), $Sb_2Te_3$, $In_2Te_3$, $Ga_2Te_2$, $Al_2Te_3$, $Tl_2Te_3$, $As_2Te_3$, GeSbTe, SnTe, PbTe, SiTe, GeTe, FlTe, SiGe, AlInSb, AlGaSb, AlAsSb, GaAs, InSb, AlSb, AlAs, $Al_aIn_aSb$ (wherein 0<a<1), $Al_bIn_{(1-b)}Sb$ (wherein 0<b<1), AlSb, GaSb, AlInGaAs, or a combination thereof.

For example, the inorganic material may be $Bi_2Te_3$, $Bi_7Te_3$, $Bi_2Te$, $Bi_4Te_3$, BiTe, $Bi_6Te_7$, $Bi_4Te_5$, $Bi_xTe_y$ (wherein 0<x<100, 0<y<100, and 0<x+y≤100), or a combination thereof. In an embodiment, when the inorganic material is a compound including a post-transition metal element and a metalloid element, a content of the metalloid element in the inorganic material may be greater than about 0 weight percent (wt %) and less than about 50 wt %.

In an embodiment, the absolute value of a work function of the inorganic material may be about 4.0 electron volts (eV) or greater. For example, the absolute value of a work function of the inorganic material may be in a range of about 4.4 eV to about 5.0 eV, but embodiments are not limited thereto.

When the first electrode 110 is an anode that is a hole injection electrode, hole injection characteristics may be improved by including the inorganic material in the hole injection layer 131 in direct contact with the first electrode 110. For example, when the inorganic material is an alloy of a post-transition metal and a metalloid, by adjusting a content ratio of a post-transition metal and a metalloid, the work function of the hole injection layer 131 may be controlled. For example, because the absolute value of a work function of the hole injection layer 131 may tend to increase as a content of a metalloid in the hole injection layer 131 increases, an energy barrier between the first electrode 110 and the hole injection layer 131 may be controlled by adjusting a deposition rate of the post-transition metal and the metalloid.

In some embodiments, when the inorganic material is a compound consisting of a post-transition metal element and a metalloid element, the absolute value of a work function may tend to increase as a content ratio of the metalloid element in the inorganic material increases. In this embodiment, because the work function changes according to the content ratio of the metalloid element in the inorganic material, the energy barrier between the first electrode 110 and the hole injection layer 131 may be easily adjusted. Accordingly, when the first electrode 110 an anode, the hole injection characteristics of the light-emitting device 10 may be improved by effectively adjusting the hole injection barrier.

Table 1 shows absolute values of work functions of thin films co-deposited with bismuth as a post-transition metal and tellurium as a metalloid according to a content of tellurium, when an alloy of a post-transition metal and a metalloid is used as the inorganic material according to an embodiment.

TABLE 1

| Content ratio of Te in Bi:Te thin film (wt %) | Deposition rate ratio (Bi:Te) | Work function (absolute value) (eV) |
|---|---|---|
| 24% | 1:0.5 | 4.43 |
| 39% | 1:1 | 4.55 |
| 47% | 1:1.4 | 4.67 |
| 50% | 1:1.6 | 4.73 |
| 56% | 1:2 | 4.71 |

As shown in Table 1, it may be seen that as a content of tellurium, which is a metalloid, increases, the absolute value of the work function of the thin film generally increases.

Table 2 shows a weight ratio of bismuth and tellurium and absolute values of work functions of thin films deposited with $Bi_2Te_3$ that is an inorganic material according to one or more embodiments.

TABLE 2

| Weight ratio of Bi:Te in $Bi_2Te_3$ (%) | Work function (absolute value) (eV) |
|---|---|
| 52.195%:47.805% | 4.91 |

As the light-emitting device 10 according to one or more embodiments includes at least one inorganic material selected from the group consisting of a post-transition metal, a metalloid, a compound including at least two post-transition metal elements, a compound including at least two metalloid elements, and a compound including a post-transition metal element and a metalloid element in the hole injection layer 131, the light-emitting device 10 may have excellent characteristics such as a low driving voltage, a high current density at the same voltage, and a color purity and luminescence efficiency equal to or higher than those of a device in the related art.

In an embodiment, the hole injection layer 131 may further include a hole transporting material. The hole transporting material may be an organic material. The hole transporting material may include a compound included in the hole transport region described herein, e.g., a compound represented by Formula 201, a compound represented by Formula 202, or a combination thereof.

For example, the hole transporting material may include at least one of groups represented by Formulae CY201 to CY217:

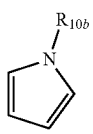

CY201

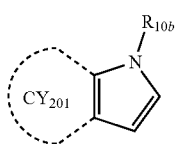

CY202

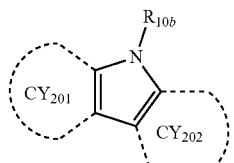

CY203

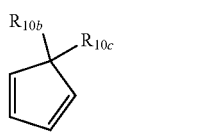

CY204

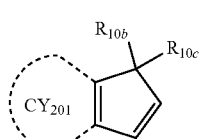

CY205

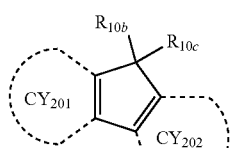

CY206

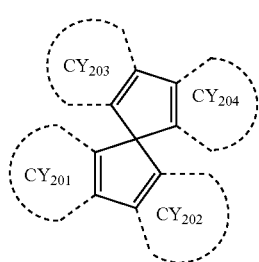

CY207

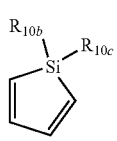

CY208

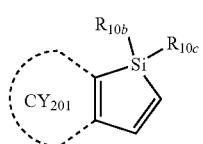

CY209

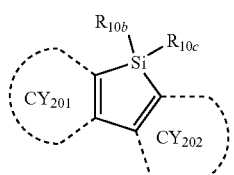

CY210

CY211

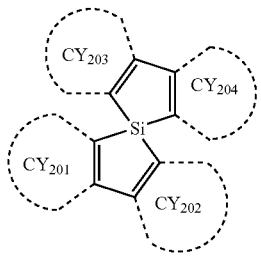

CY212

CY213

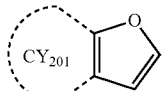

CY214

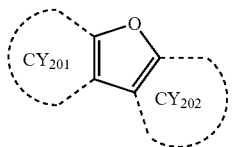

CY215

CY216

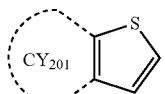

CY217

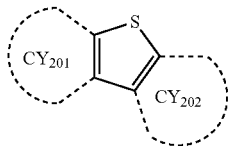

wherein, in Formulae CY201 to CY217, ring $CY_{201}$ to ring $CY_{204}$ may each independently be a $C_3$-$C_{20}$ carbocyclic group unsubstituted or substituted with at least one $R_{10a}$ or a $C_1$-$C_{20}$ heterocyclic group unsubstituted or substituted with at least one $R_{10a}$, and $R_{10b}$ and $R_{10c}$ may respectively be understood by referring to, independently from one another, the descriptions of $R_{10a}$ provided herein. In an embodiment, the content of the inorganic material in the hole injection layer 131 may be in a range of about 0.01 wt % to about 49.9 wt %, based on a total content of the hole injection layer 131, but embodiments are not limited thereto.

Hole Transport Layer 132

In an embodiment, the hole transport layer 132 may include a hole transporting material. In an embodiment, the hole transport layer 132 may include a hole transporting material and not include the inorganic material. The hole transporting material may include a material included in the hole transport region. In an embodiment, the hole transport layer 132 may be in direct contact with the emission layer 133. For example, the hole transport layer 132 may include the hole transporting material, and the hole transport layer 132 may not include the inorganic material and be in direct contact with the emission layer 133. That is, another organic layer may not be disposed between the hole transport layer 132 and the emission layer 133.

In one or more embodiments, an organic layer not including the inorganic material may be between the hole transport layer 132 and the emission layer 133. The organic layer may include an emission auxiliary layer, an electron blocking layer, or a combination thereof Hole Transporting Material A hole transporting material included in the hole transport region may include a compound represented by Formula 201, a compound represented by Formula 202, or a combination thereof:

Formula 201

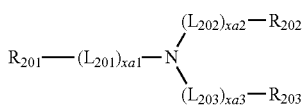

Formula 202

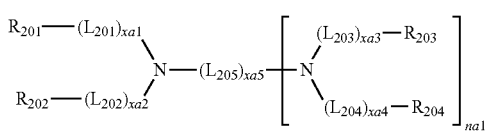

wherein, in Formulae 201 and 202, $L_{201}$ to $L_{204}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $L_{205}$ may be *—O—*', *—S—*', *—N($Q_{201}$)—*', a $C_1$-$C_{20}$ alkylene group unsubstituted or substituted with at least one $R_{10a}$, a $C_2$-$C_{20}$ alkenylene group unsubstituted or substituted with at least one $R_{10a}$, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, xa1 to xa4 may each independently be an integer from 0 to 5, xa5 may be an integer from 1 to 10, $R_{201}$ to $R_{204}$ and $Q_{201}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $R_{201}$ and $R_{202}$ may optionally be bound to each other via a single bond, a $C_1$-$C_5$ alkylene group unsubstituted or substituted with at least one $R_{10a}$, or a $C_2$-$C_5$ alkenylene group unsubstituted or substituted with at least one $R_{10a}$ to form a $C_8$-$C_{60}$ polycyclic group (e.g., a carbazole group or the like) unsubstituted or substituted with at least one $R_{10a}$ (e.g., Compound HT16 described herein), $R_{203}$ and $R_{204}$ may optionally be bound to each other via a single bond, a $C_1$-$C_5$ alkylene group unsubstituted or substituted with at least one $R_{10a}$, or a $C_2$-$C_5$ alkenylene group unsubstituted or substituted with at least one $R_{10a}$ to form a $C_8$-$C_{60}$ polycyclic group unsubstituted or substituted with at least one $R_{10a}$, na1 may be an integer from 1 to 4.

In some embodiments, Formulae 201 and 202 may each include at least one of groups represented by Formulae CY201 to CY217:

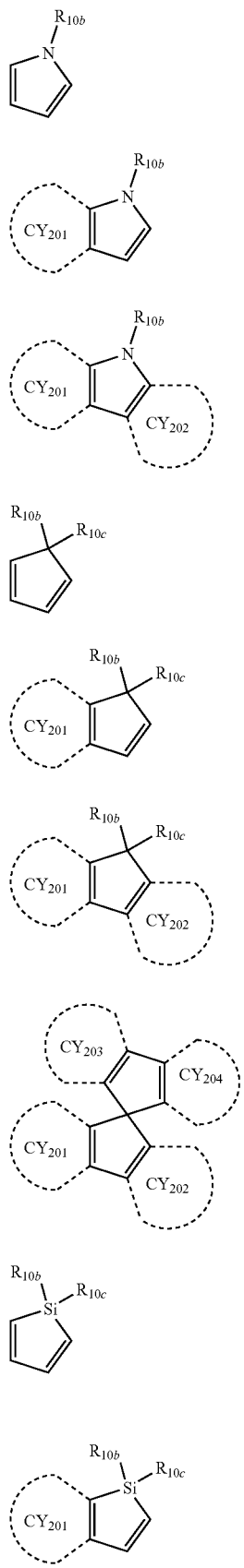

wherein, in Formulae CY201 to CY217, $R_{10b}$ and $R_{10c}$ may each be understood by referring to the descriptions of $R_{10a}$, ring $CY_{201}$ to ring $CY_{204}$ may each independently be a $C_3$-$C_{20}$ carbocyclic group or a $C_1$-$C_{20}$ heterocyclic group, and at least one hydrogen in Formulae CY201 to CY217 may be unsubstituted or substituted with $R_{10a}$. In some embodiments, in Formulae CY201 to CY217, ring $CY_{201}$ to ring $CY_{204}$ may each independently be a benzene group, a naphthalene group, a phenanthrene group, or an anthracene group. In one or more embodiments, Formulae 201 and 202 may each include at least one of groups represented by Formulae CY201 to CY203.

In one or more embodiments, Formula 201 may include at least one of groups represented by Formulae CY201 to CY203 and at least one of groups represented by Formulae CY204 to CY217. In one or more embodiments, in Formula 201, xa1 may be 1, $R_{201}$ may be a group represented by any one of Formulae CY201 to CY203, xa2 may be 0, and $R_{202}$ may be a group represented by Formulae CY204 to CY207. In one or more embodiments, Formulae 201 and 202 may each not include groups represented by Formulae CY201 to CY203. In one or more embodiments, Formulae 201 and 202 may each not include groups represented by Formulae CY201 to CY203, and include at least one of groups represented by Formulae CY204 to CY217. In one or more embodiments, Formulae 201 and 202 may each not include groups represented by Formulae CY201 to CY217.

In some embodiments, the hole transport region may include one of Compounds HT1 to HT69 and 4,4',4"-tris[phenyl(m-tolyl)amino]triphenylamine (m-MTDATA), 1-N,1-N-bis[4-(diphenylamino)phenyl]-4-N,4-N-diphenylbenzene-1,4-diamine (TDATA), 4,4',4"-tris[2-naphthyl(phenyl)amino]triphenylamine (2-TNATA), bis(naphthalen-1-yl)-N,N'-bis(phenyl)benzidine (NPB or NPD), N4,N4'-di(naphthalen-2-yl)-N4,N4'-diphenyl-[1,1'-biphenyl]-4,4'-diamine (β-NPB), N,N'-bis(3-methylphenyl)-N,N'-diphenylbenzidine (TPD), N,N'-bis(3-methylphenyl)-N,N'-diphenyl-9,9-spirobifluorene-2,7-diamine (spiro-TPD), N2,N7-di-1-naphthalenyl-N2,N7-diphenyl-9,9'-spirobi[9H-fluorene]-2,7-diamine (spiro-NPB), N,N'-di(1-naphthyl)-N,N'-diphenyl-2,2'-dimethyl-(1,1'-biphenyl)-4,4'-diamine (methylated-NPB), 4,4'-cyclohexylidenebis[N,N-bis(4-methylphenyl)benzenamine] (TAPC), N,N,N',N'-tetrakis(3-methylphenyl)-3,3'-dimethylbenzidine (HMTPD), 4,4',4"-tris(N-carbazolyl)triphenylamine (TCTA), polyaniline/dodecylbenzenesulfonic acid (PANI/DBSA), poly(3,4-ethylenedioxythiophene)/poly(4-styrenesulfonate) (PEDOT/PSS), polyaniline/camphorsulfonic acid (PANI/CSA), polyaniline/poly(4-styrenesulfonate (PAN/PSS), or any combination thereof:

HT1

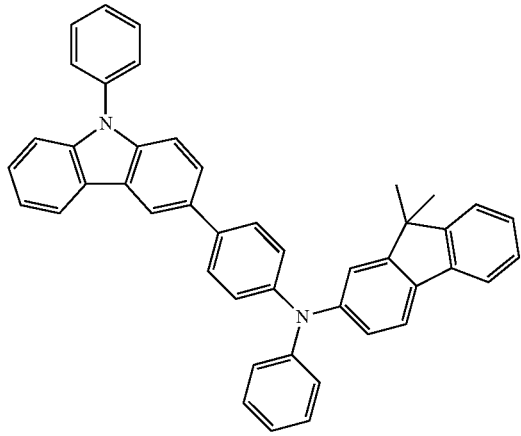

HT2

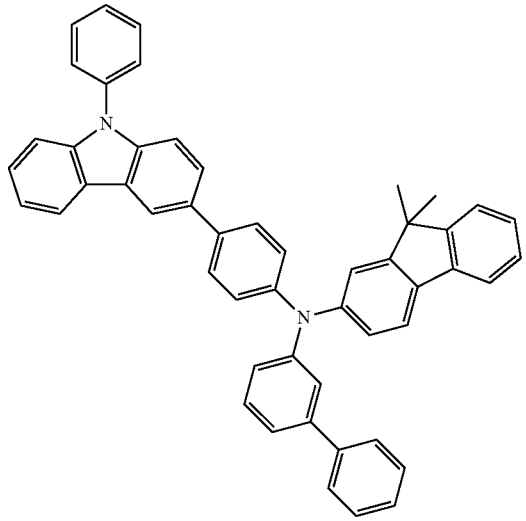

HT3

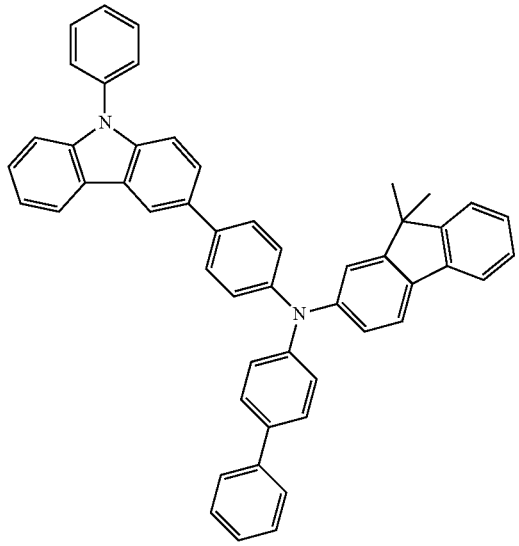

HT4

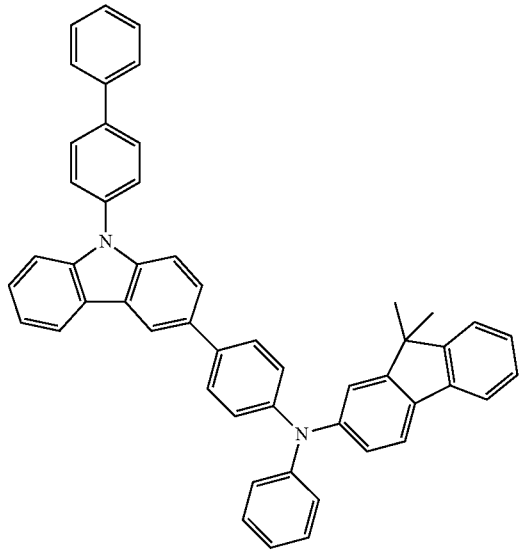

-continued
HT5
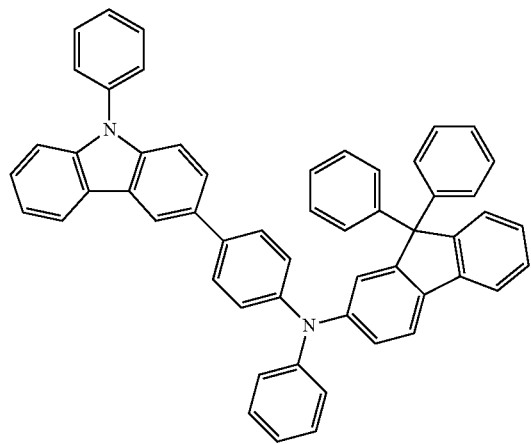
HT6
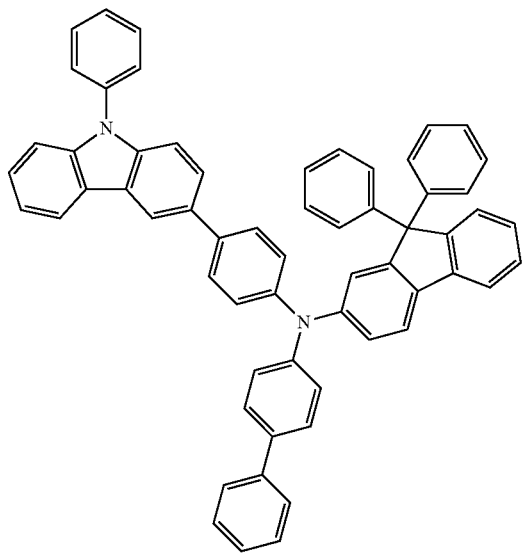
HT7
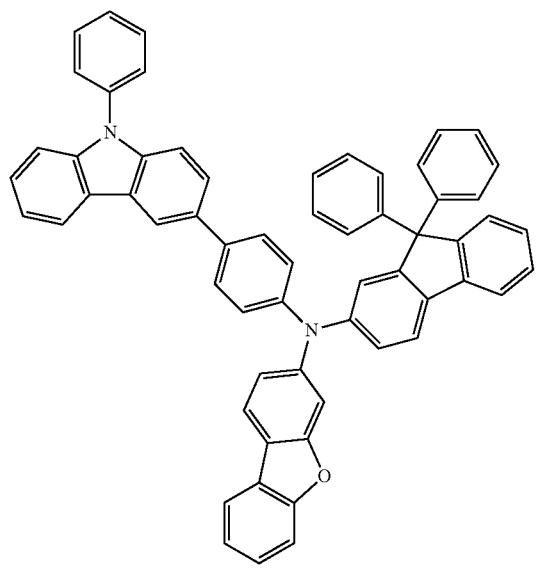
HT8
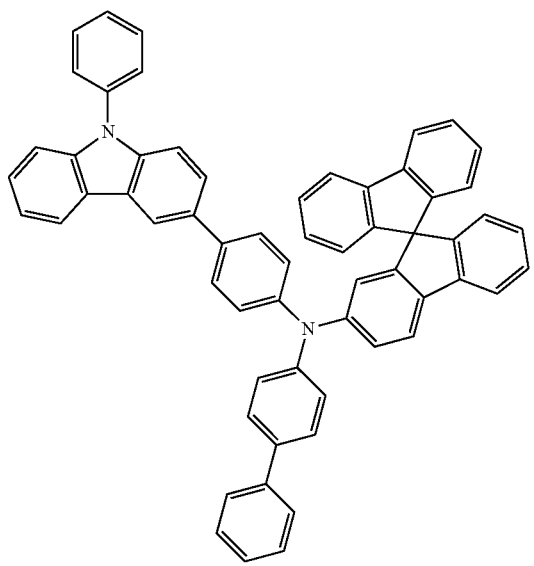

-continued
HT9
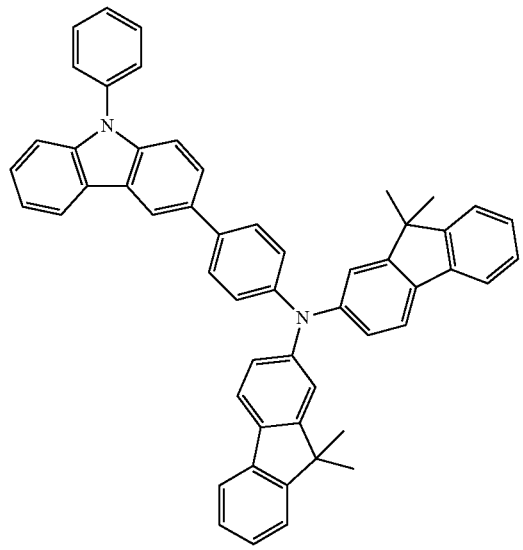
HT10
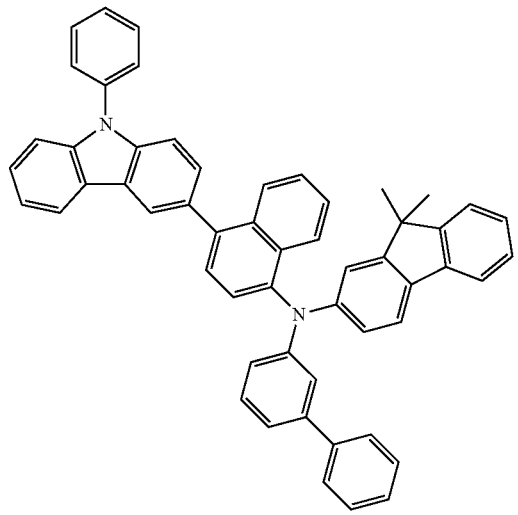
HT11
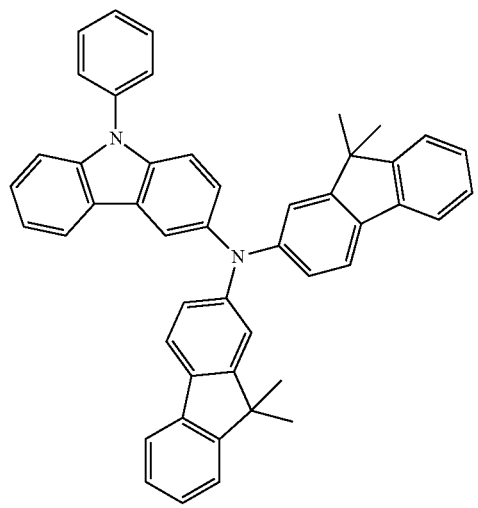
HT12
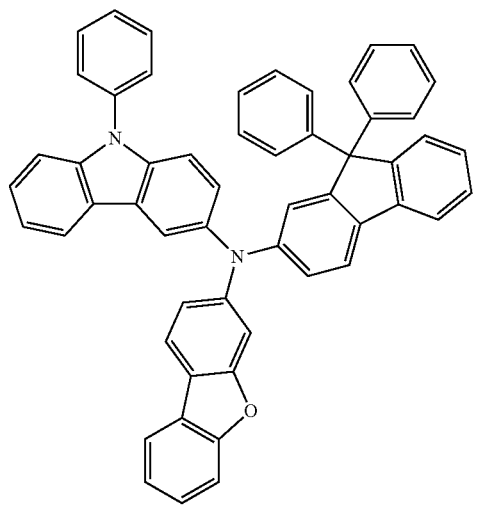
HT13
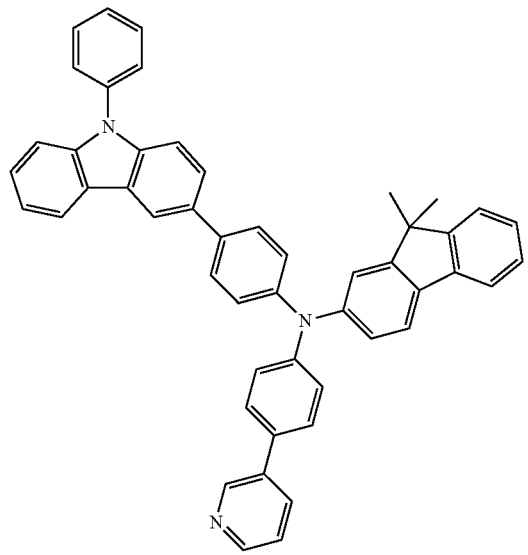
HT14
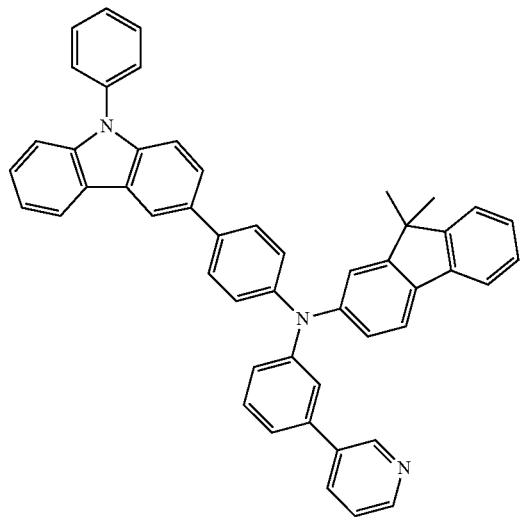

-continued
HT15
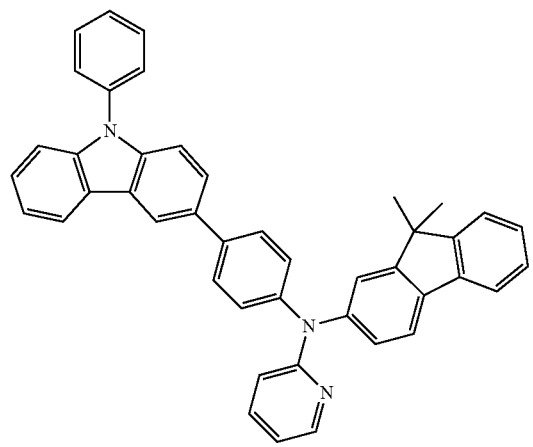
HT16
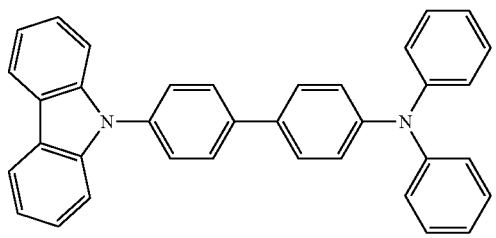
HT17
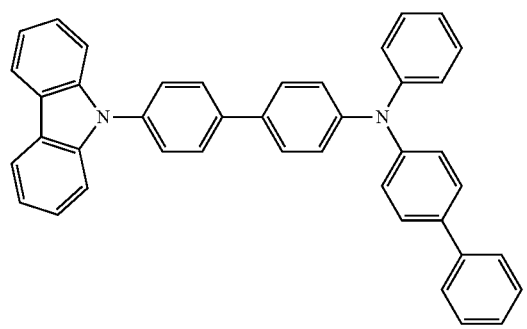
HT18
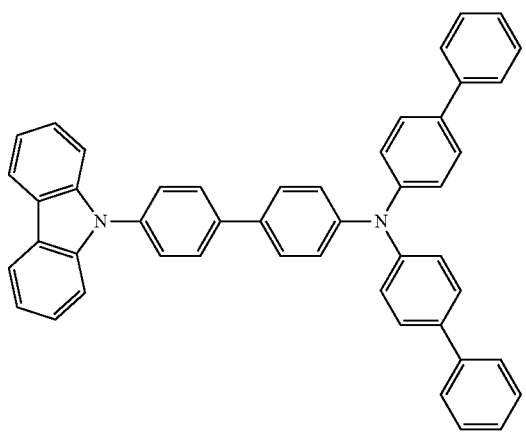
HT19
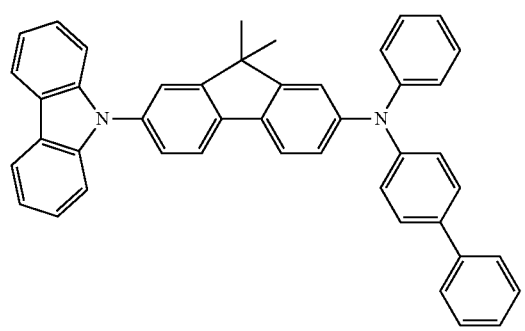
HT20
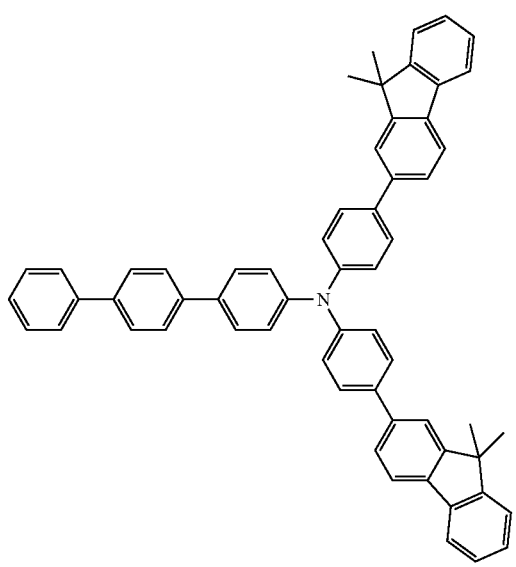

-continued
HT21
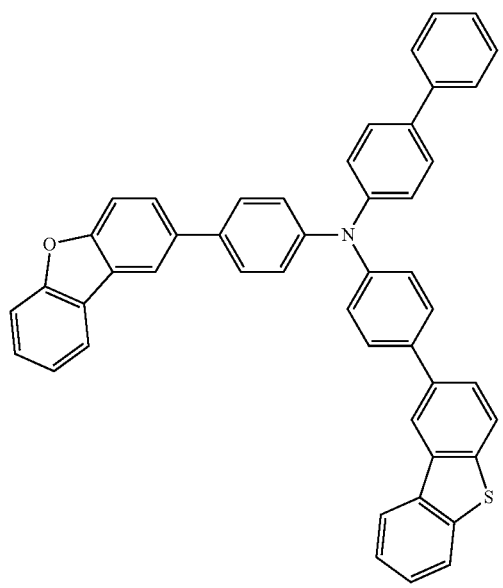
HT22
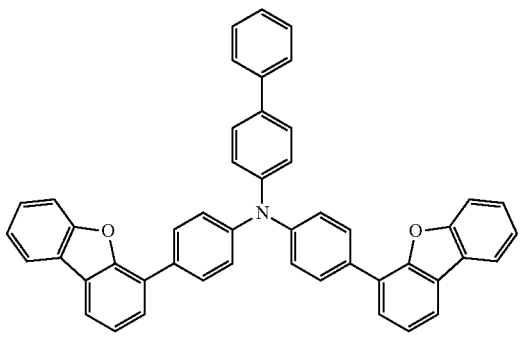
HT23
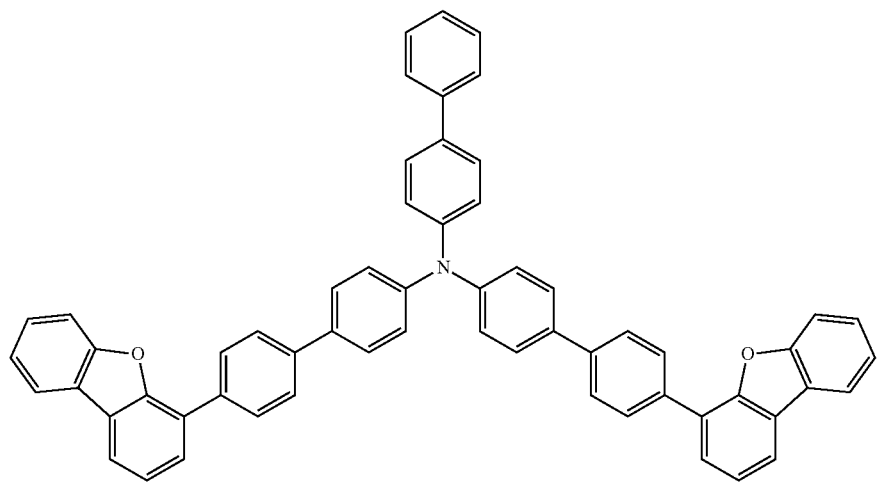
HT24
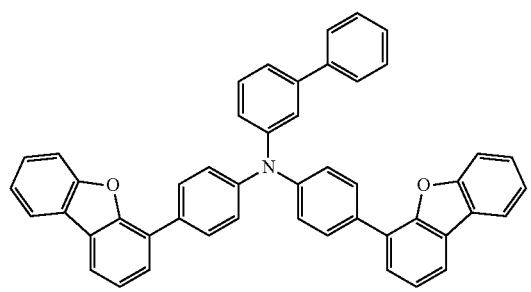
HT25
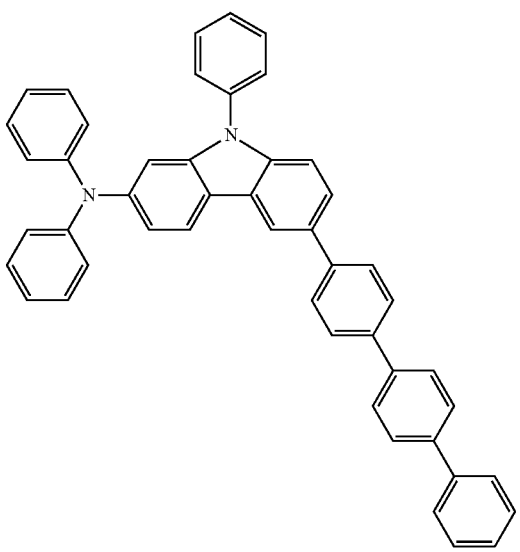

-continued
HT26
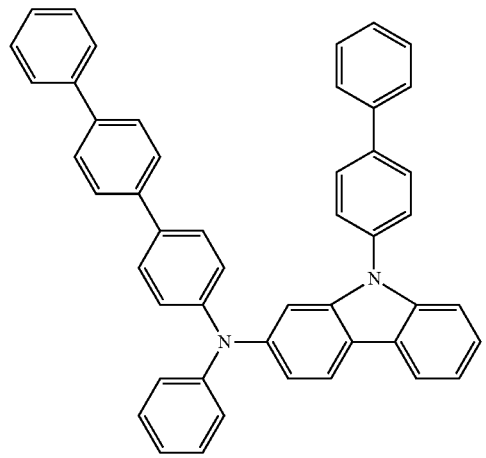
HT27
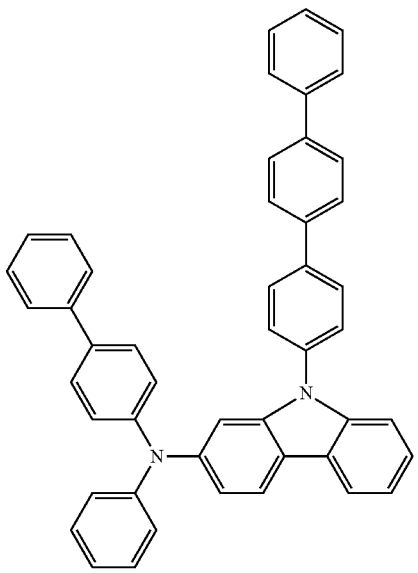
HT28
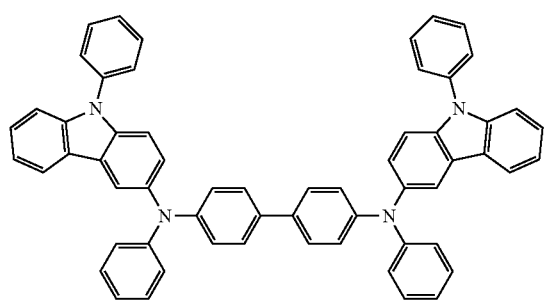
HT29
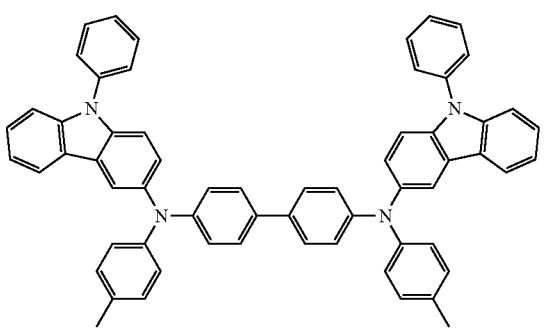
HT30
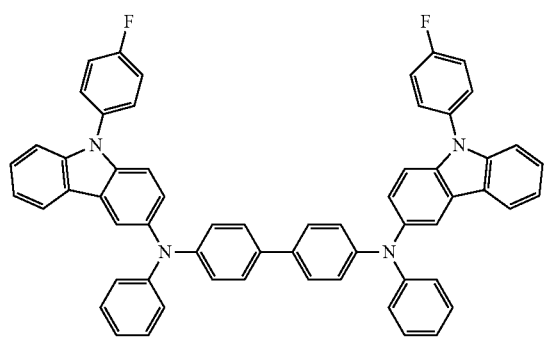
HT31
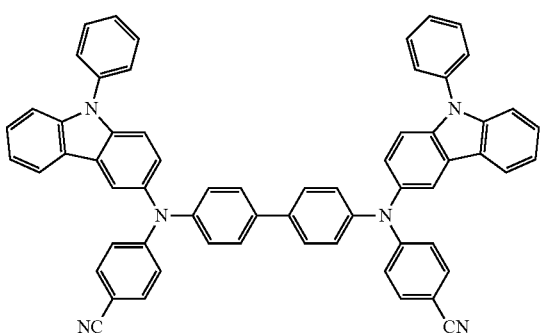

-continued
HT32
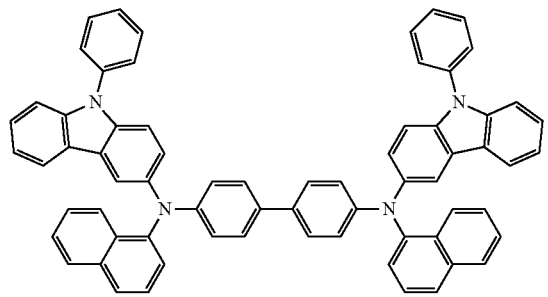
HT33
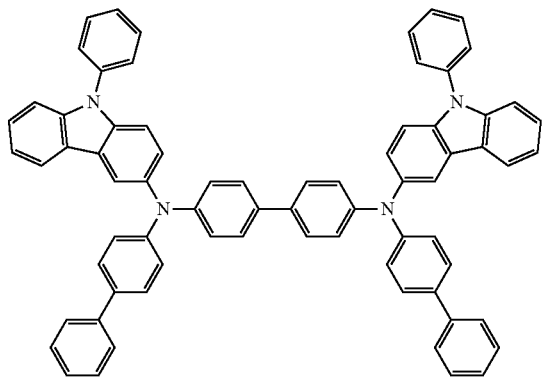
HT34
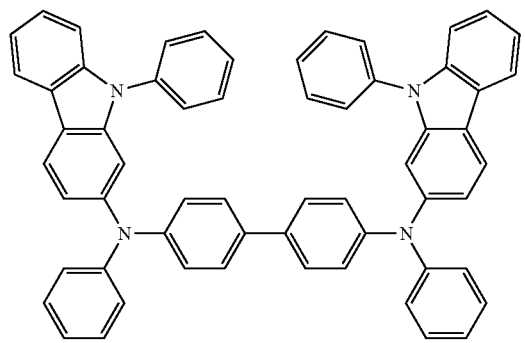
HT35
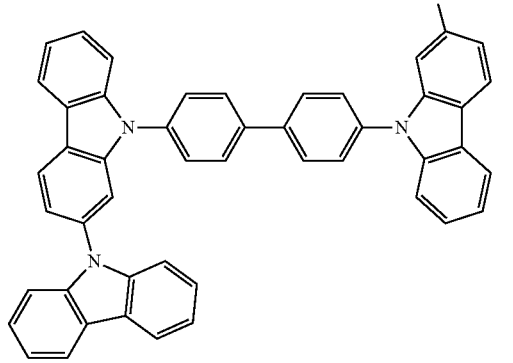
HT36
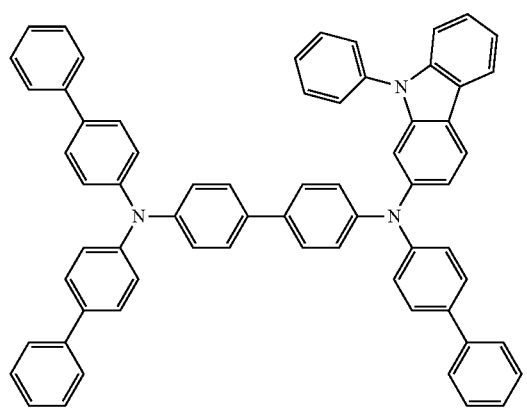
HT37
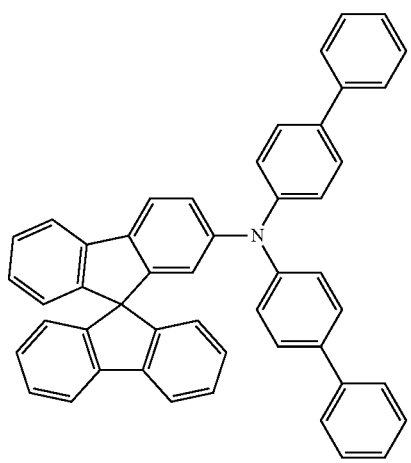

-continued
HT38
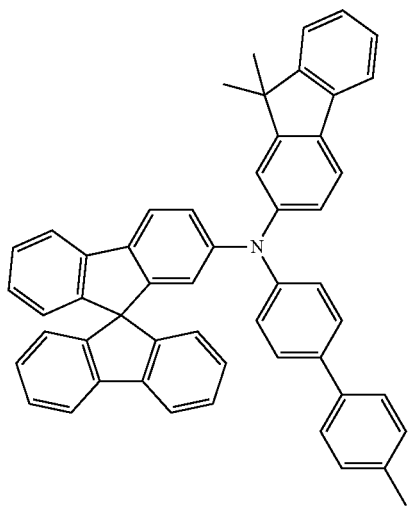
HT39
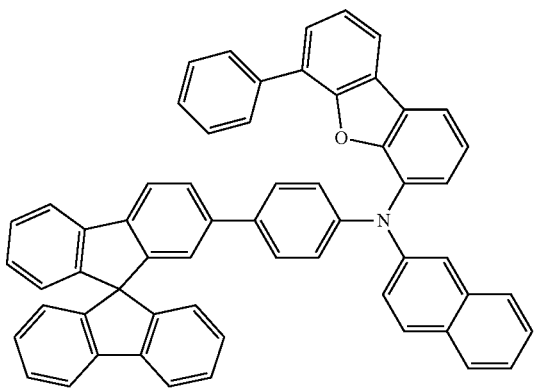
HT40
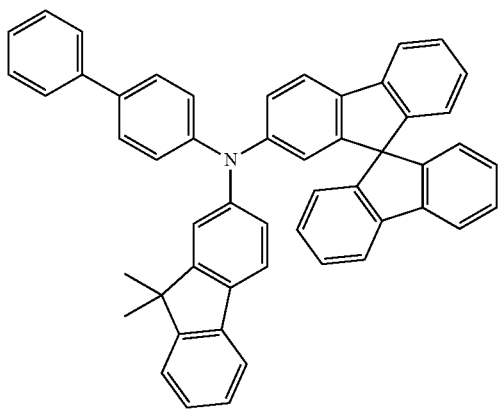
HT41
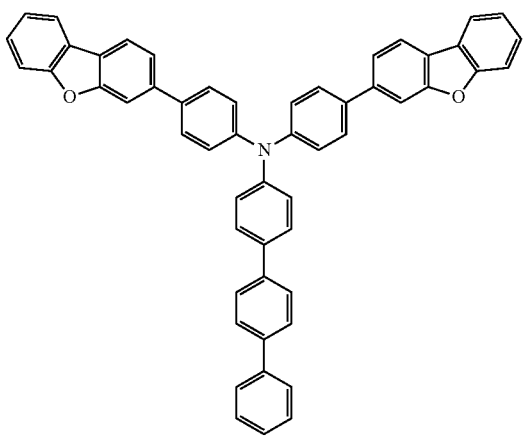
HT42
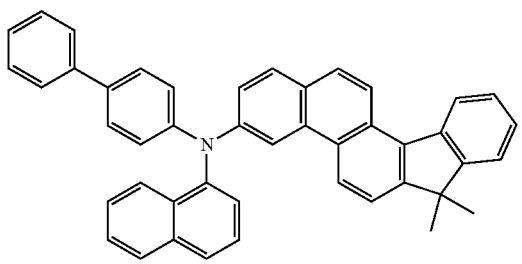
HT43
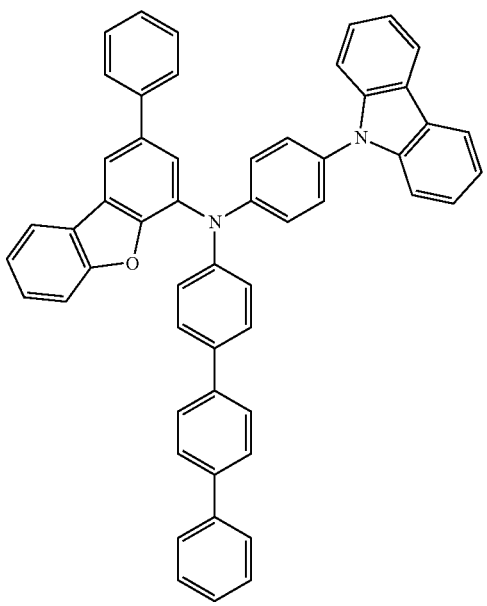

-continued
HT44
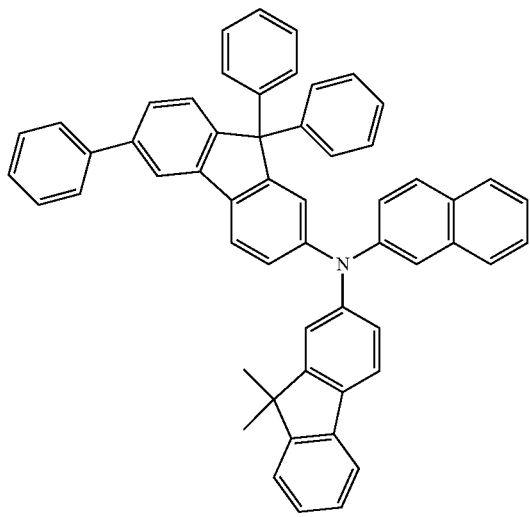
HT45
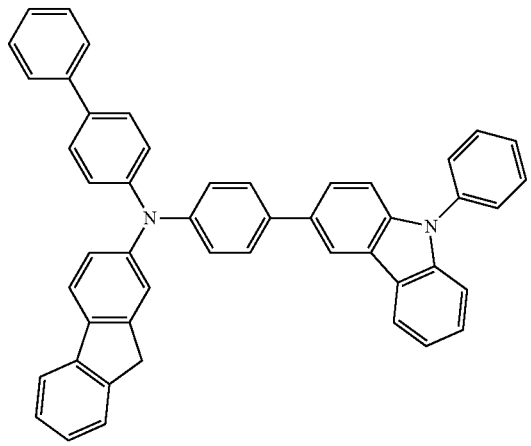
HT46
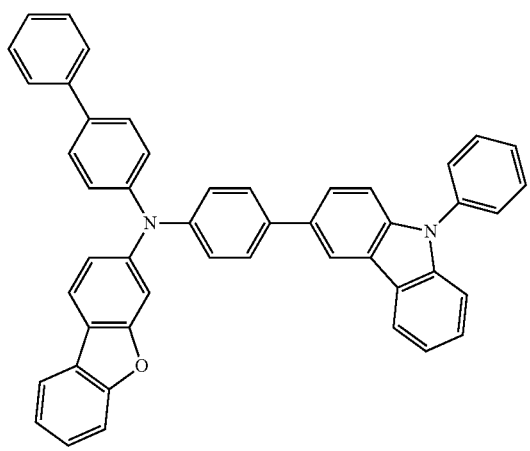
HT47
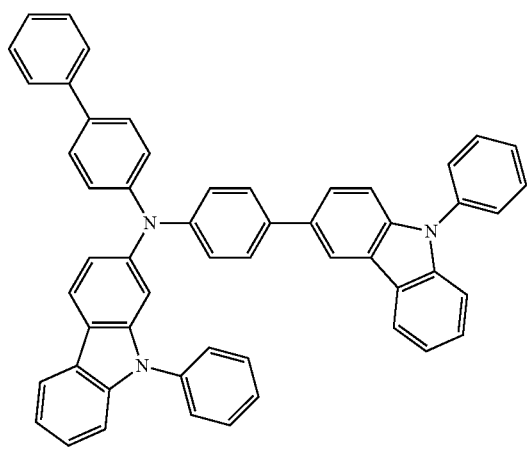
HT48
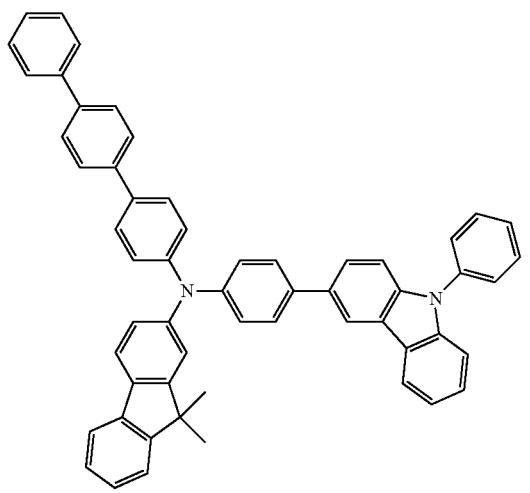
HT49
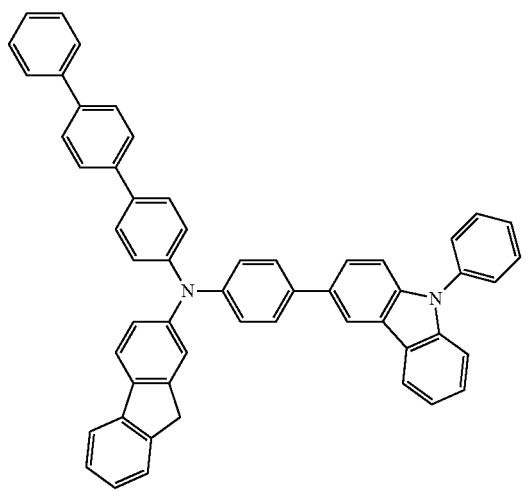

-continued
HT50
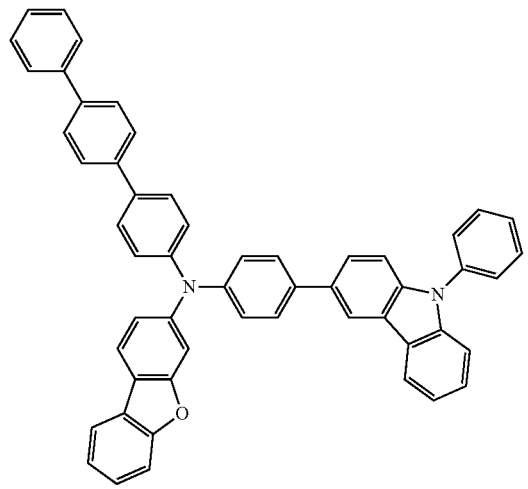
HT51
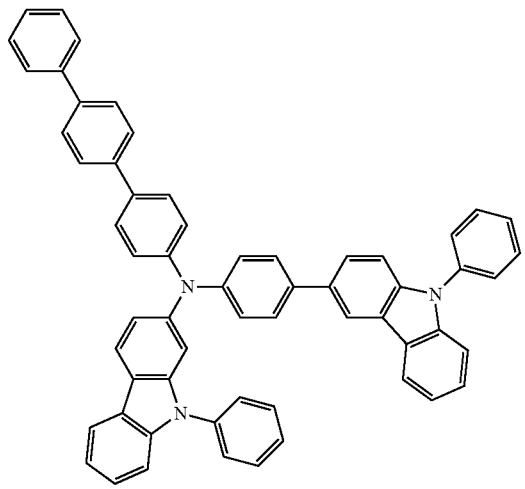
HT52
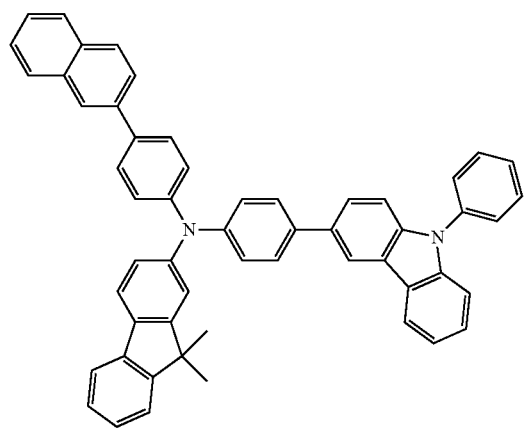
HT53
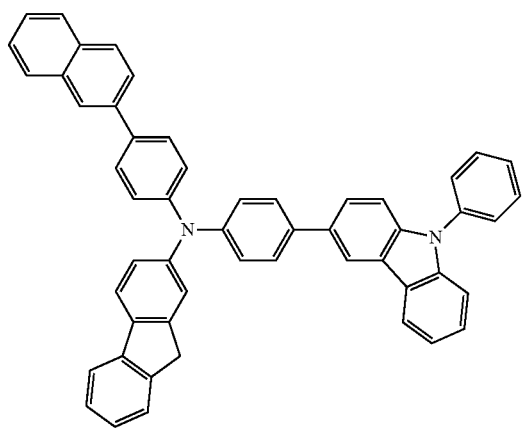
HT54
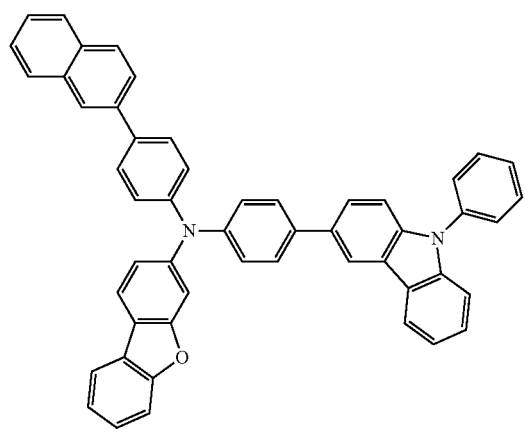
HT55
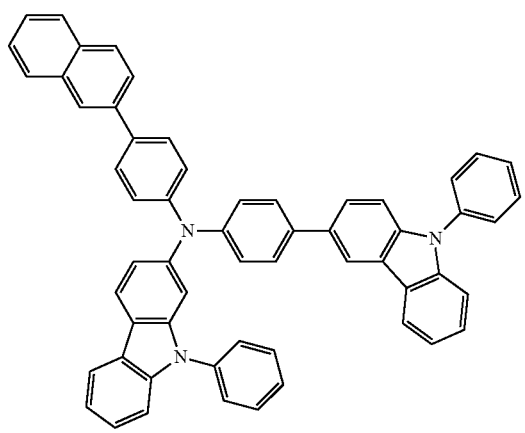

-continued
HT56
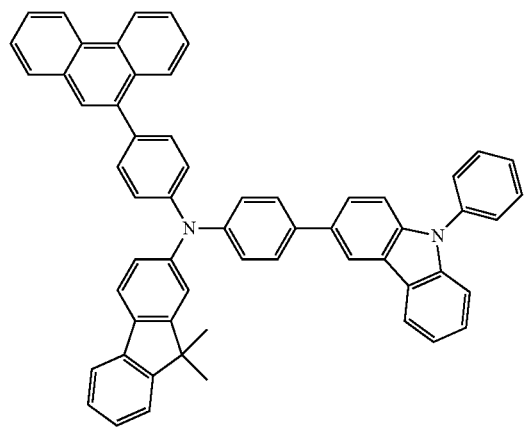
HT57
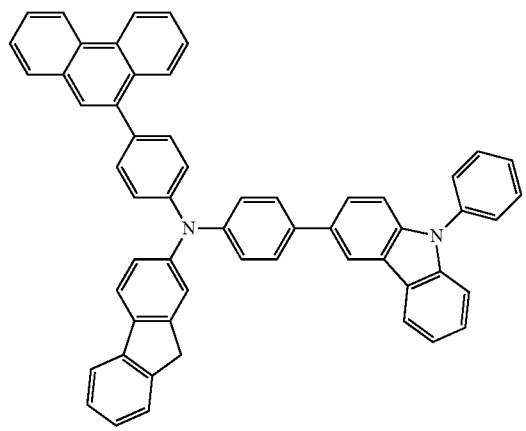
HT58
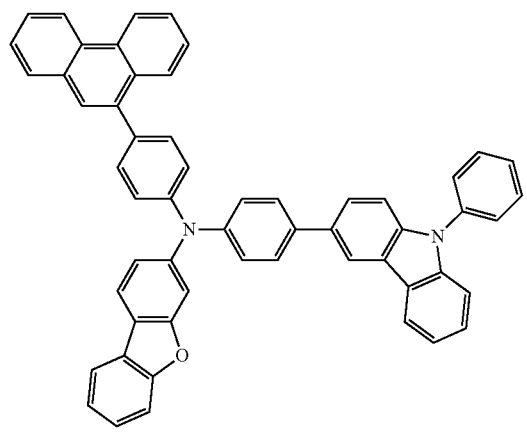
HT59
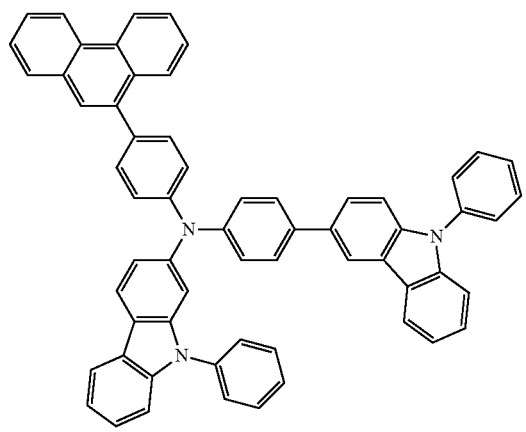
HT60
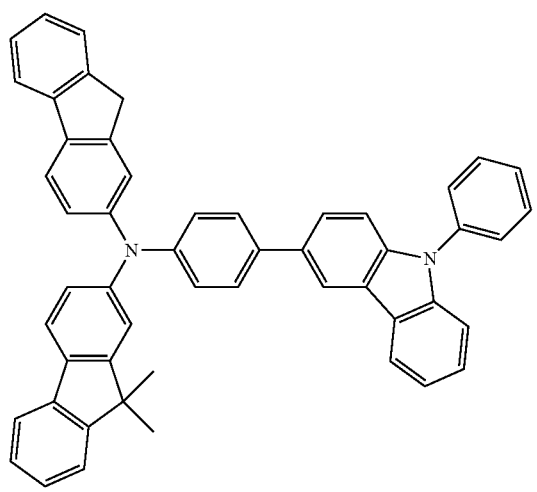
HT61
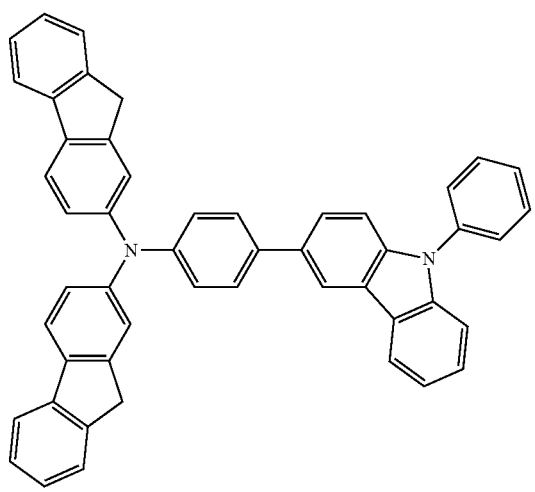

-continued
HT62
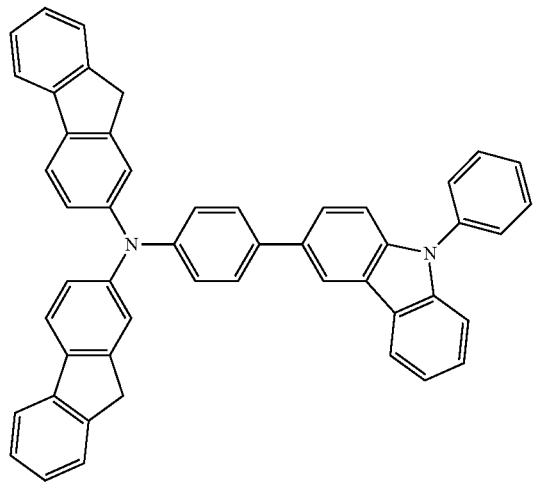
HT63
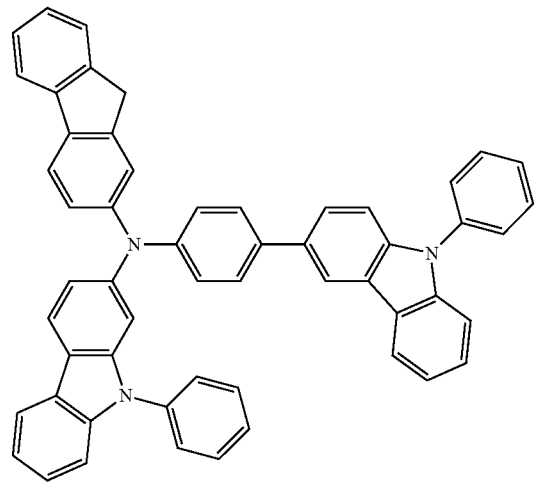
HT64
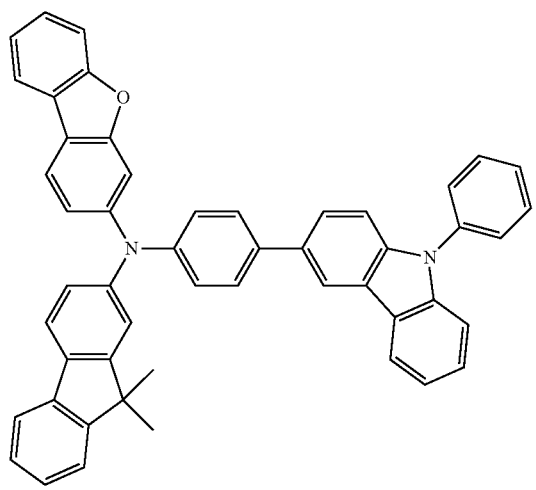
HT65
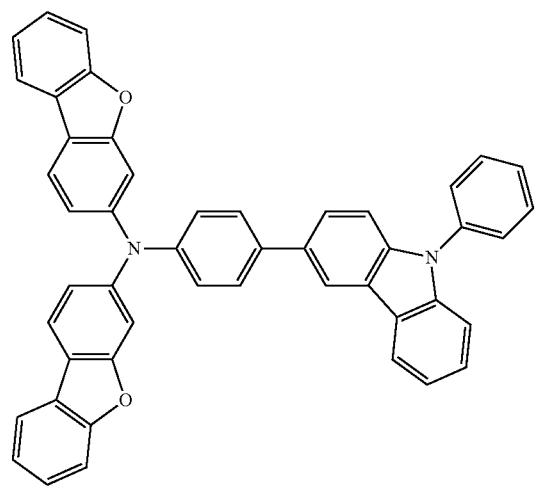
HT66
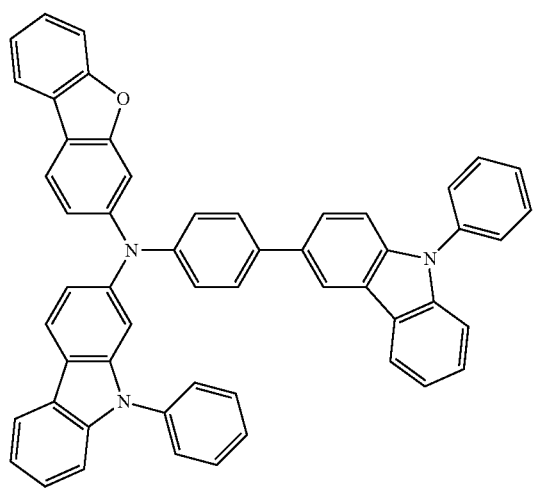
HT67
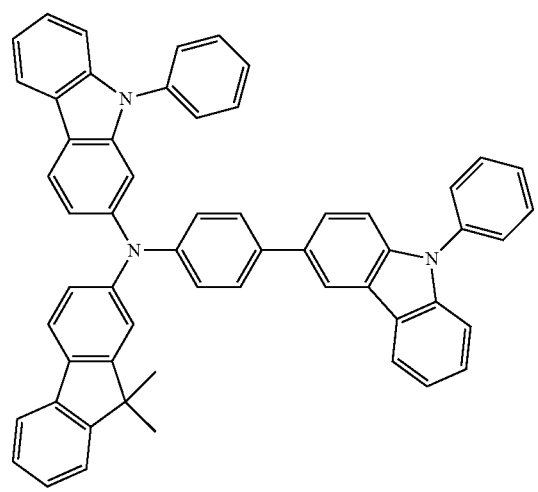

-continued
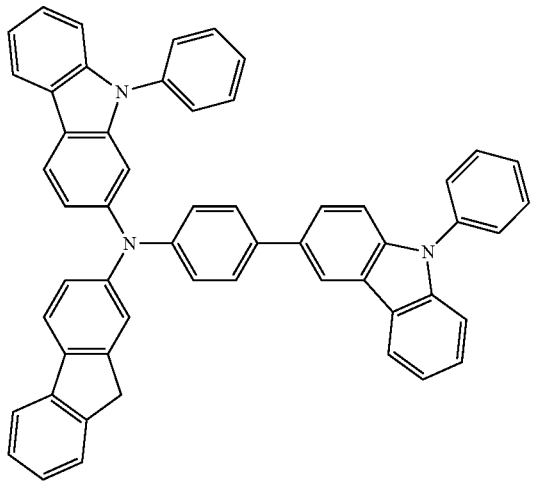
HT68
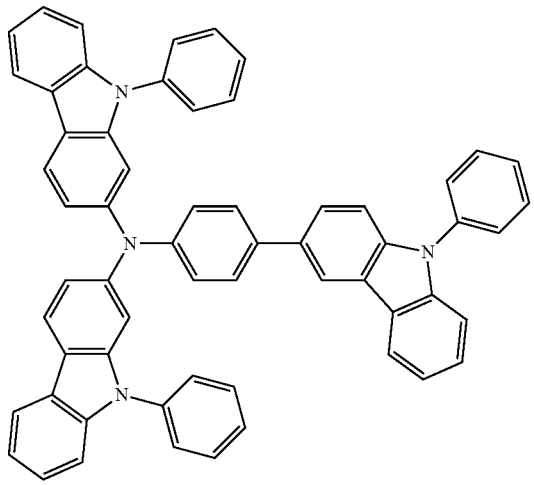
HT69
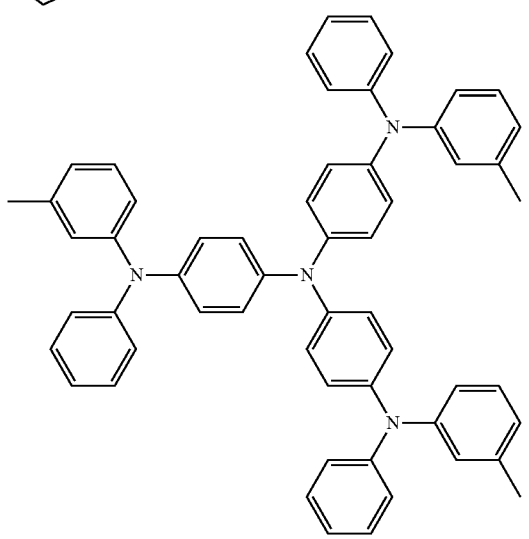
m-MTDATA
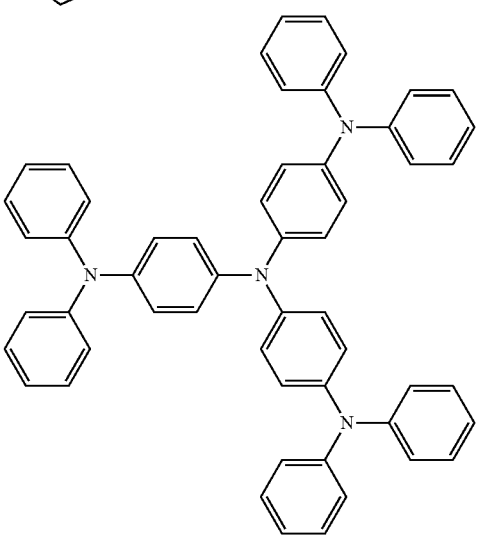
TDATA
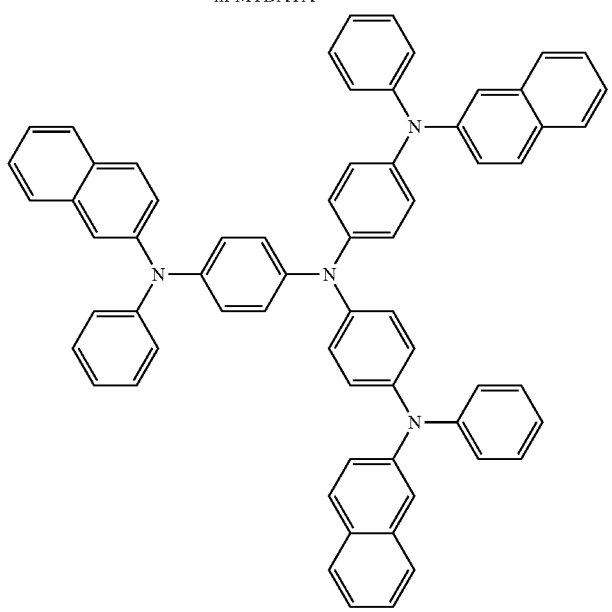
2-TNATA -continued
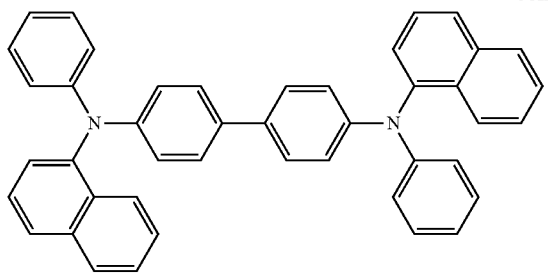
NPB
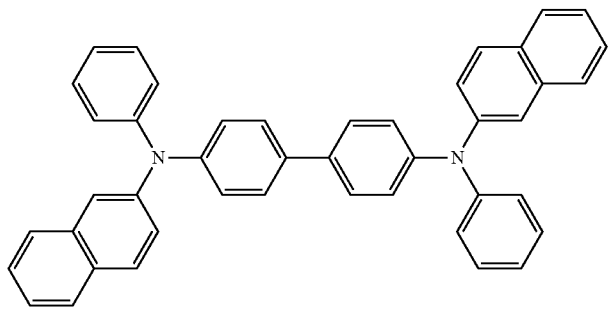
β-NPB
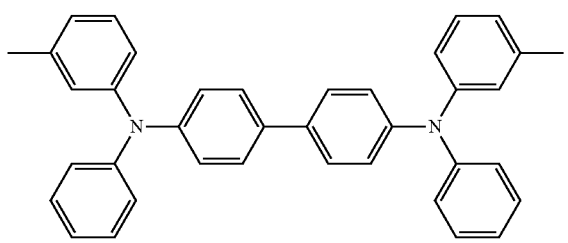
TPD
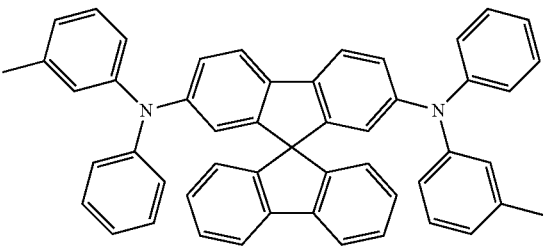
Spiro-TPD
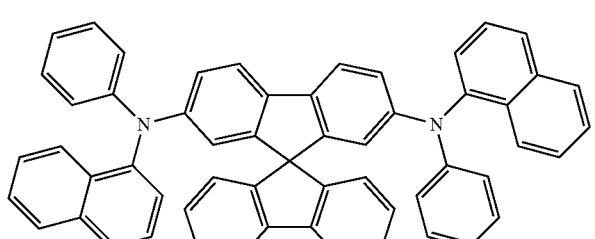
Spiro-NPB
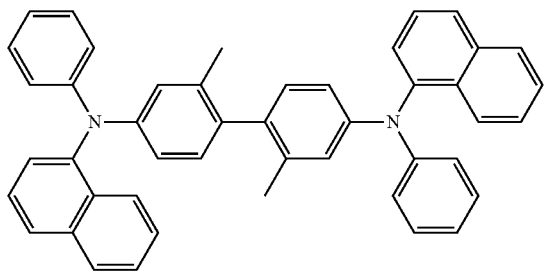
methylated-NPB
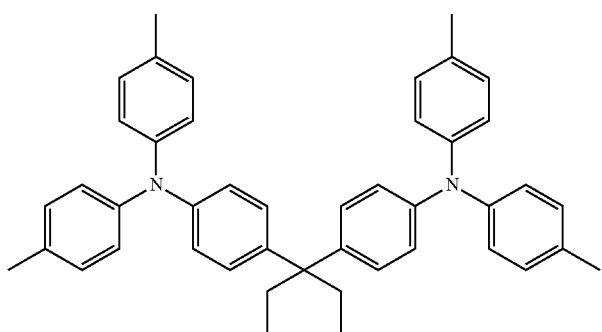
TAPC

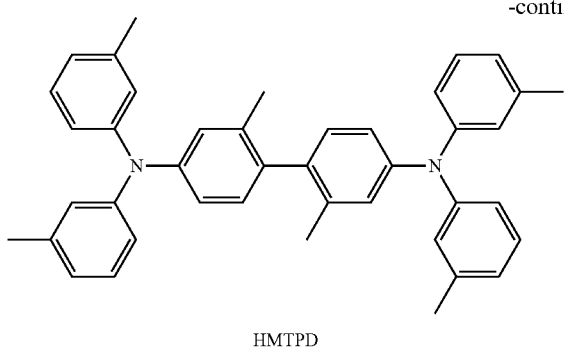

HMTPD

The thickness of the hole transport region may be in a range of about 50 Angstroms (Å) to about 10,000 Å, for example, about 100 Å to about 4,000 Å. When the hole transport region includes the hole injection layer 131 and the hole transport layer 132, the thickness of the hole injection layer 131 may be in a range of about 50 Å to about 9,000 Å, for example, about 100 Å to about 1,000 Å, and the thickness of the hole transport layer 132 may be in a range of about 50 Å to about 2,000 Å, for example, about 100 Å to about 1,500 Å. When the thicknesses of the hole transport region, the hole injection layer 131, and the hole transport layer 132 are within any of these ranges, excellent hole transport characteristics may be obtained without a substantial increase in driving voltage.

The emission auxiliary layer may increase luminescence efficiency by compensating for an optical resonance distance according to the wavelength of light emitted by the emission layer 133. The electron blocking layer may reduce or eliminate the flow of electrons from an electron transport region. The emission auxiliary layer and the electron blocking layer may include the aforementioned materials.

p-Dopant

The hole transport region may include a charge generating material as well as the aforementioned materials to improve conductive properties of the hole transport region. The charge generating material may be substantially homogeneously or non-homogeneously dispersed (for example, as a single layer consisting of a charge generating material) in the hole transport region. The charge generating material may include, for example, a p-dopant. In some embodiments, a lowest unoccupied molecular orbital (LUMO) energy level of the p-dopant may be about −3.5 eV or less. In some embodiments, the p-dopant may include a quinone derivative, a cyano group-containing compound, an elements EL1 and EL2-containing compound, or any combination thereof.

Examples of the quinone derivative may include tetracyanoquinodimethane (TCNQ), 2,3,5,6-tetrafluoro-7,7,8,8-tetracyanoquinodimethane (F4-TCNQ), and the like.

Examples of the cyano group-containing compound include 1,4,5,8,9,11-hexaazatriphenylene-hexacarbonitrile (HAT-CN), a compound represented by Formula 221, and the like:

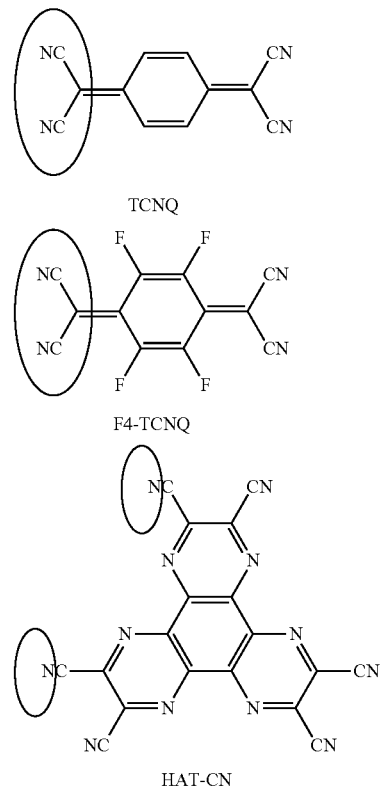

TCNQ

F4-TCNQ

HAT-CN

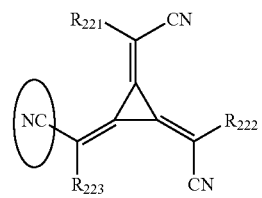

Formula 221 wherein, in Formula 221, $R_{221}$ to $R_{223}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, and at least one of $R_{221}$ to $R_{223}$ may each independently be: a $C_3$-$C_{60}$ carbocyclic group or a $C_1$-$C_{60}$ heterocyclic group, substituted with a cyano group; —F; —Cl; —Br; —I; a $C_1$-$C_{20}$ alkyl group substituted with a cyano group, —F, —Cl, —Br, —I, or any combination thereof; or any combination thereof.

In the elements EL1 and EL2-containing compound, element EL1 may be metal, a metalloid, or a combination thereof, and element EL2 may be non-metal, a metalloid, or a combination thereof.

Examples of the metal may include: an alkali metal (e.g., lithium (Li), sodium (Na), potassium (K), rubidium (Rb), cesium (Cs), or the like); an alkaline earth metal (e.g., beryllium (Be), magnesium (Mg), calcium (Ca), strontium (Sr), barium (Ba), or the like); a transition metal (e.g., titanium (Ti), zirconium (Zr), hafnium (Hf), vanadium (V), niobium (Nb), tantalum (Ta), chromium (Cr), molybdenum (Mo), tungsten (W), manganese (Mn), technetium (Tc), rhenium (Re), iron (Fe), ruthenium (Ru), osmium (Os), cobalt (Co), rhodium (Rh), iridium (Ir), nickel (Ni), palladium (Pd), platinum (Pt), copper (Cu), silver (Ag), gold (Au), or the like); a post-transition metal (e.g., zinc (Zn), indium (In), tin (Sn), or the like); a lanthanide metal (e.g., lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), lutetium (Lu), or the like); and the like.

Examples of the metalloid may include silicon (Si), antimony (Sb), tellurium (Te), and the like. Examples of the non-metal may include oxygen (O), a halogen (e.g., F, Cl, Br, I, and the like), and the like.

For example, the elements EL1 and EL2-containing compound may include a metal oxide, a metal halide (e.g., a metal fluoride, a metal chloride, a metal bromide, a metal iodide, and the like), a metalloid halide (e.g., a metalloid fluoride, a metalloid chloride, a metalloid bromide, a metalloid iodide, and the like), a metal telluride, or any combination thereof. Examples of the metal oxide may include a tungsten oxide (e.g., WO, $W_2O_3$, $WO_2$, $WO_3$, $W_2O_5$, and the like), a vanadium oxide (e.g., VO, $V_2O_3$, $VO_2$, $V_2O_5$, and the like), a molybdenum oxide (MoO, $Mo_2O_3$, $MoO_2$, $MoO_3$, $Mo_2O_5$, and the like), a rhenium oxide (e.g., $ReO_3$ and the like), and the like.

Examples of the metal halide may include an alkali metal halide, an alkaline earth metal halide, a transition metal halide, a post-transition metal halide, a lanthanide metal halide, and the like. Examples of the alkali metal halide may include LiF, NaF, KF, RbF, CsF, LiCl, NaCl, KCl, RbCl, CsCl, LiBr, NaBr, KBr, RbBr, CsBr, LiI, NaI, KI, RbI, CsI, and the like.

Examples of the alkaline earth metal halide may include $BeF_2$, $MgF_2$, $CaF_2$, $SrF_2$, $BaF_2$, $BeCl_2$, $MgCl_2$, $CaCl_2$, $SrCl_2$, $BaCl_2$, $BeBr_2$, $MgBr_2$, $CaBr_2$, $SrBr_2$, $BaBr_2$, $BeI_2$, $MgI_2$, $CaI_2$, $SrI_2$, $BaI_2$, and the like. Examples of the transition metal halide may include a titanium halide (e.g., $TiF_4$, $TiCl_4$, $TiBr_4$, $TiI_4$, and the like), a zirconium halide (e.g., $ZrF_4$, $ZrCl_4$, $ZrBr_4$, $ZrI_4$, and the like), a hafnium halide (e.g., $HfF_4$, $HfCl_4$, $HfBr_4$, $HfI_4$, and the like), a vanadium halide (e.g., $VF_3$, $VCl_3$, $VBr_3$, $VI_3$, and the like), a niobium halide (e.g., $NbF_3$, $NbCl_3$, $NbBr_3$, $NbI_3$, and the like), a tantalum halide (e.g., $TaF_3$, $TaCl_3$, $TaBr_3$, $TaI_3$, and the like), a chromium halide (e.g., $CrF_3$, $CrCl_3$, $CrBr_3$, $CrI_3$, and the like), a molybdenum halide (e.g., $MoF_3$, $MoCl_3$, $MoBr_3$, $MoI_3$, and the like), a tungsten halide (e.g., $WF_3$, $WCl_3$, $WBr_3$, $WI_3$, and the like), a manganese halide (e.g., $MnF_2$, $MnCl_2$, $MnBr_2$, $MnI_2$, and the like), a technetium halide (e.g., $TcF_2$, $TcCl_2$, $TcBr_2$, $TcI_2$, and the like), a rhenium halide (e.g., $ReF_2$, $ReCl_2$, $ReBr_2$, $ReI_2$, and the like), an iron halide (e.g., $FeF_2$, $FeCl_2$, $FeBr_2$, $FeI_2$, and the like), a ruthenium halide (e.g., $RuF_2$, $RuCl_2$, $RuBr_2$, $RuI_2$, and the like), an osmium halide (e.g., $OsF_2$, $OsCl_2$, $OsBr_2$, $OsI_2$, and the like), a cobalt halide (e.g., $CoF_2$, $CoCl_2$, $CoBr_2$, $CoI_2$, and the like), a rhodium halide (e.g., $RhF_2$, $RhCl_2$, $RhBr_2$, $RhI_2$, and the like), an iridium halide (e.g., $IrF_2$, $IrCl_2$, $IrBr_2$, $IrI_2$, and the like), a nickel halide (e.g., $NiF_2$, $NiCl_2$, $NiBr_2$, $NiI_2$, and the like), a palladium halide (e.g., $PdF_2$, $PdCl_2$, $PdBr_2$, $PdI_2$, and the like), a platinum halide (e.g., $PtF_2$, $PtCl_2$, $PtBr_2$, $PtI_2$, and the like), a copper halide (e.g., CuF, CuCl, CuBr, CuI, and the like), a silver halide (e.g., AgF, AgCl, AgBr, AgI, and the like), a gold halide (e.g., AuF, AuCl, AuBr, AuI, and the like), and the like.

Examples of the post-transition metal halide may include a zinc halide (e.g., $ZnF_2$, $ZnCl_2$, $ZnBr_2$, $ZnI_2$, and the like), an indium halide (e.g., $InI_3$ and the like), a tin halide (e.g., $SnI_2$ and the like), and the like. Examples of the lanthanide metal halide may include YbF, $YbF_2$, $YbF_3$, $SmF_3$, YbCl, $YbCl_2$, $YbCl_3$, $SmCl_3$, YbBr, $YbBr_2$, $YbBr_3$, $SmBr_3$, YbI, $YbI_2$, $YbI_3$, $SmI_3$, and the like.

Examples of the metalloid halide may include an antimony halide (e.g., $SbCl_5$ and the like) and the like. Examples of the metal telluride may include an alkali metal telluride (e.g., $Li_2Te$, $Na_2Te$, $K_2Te$, $Rb_2Te$, $Cs_2Te$, and the like), an alkaline earth metal telluride (e.g., BeTe, MgTe, CaTe, SrTe, BaTe, and the like), a transition metal telluride (e.g., $TiTe_2$, $ZrTe_2$, $HfTe_2$, $V_2Te_3$, $Nb_2Te_3$, $Ta_2Te_3$, $Cr_2Te_3$, $Mo_2Te_3$, $W_2Te_3$, MnTe, TcTe, ReTe, FeTe, RuTe, OsTe, CoTe, RhTe, IrTe, NiTe, PdTe, PtTe, $Cu_2Te$, CuTe, $Ag_2Te$, AgTe, $Au_2Te$, and the like), a post-transition metal telluride (e.g., ZnTe and the like), a lanthanide metal telluride (e.g., LaTe, CeTe, PrTe, NdTe, PmTe, EuTe, GdTe, TbTe, DyTe, HoTe, ErTe, TmTe, YbTe, LuTe, and the like), and the like.

Emission Layer 133 in Interlayer 130

When the light-emitting device 10 is a full color light-emitting device, the emission layer 133 may be patterned into a red emission layer, a green emission layer, and/or a blue emission layer, according to a sub-pixel. In one or more embodiments, the emission layer 133 may have a stacked structure. The stacked structure may include two or more layers selected from the red emission layer, the green emission layer, and the blue emission layer. The two or more layers may be in direct contact with each other. In some embodiments, the two or more layers may be separated from each other. In one or more embodiments, the emission layer may include two or more materials. The two or more materials may include a red light-emitting material, a green light-emitting material, or a blue light-emitting material. The two or more materials may be mixed with each other in a single layer. The two or more materials mixed with each other in the single layer may emit white light.

The emission layer 133 may include a host and a dopant. The dopant may be a phosphorescent dopant, a fluorescent dopant, or any combination thereof. The amount of the dopant in the emission layer 133 may be in a range of about 0.01 parts to about 15 parts by weight based on 100 parts by weight of the host. In some embodiments, the emission layer 133 may include quantum dots. The emission layer 133 may include a delayed fluorescence material. The delayed fluorescence material may serve as a host or a dopant in the emission layer 133.

The thickness of the emission layer 133 may be in a range of about 100 Å to about 1,000 Å, in some embodiments, about 200 Å to about 600 Å, and in some embodiments, about 150 Å to about 300 Å. When the thickness of the emission layer 133 is within any of these ranges, improved luminescence characteristics may be obtained without a substantial increase in driving voltage. In some embodiments, the emission layer 133 may emit blue light having a maximum emission wavelength in a range of about 440 nm to about 470 nm.

Host in Emission Layer 133

In some embodiments, the host in the emission layer 133 may include an anthracene compound including a π electron-rich $C_3$-$C_{60}$ cyclic group, —N($Q_1$)($Q_2$), or a combination thereof, and In some embodiments, the host may include an anthracene compound represented by Formula 1:

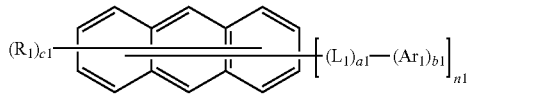

Formula 1 wherein, in Formula 1, $L_1$ may be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, a1 may be an integer from 0 to 5, $Ar_1$ may be a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a π electron-rich $C_3$-$C_{60}$ cyclic group unsubstituted or substituted with at least one $R_{10a}$, or —N($Q_1$)($Q_2$), b1 may be an integer from 1 to 5, n1 may be 1, 2, or 3, $R_1$ may be hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, —Si($Q_1$)($Q_2$)($Q_3$), —N($Q_1$)($Q_2$), —B($Q_1$)($Q_2$), —C(=O)($Q_1$), —S(=O)$_2$($Q_1$), or —P(=O)($Q_1$)($Q_2$), c1 may be an integer from 1 to 9, and $R_{10a}$ may be:

deuterium, —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$), —P(=O)($Q_{11}$)($Q_{12}$), or any combination thereof;

a $C_3$-$C_{60}$ carbocyclic group, a $C_1$-$C_{60}$ heterocyclic group, a $C_6$-$C_{60}$ aryloxy group, or a $C_6$-$C_{60}$ arylthio group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{21}$)($Q_{22}$)($Q_{23}$), —N($Q_{21}$)($Q_{22}$), —B($Q_{21}$)($Q_{22}$), —C(=O)($Q_{21}$), —S(=O)$_2$($Q_{21}$), —P(=O)($Q_{21}$)($Q_{22}$), or any combination thereof; or —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), or —P(=O)($Q_{31}$)($Q_{32}$), wherein $Q_1$ to $Q_3$, $Q_{11}$ to $Q_{13}$, $Q_{21}$ to $Q_{23}$, and $Q_{31}$ to $Q_{33}$ may each independently be hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof.

In an embodiment, in Formula 1, at least one $Ar_1$ in *-[($L_1$)$_{a1}$-($Ar_1$)$_{b1}$](s) in the number of n1 may be a π electron-rich $C_3$-$C_{60}$ cyclic group unsubstituted or substituted with at least one $R_{10a}$ or —N($Q_1$)($Q_2$).

In some embodiments, a host in the emission layer 133 may include an anthracene compound represented by Formula 1-1:

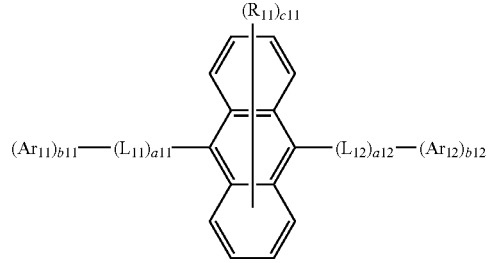

Formula 1-1 wherein, in Formula 1-1, $L_{11}$ and $L_{12}$ may each be understood by referring to the description of $L_1$ in Formula 1, a11 and a12 may each be understood by referring to the description of a1 in Formula 1, $Ar_{11}$ and $Ar_{12}$ may each be understood by referring to the description of $Ar_1$ in Formula 1, b11 and b12 may each be understood by referring to the description of b1 in Formula 1, $R_{11}$ may be understood by referring to the descriptions for $R_1$ in Formula 1, and c11 may be an integer from 1 to 8.

In an embodiment, in Formula 1-1, at least one of $Ar_{11}$ and $Ar_{12}$ may be a π electron-rich $C_3$-$C_{60}$ cyclic group unsubstituted or substituted with at least one $R_{10a}$ or —N($Q_1$)($Q_2$).

In one or more embodiments, in Formula 1-1, at least one of $Ar_{11}$ and $Ar_{12}$ may be a group represented by Formula 3A or Formula 3B or —N($Q_1$)($Q_2$):

Formula 3A

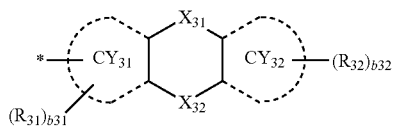

Formula 3B

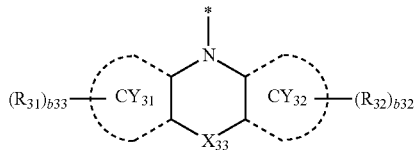

wherein, in Formulae 3A and 3B, $CY_{31}$ and $CY_{32}$ may each independently be a $C_3$-$C_{60}$ carbocyclic group or a $C_1$-$C_{60}$ heterocyclic group, $X_{31}$ may be selected from O, S, and $N(R_{33})$, $X_{32}$ and $X_{33}$ may each independently be a single bond, O, S, $N(R_{34})$, $C(R_{34})(R_{35})$, or $Si(R_{34})(R_{35})$, $R_{31}$ to $R_{35}$ may each independently be hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, —$Si(Q_1)(Q_2)(Q_3)$, —$N(Q_1)(Q_2)$, —$B(Q_1)(Q_2)$, —$C(=O)(Q_1)$, —$S(=O)_2(Q_1)$, or —$P(=O)(Q_1)(Q_2)$, b31 may be an integer from 1 to 3, b32 and b33 may each independently be an integer from 1 to 4, $R_{10a}$ and $Q_1$ to $Q_3$ may respectively be understood by referring to the descriptions of $R_{10a}$ and $Q_1$ to $Q_3$ provided herein, and

* indicates a binding site to an adjacent atom.

In one or more embodiments, in Formula 1-1, at least one of $Ar_{11}$ and $Ar_{12}$ may be a group represented by one of Formulae 3A-1 to 3A-12 and 3B-1:

Formula 3A-1

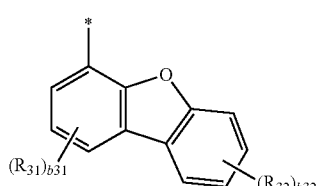

Formula 3A-2

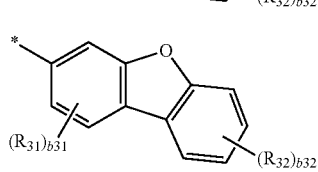

Formula 3A-3

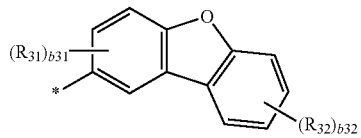

Formula 3A-4

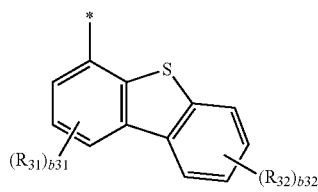

Formula 3A-5

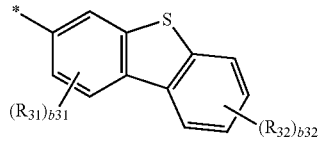

Formula 3A-6

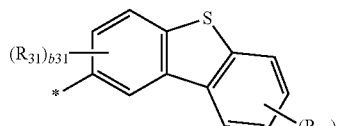

Formula 3A-7

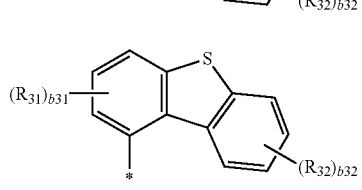

Formula 3A-8

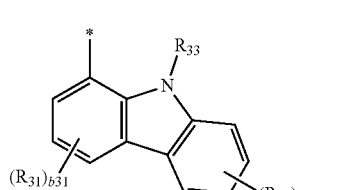

Formula 3A-9

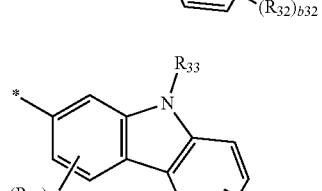

Formula 3A-10

Formula 3A-11

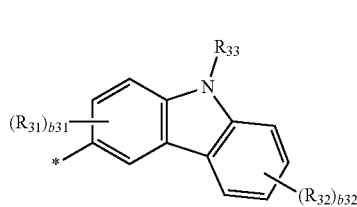

Formula 3A-12

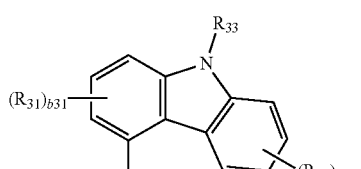

Formula 3B-1

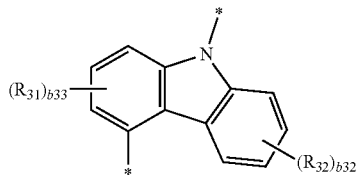

wherein, in Formulae 3A-1 to 3A-12 and 3B-1,
$R_{31}$ to $R_{33}$ and b31 to b33 may respectively be understood by referring to the descriptions of $R_{31}$ to $R_{33}$ and b31 to b33 provided herein, and
* indicates a binding site to an adjacent atom.

For example, a host in the emission layer 133 may include at least one of Compounds BH1 to BH13, but embodiments are not limited thereto:

BH1

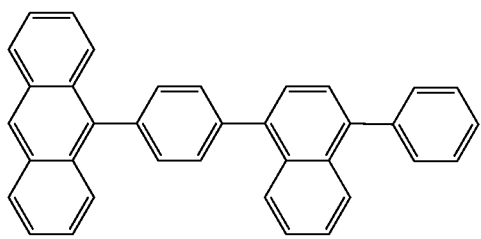

BH2

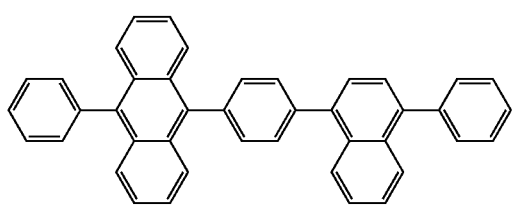

BH3

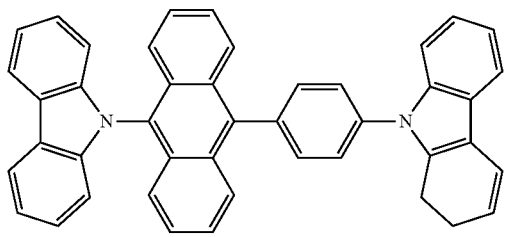

BH4

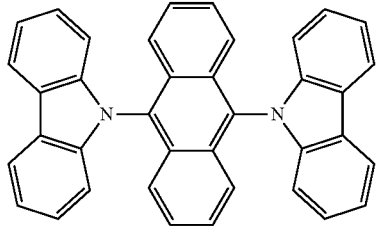

BH5

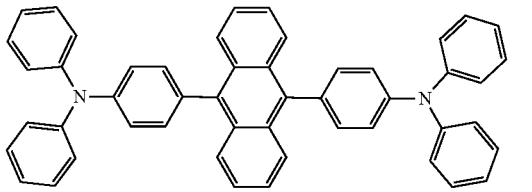

BH6

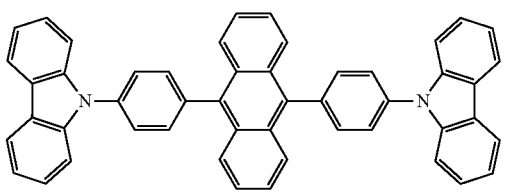

BH7

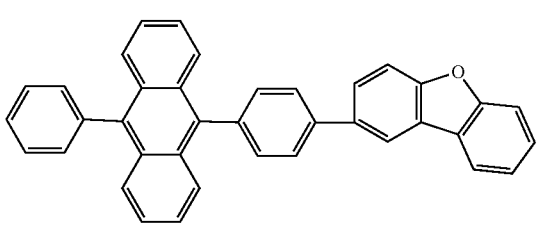

BH8

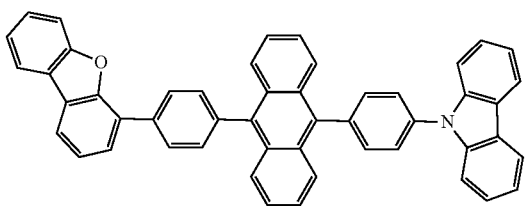

BH9

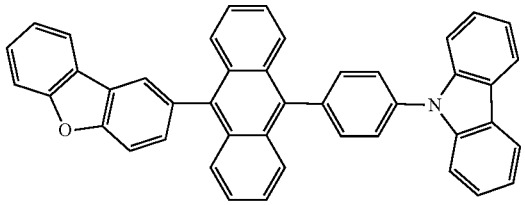

BH10

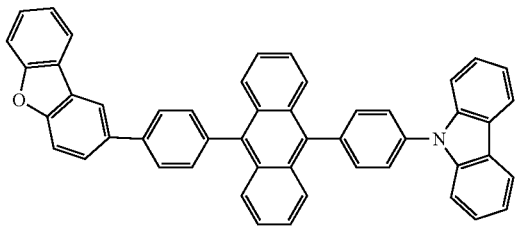

BH11

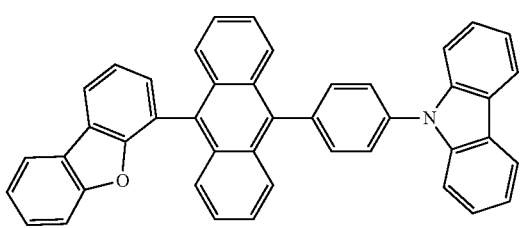

-continued

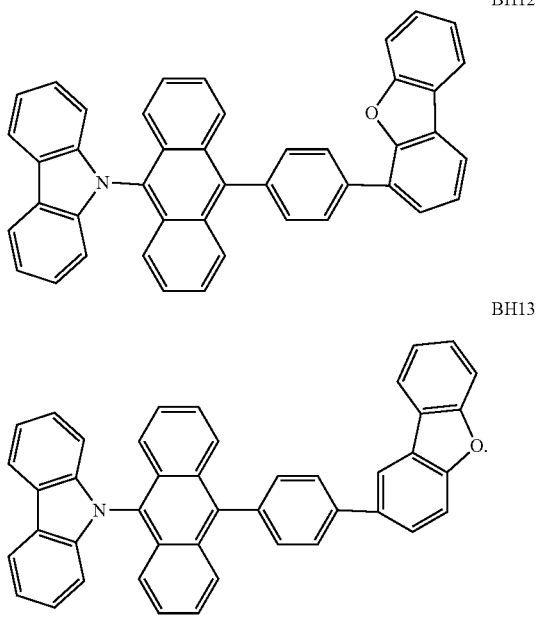

BH12

BH13

Phosphorescent Dopant

The phosphorescent dopant may include at least one transition metal as a center metal. The phosphorescent dopant may include a monodentate ligand, a bidentate ligand, a tridentate ligand, a tetradentate ligand, a pentadentate ligand, a hexadentate ligand, or any combination thereof. The phosphorescent dopant may be electrically neutral. In some embodiments, the phosphorescent dopant may include an organometallic complex represented by Formula 401:

$$M(L_{401})_{xc1}(L_{402})_{xc2}$$ Formula 401

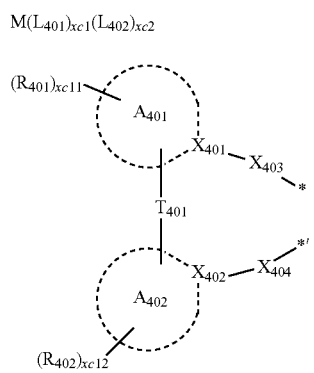

Formula 402 wherein, in Formulae 401 and 402,

M may be a transition metal (e.g., iridium (Ir), platinum (Pt), palladium (Pd), osmium (Os), titanium (Ti), gold (Au), hafnium (Hf), europium (Eu), terbium (Tb), rhodium (Rh), rhenium (Re), or thulium (Tm)), $L_{401}$ may be a ligand represented by Formula 402, and xc1 may be 1, 2, or 3, and when xc1 is 2 or greater, at least two $L_{401}(s)$ may be identical to or different from each other, $L_{402}$ may be an organic ligand, and xc2 may be an integer from 0 to 4, and when xc2 is 2 or greater, at least two $L_{402}(s)$ may be identical to or different from each other, $X_{401}$ and $X_{402}$ may each independently be nitrogen or carbon, ring $A_{401}$ and ring $A_{402}$ may each independently be a $C_3$-$C_{60}$ carbocyclic group or a $C_1$-$C_{60}$ heterocyclic group, $T_{401}$ may be a single bond, *—O—*', *—S—*', *—C(=O)—*', *—N($Q_{411}$)—*', *—C($Q_{411}$)($Q_{412}$)—*', *—C($Q_{411}$)=C($Q_{412}$)—*', *—C($Q_{411}$)=*', or *=C=*', $X_{403}$ and $X_{404}$ may each independently be a chemical bond (e.g., a covalent bond or a coordinate bond), O, S, N($Q_{413}$), B($Q_{413}$), P($Q_{413}$), C($Q_{413}$)($Q_{414}$), or Si($Q_{413}$)($Q_{414}$), $Q_{411}$ to $Q_{414}$ may each be understood by referring to the description of $Q_1$ provided herein, $R_{401}$ and $R_{402}$ may each independently be hydrogen, deuterium, —F, —Cl, —Br, —I, a hydroxyl group, a cyano group, a nitro group, a $C_1$-$C_{20}$ alkyl group unsubstituted or substituted with at least one $R_{10a}$, a $C_1$-$C_{20}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —Si($Q_{401}$)($Q_{402}$)($Q_{403}$), —N($Q_{401}$)($Q_{402}$), —B($Q_{401}$)($Q_{402}$), —C(=O)($Q_{401}$), —S(=O)$_2$($Q_{401}$), or —P(=O)($Q_{401}$)($Q_{402}$), $Q_{401}$ to $Q_{403}$ may each be understood by referring to the description of $Q_1$ provided herein, xc11 and xc12 may each independently be an integer from 0 to 10, and

* and *' in Formula 402 each indicate a binding site to M in Formula 401.

In one or more embodiments, in Formula 402, i) $X_{401}$ may be nitrogen, and $X_{402}$ may be carbon, or ii) $X_{401}$ and $X_{402}$ may both be nitrogen.

In one or more embodiments, when xc1 in Formula 402 is 2 or greater, two ring $A_{401}(s)$ of at least two $L_{401}(s)$ may optionally be bound via $T_{402}$ as a linking group, or two ring $A_{402}(s)$ may optionally be bound via $T_{403}$ as a linking group (see Compounds PD1 to PD4 and PD7). $T_{402}$ and $T_{403}$ may each be understood by referring to the description of $T_{401}$ provided herein.

The variable $L_{402}$ in Formula 401 may be any suitable organic ligand. For example, $L_{402}$ may be a halogen group, a diketone group (e.g., an acetylacetonate group), a carboxylic acid group (e.g., a picolinate group), a —C(=O) group, an isonitrile group, a —CN group, or a phosphorus group (e.g., a phosphine group or a phosphite group).

The phosphorescent dopant may be, for example, one of Compounds PD1 to PD25 or any combination thereof:

PD1

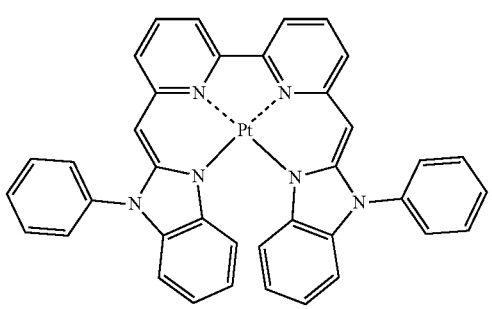

-continued
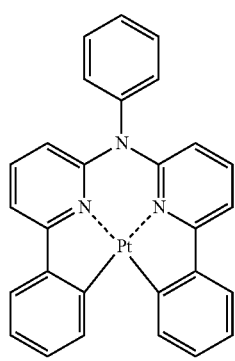
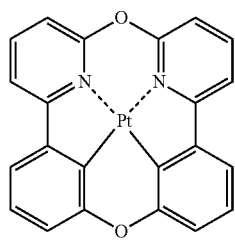
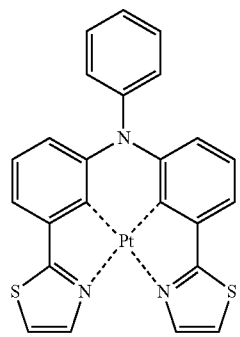
PD5
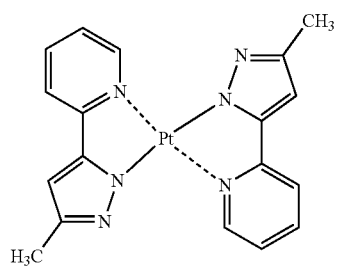
PD6
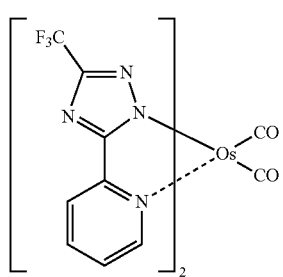
-continued
PD2
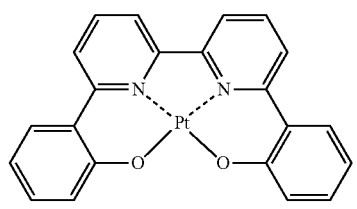
PD3
PD4
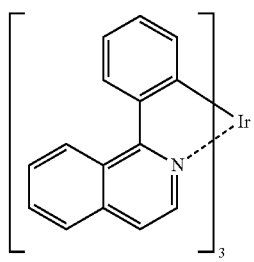
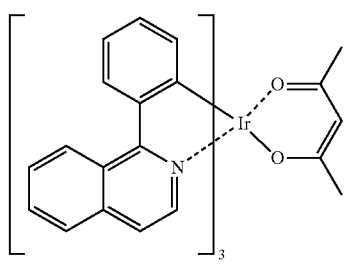
PD7
PD8
PD9
PD10
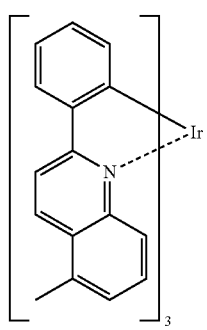
PD11
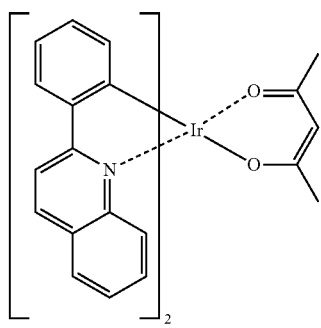

PD12 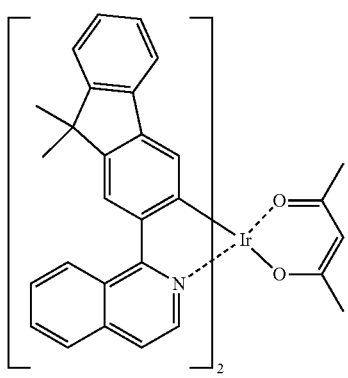
PD17 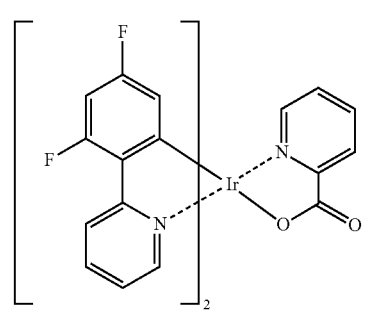
PD13 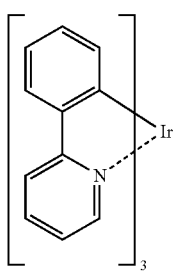
PD18 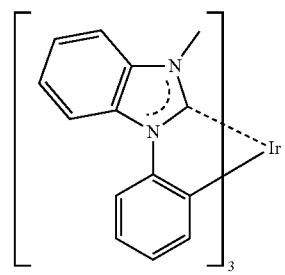
PD14 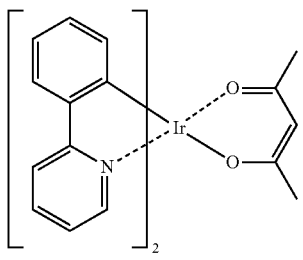
PD19 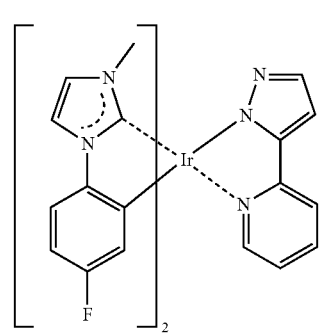
PD15 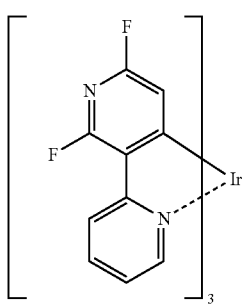
PD16 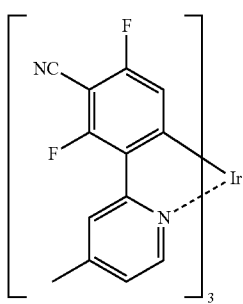
PD20 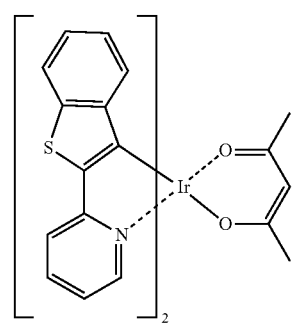

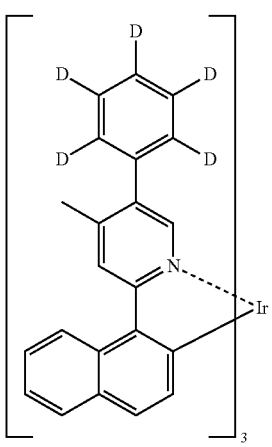

PD21

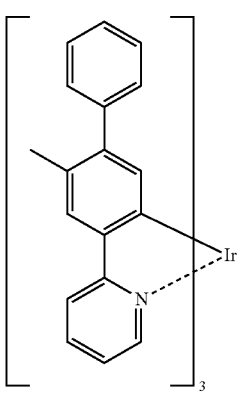

PD22

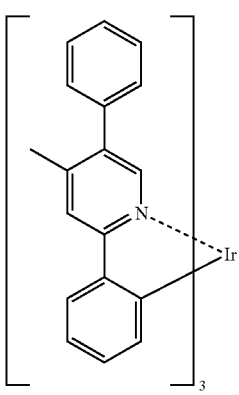

PD23

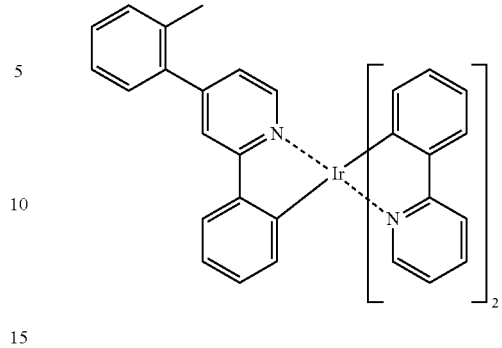

PD24

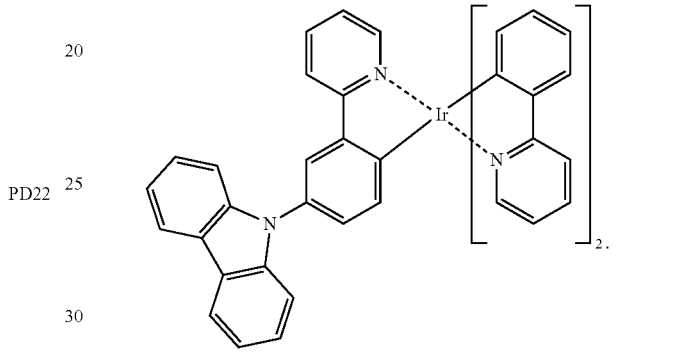

PD25

Fluorescent Dopant

The fluorescent dopant may include an amine group-containing compound, a styryl group-containing compound, or any combination thereof.

In some embodiments, the fluorescent dopant may include a compound represented by Formula 501:

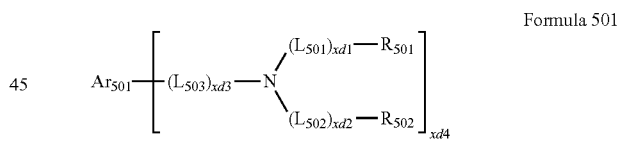

Formula 501 wherein, in Formula 501, $Ar_{501}$, $L_{501}$ to $L_{503}$, $R_{501}$, and $R_{502}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xd1 to xd3 may each independently be 0, 1, 2, or 3, and xd4 may be 1, 2, 3, 4, 5, or 6.

In some embodiments, in Formula 501, $Ar_{501}$ may include a condensed ring group (e.g., an anthracene group, a chrysene group, or a pyrene group) in which at least three monocyclic groups are condensed.

In some embodiments, xd4 in Formula 501 may be 2.

In some embodiments, the fluorescent dopant may include one of Compounds FD1 to FD36, DPVBi, DPAVBi, or any combination thereof:

61
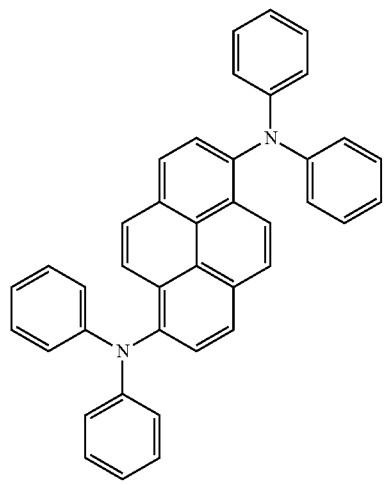
62
FD1
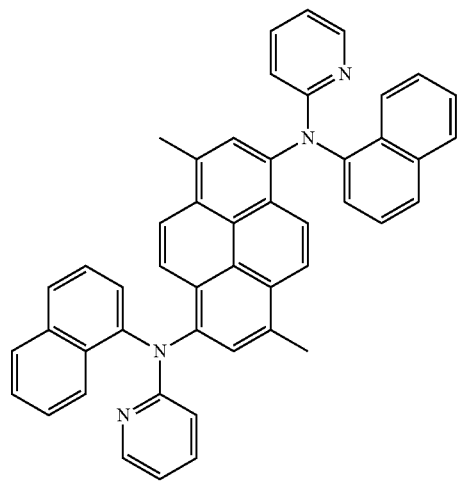
FD2
FD3
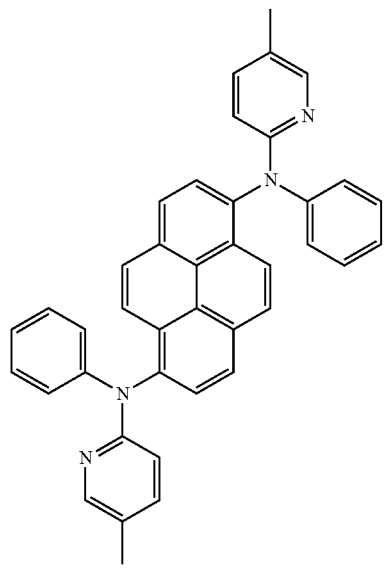
FD4
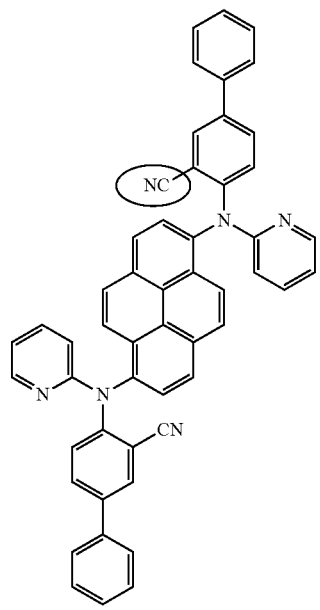
FD5
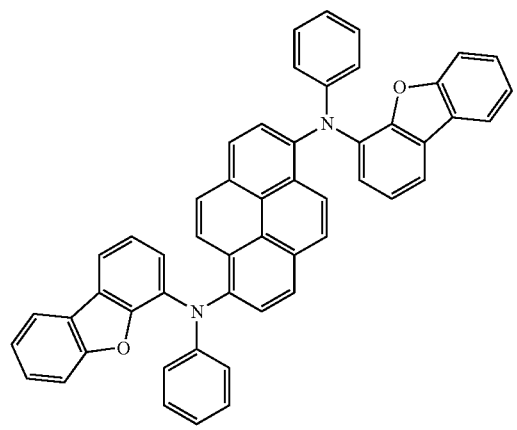
FD6
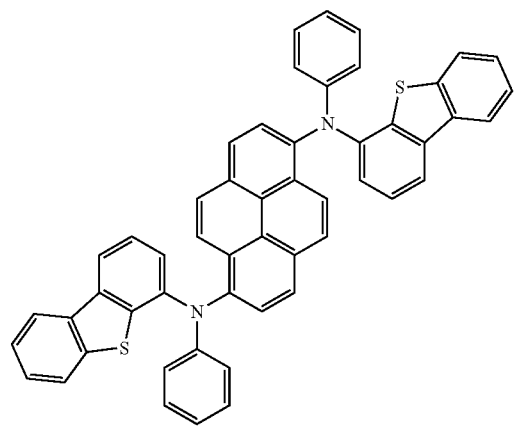

-continued
FD7
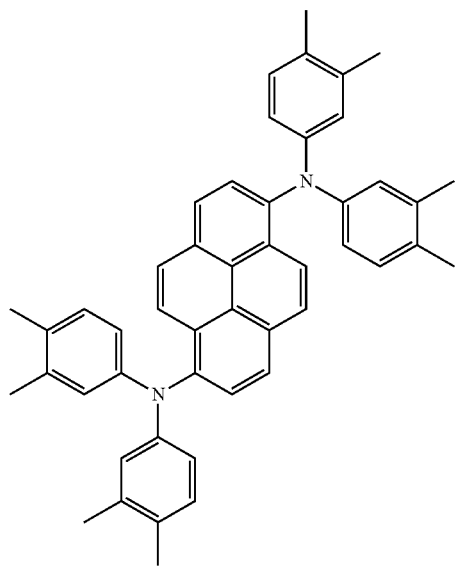
FD8
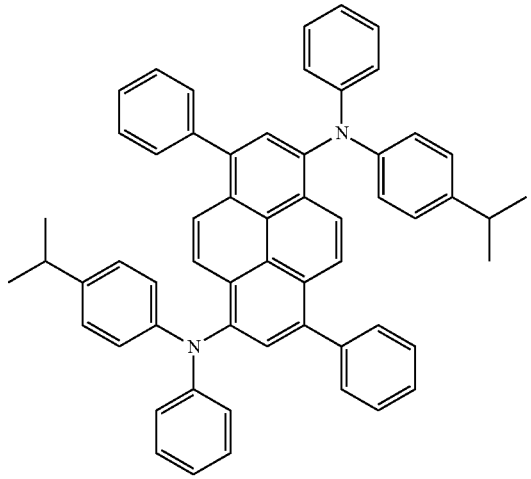
FD9
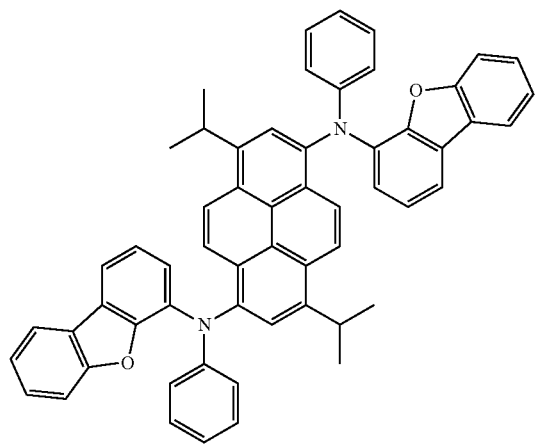
FD10
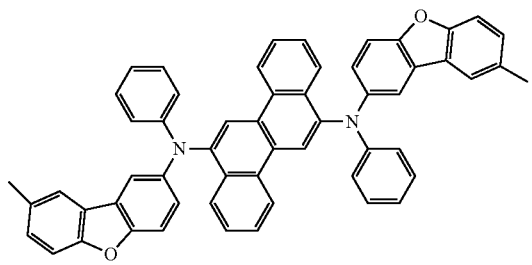
FD11
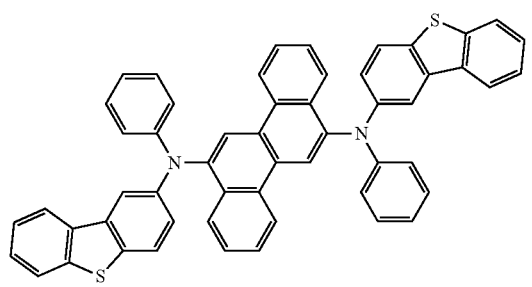
FD12
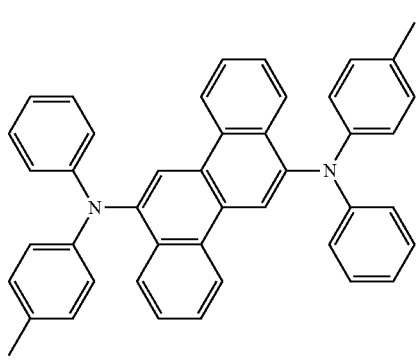

-continued
FD13
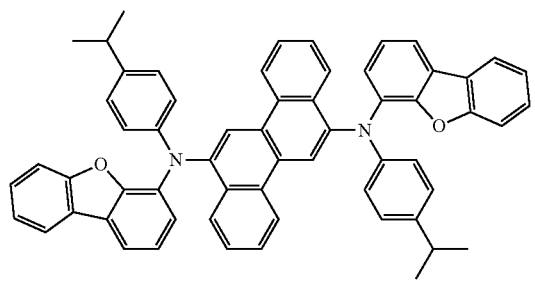
FD14
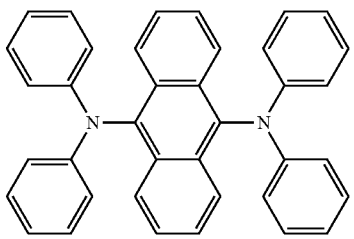
FD15
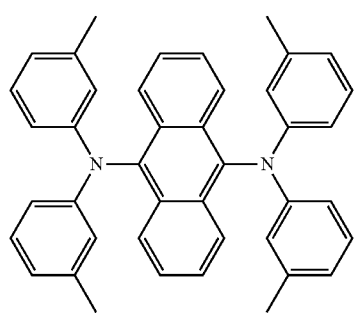
FD16
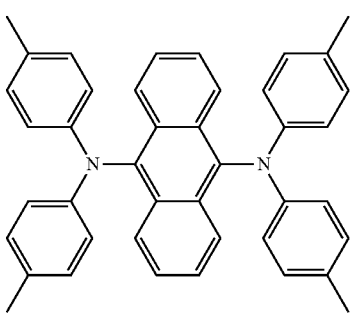
FD17
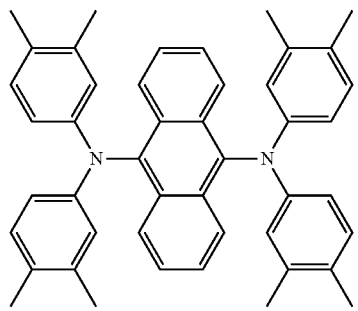
FD18
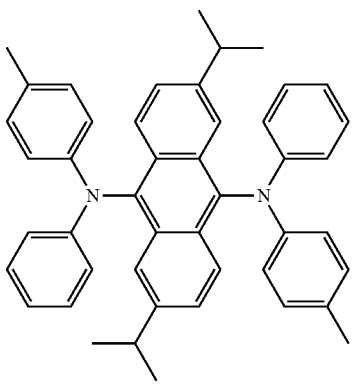
FD19
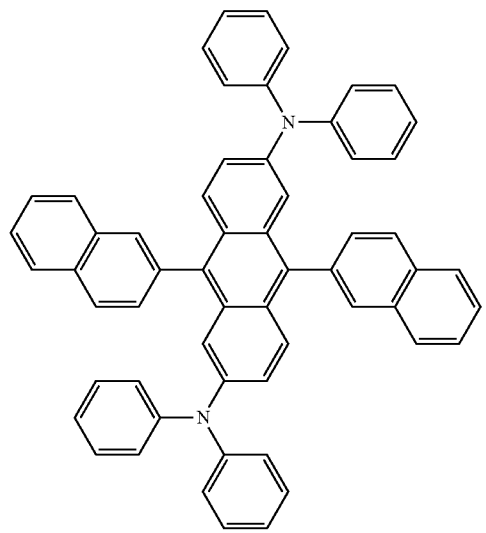
FD20
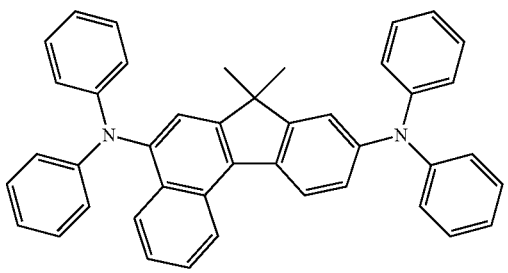

-continued
FD21
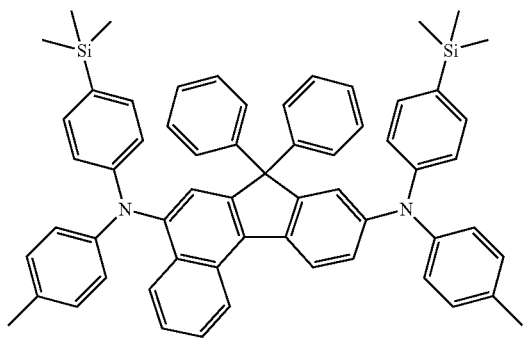
FD22
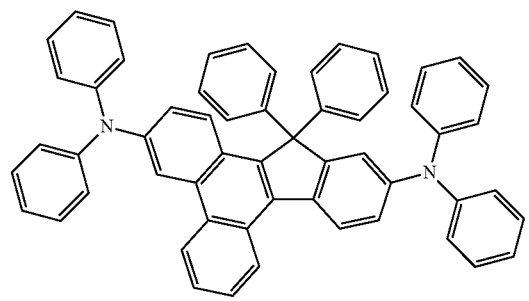
FD23
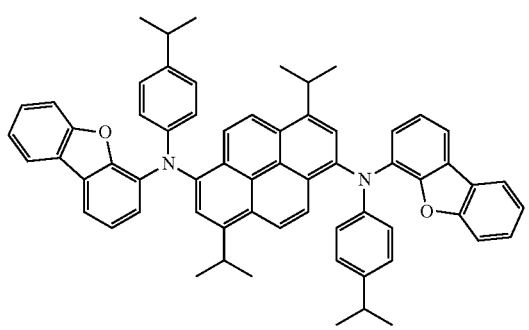
FD24
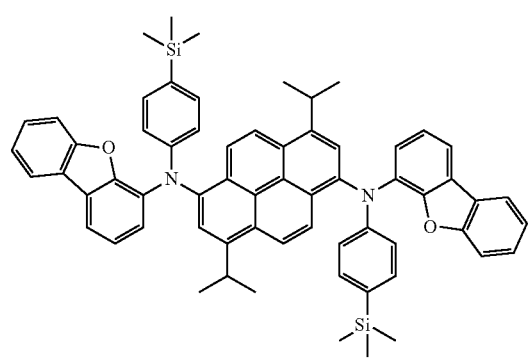
FD25
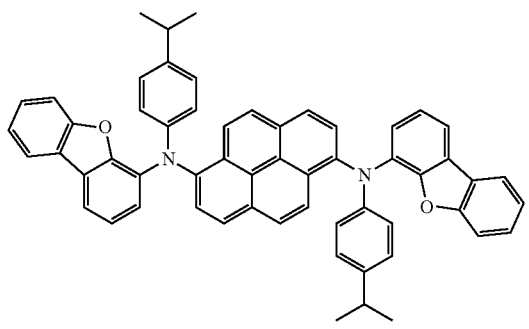
FD26
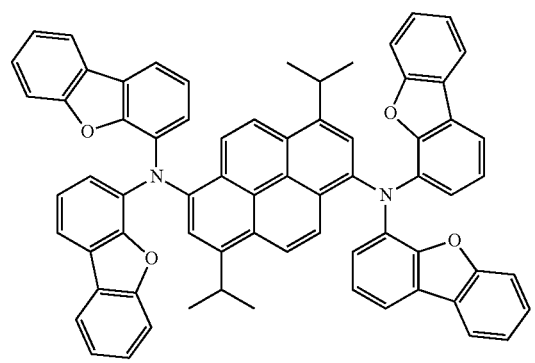
FD27
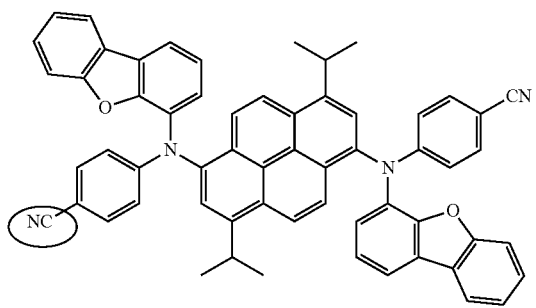
FD28
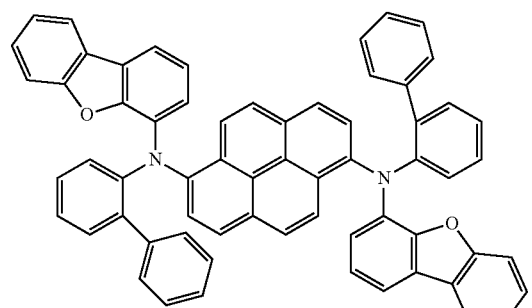

-continued
FD29
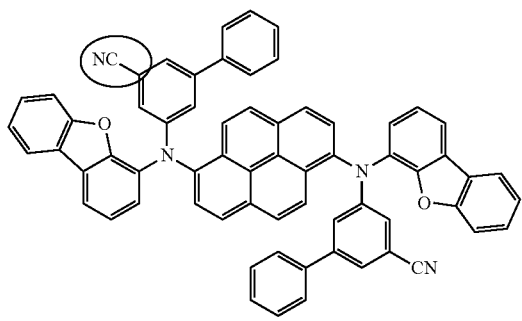
FD30
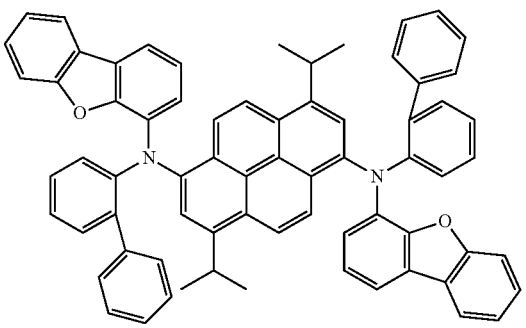
FD31
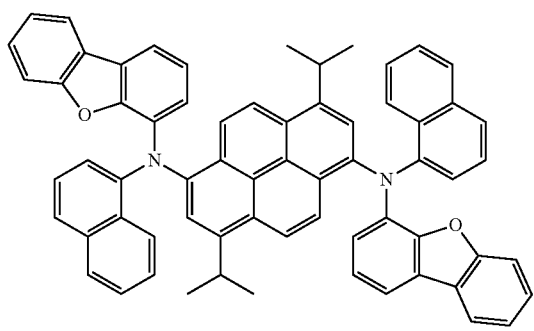
FD32
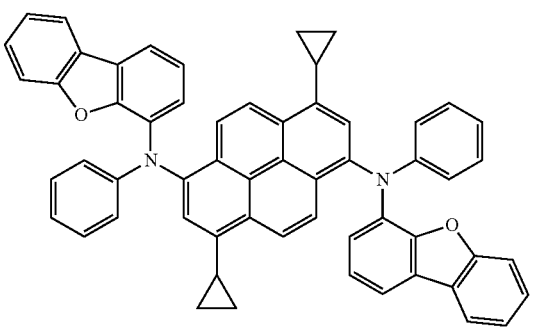
FD33
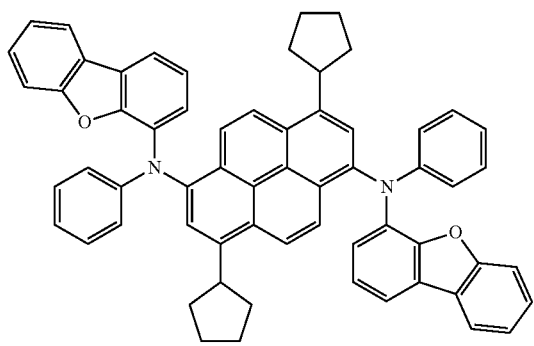
FD34
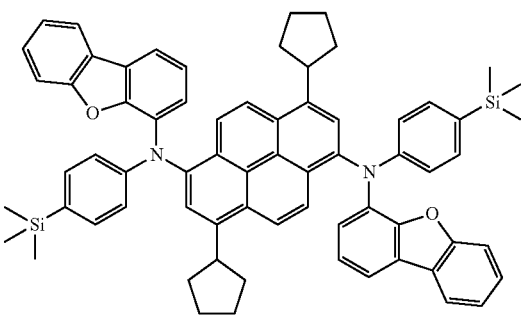
FD35
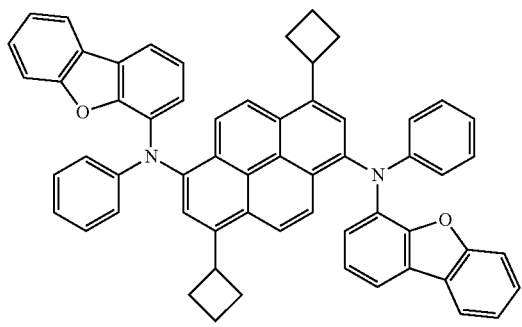
FD36
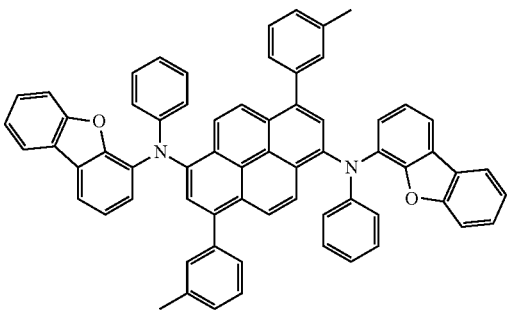

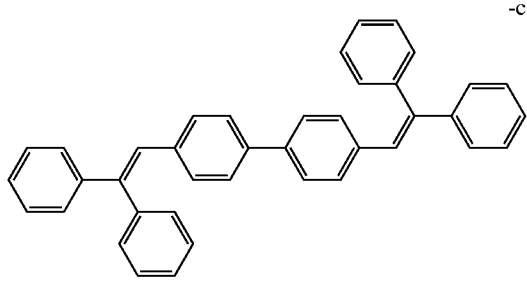

DPVBi

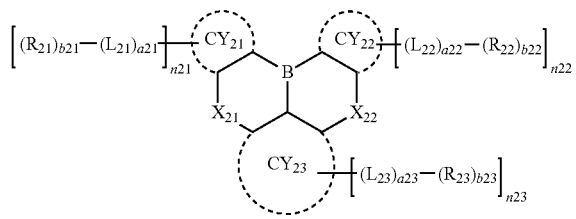

DPAVBi

Delayed Fluorescence Material

The emission layer 133 may include a delayed fluorescence material. In some embodiments, the delayed fluorescence material may be an emission layer dopant and include a condensed-cyclic compound represented by Formula 2:

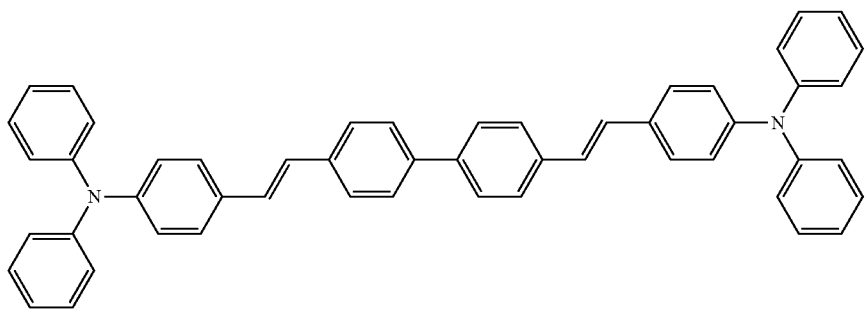

Formula 2 wherein, in Formula 2, $X_{21}$ may be $C(R_{24})(R_{25})$, $N(R_{24})$, O, or S, $X_{22}$ may be $C(R_{26})(R_{27})$, $N(R_{26})$, O, or S, $CY_{21}$ to $CY_{23}$ and $L_{21}$ to $L_{23}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, a21 to a23 may each independently be an integer from 0 to 5, $R_{21}$ to $R_{27}$ may each independently be hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, —Si($Q_1$)($Q_2$)($Q_3$), —N($Q_1$)($Q_2$), —B($Q_1$)($Q_2$), —C(=O)($Q_1$), —S(=O)$_2$($Q_1$), or —P(=O)($Q_1$)($Q_2$), b21 to b23 and n21 to n23 may each independently be an integer from 1 to 10, and $R_{10a}$ and $Q_1$ to $Q_3$ may respectively be understood by referring to the descriptions of $R_{10a}$ and $Q_1$ to $Q_3$ provided herein.

For example, a dopant in the emission layer 133 may include a condensed-cyclic compound represented by Formula 2-1:

Formula 2-1

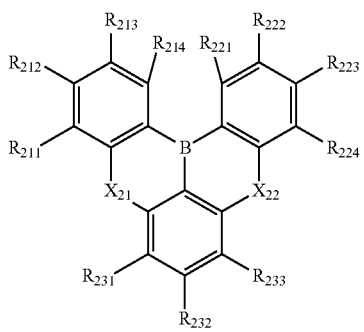

wherein, in Formula 2-1,

R$_{211}$ to R$_{214}$ may each be understood by referring to the description of R$_{21}$ provided herein, R$_{221}$ to R$_{224}$ may each be understood by referring to the description of R$_{22}$ provided herein, R$_{231}$ to R$_{233}$ may each be understood by referring to the description of R$_{23}$ provided herein, and X$_{21}$ and X$_{22}$ may respectively be understood by referring to the descriptions of X$_{21}$ and X$_{22}$ provided herein.

For example, a dopant in the emission layer 133 may include at least one of Compounds BD1 to BD19, but embodiments are not limited thereto:

BD1

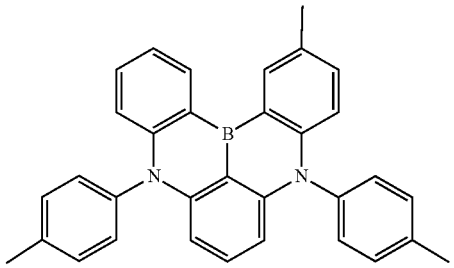

BD2

BD3

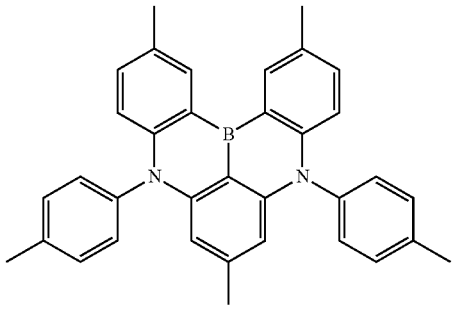

BD4

BD5

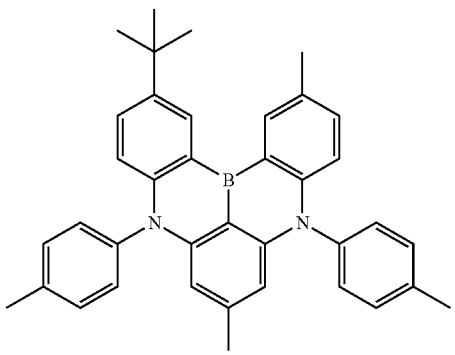

B6

B7

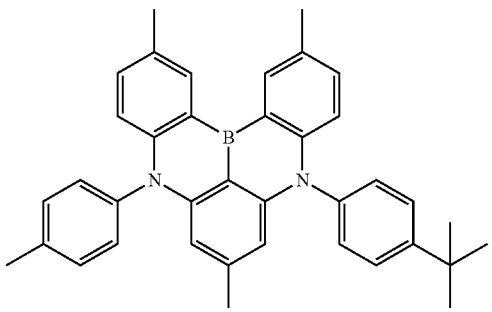

B8

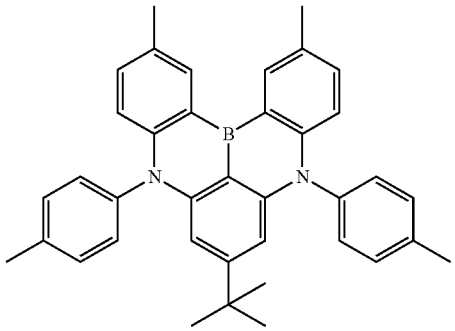

B9
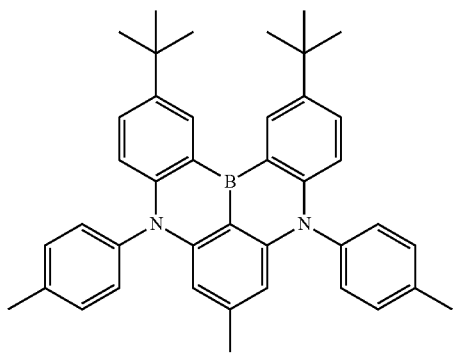
BD10
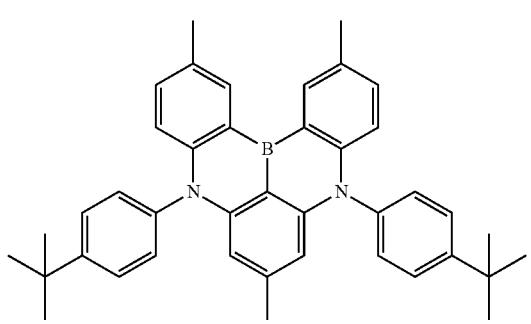
BD11
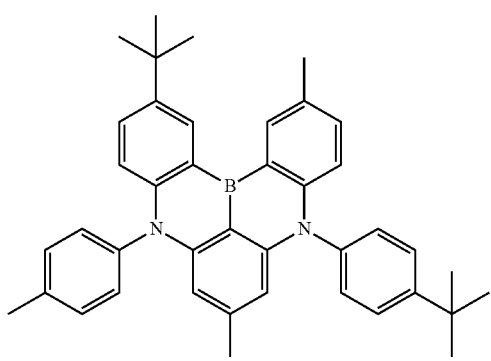
BD12
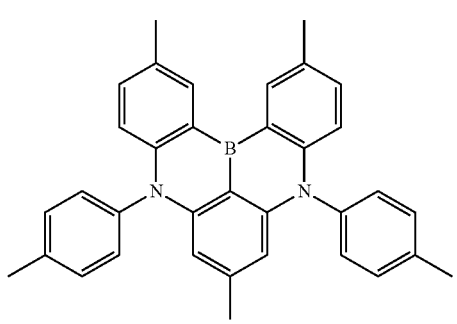
BD13
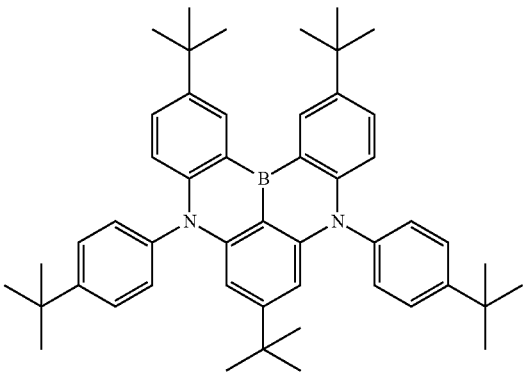
BD14
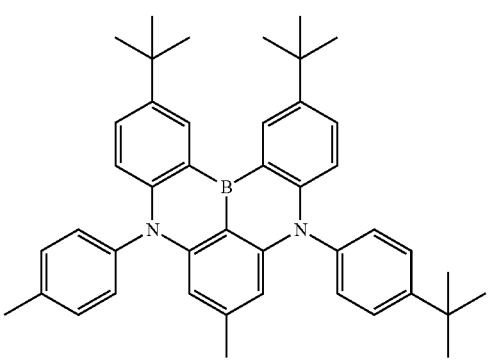
BD15
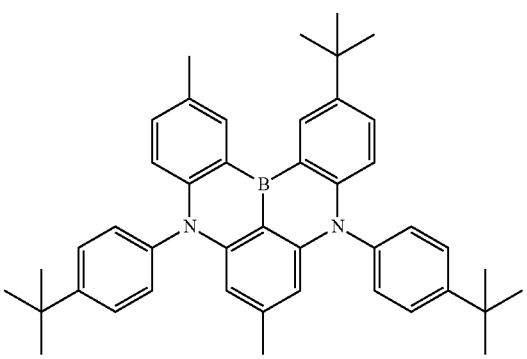
BD16
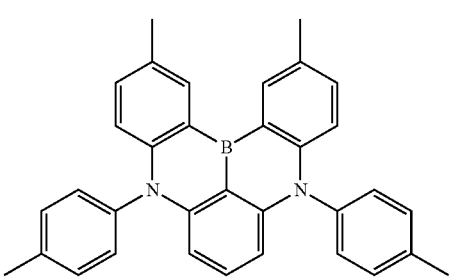

BD17

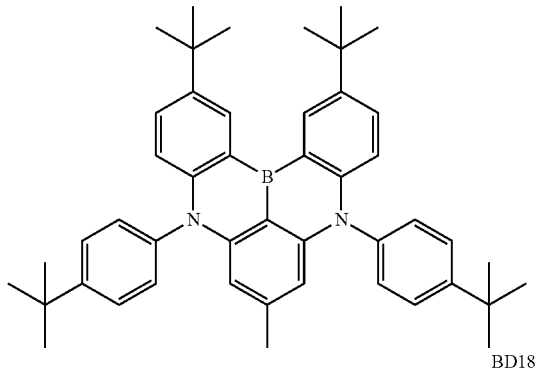

BD18

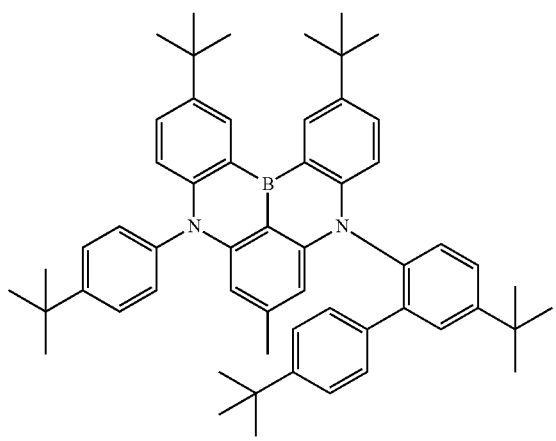

BD19

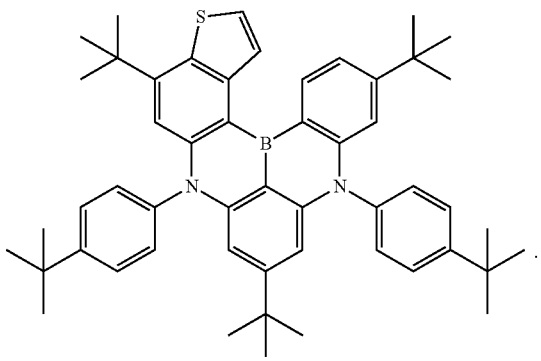

Because the condensed-cyclic compound represented by Formula 2 may have a narrow full width at half maximum (FWHM), a light-emitting device including the condensed-cyclic compound may have improved color purity and maximum external quantum efficiency.

Quantum Dots

In some embodiments, the emission layer 133 may include quantum dots. The diameter of the quantum dot may be, for example, in a range of about 1 nm to about 10 nm. Quantum dots may be synthesized by a wet chemical process, an organic metal chemical vapor deposition process, a molecular beam epitaxy process, or any similar process.

The wet chemical process is a method of growing a quantum dot particle crystal by mixing a precursor material with an organic solvent. When the crystal grows, the organic solvent may naturally serve as a dispersant coordinated on the surface of the quantum dot crystal and control the growth of the crystal. Thus, the wet chemical method may be easier to perform than the vapor deposition process such a metal organic chemical vapor deposition (MOCVD) or a molecular beam epitaxy (MBE) process. Further, the growth of quantum dot particles may be controlled with a lower manufacturing cost.

The quantum dot may include: a semiconductor compound of Groups II-VI; a semiconductor compound of Groups III-V; a semiconductor compound of Groups III-VI; a semiconductor compound of Groups I, III, and VI; a semiconductor compound of Groups IV-VI; an element or a compound of Group IV; or any combination thereof.

Examples of the semiconductor compound of Groups II-VI may include a binary compound such as CdS, CdSe, CdTe, ZnS, ZnSe, ZnTe, ZnO, HgS, HgSe, HgTe, MgSe, or MgS; a ternary compound such as CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, or MgZnS; a quaternary compound such as CdZnSeS, CdZnSeTe, CdZnSTe, CdHgSeS, CdHgSeTe, CdHgSTe, HgZnSeS, HgZnSeTe, or HgZnSTe; or any combination thereof.

Examples of the semiconductor compound of Groups III-V may include a binary compound such as GaN, GaP, GaAs, GaSb, AlN, AlP, AlAs, AlSb, InN, InP, InAs, or InSb; a ternary compound such as GaNP, GaNAs, GaNSb, GaPAs, GaPSb, AlNP, AlNAs, AlNSb, AlPAs, AlPSb, InGaP, InNP, InAlP, InNAs, InNSb, InPAs, or InPSb; a quaternary compound such as GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, or InAlPSb; or any combination thereof. In some embodiments, the semiconductor compound of Groups III-V may further include a Group II element. Examples of the semiconductor compound of Groups III-V further including the Group II element may include InZnP, InGaZnP, InAlZnP, and the like.

Examples of the semiconductor compound of Groups III-VI may include a binary compound such as GaS, GaSe, $Ga_2Se_3$, GaTe, InS, $In_2S_3$, InSe, $In_2Se_3$, InTe, and the like; a ternary compound such as $InGaS_3$, $InGaSe_3$, and the like; or any combination thereof. Examples of the semiconductor compound Groups I, III, and VI may include a ternary compound such as AgInS, $AgInS_2$, CuInS, $CuInS_2$, $CuGaO_2$, $AgGaO_2$, $AgAlO_2$, or any combination thereof.

Examples of the semiconductor compound of Groups IV-VI may include a binary compound such as SnS, SnSe, SnTe, PbS, PbSe, or PbTe; a ternary compound such as SnSeS, SnSeTe, SnSTe, PbSeS, PbSeTe, PbSTe, SnPbS, SnPbSe, or SnPbTe; a quaternary compound such as SnPbSSe, SnPbSeTe, or SnPbSTe; or any combination thereof. The element or compound of Group IV may be a single element compound such as Si or Ge; a binary compound such as SiC or SiGe; or any combination thereof. Individual elements included in the multi-element compound, such as a binary compound, a ternary compound, and a quaternary compound, may be present in a particle thereof at a uniform or non-uniform concentration.

The quantum dot may have a single structure in which the concentration of each element included in the quantum dot is uniform or a core-shell double structure. In some embodiments, materials included in the core may be different from materials included in the shell. The shell of the quantum dot may serve as a protective layer for preventing chemical denaturation of the core to maintain semiconductor characteristics and/or as a charging layer for imparting electrophoretic characteristics to the quantum dot. The shell may be a monolayer or a multilayer. The interface between a core and a shell may have a concentration gradient where a concentration of elements present in the shell decreases toward the core.

Examples of the shell of the quantum dot include a metal or a nonmetal oxide, a semiconductor compound, or a combination thereof. Examples of the metal oxide or the nonmetal oxide may include: a binary compound such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, or NiO; a ternary compound such as $MgAl_2O_4$, $CoFe_2O_4$, $NiFe_2O_4$, or $CoMn_2O_4$; and any combination thereof. Examples of the semiconductor compound may include a semiconductor compound of Groups II-VI; a semiconductor compound of Groups III-V; a semiconductor compound of Groups III-VI; a semiconductor compound of Groups I, III, and VI; a semiconductor compound of Groups IV-VI; or any combination thereof. In some embodiments, the semiconductor compound may be CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, or any combination thereof.

The quantum dot may have a full width of half maximum (FWHM) of a spectrum of an emission wavelength of about 45 nm or less, about 40 nm or less, or about 30 nm or less. When the FWHM of the quantum dot is within this range, color purity or color reproducibility may be improved. In addition, because light emitted through the quantum dot is emitted in all directions, an optical viewing angle may be improved.

In addition, the quantum dot may be specifically, a generally spherical, a generally pyramidal, a generally multi-armed, or a generally cubic nanoparticle, a generally nanotube-shaped particle, a generally nanowire-shaped particle, a generally nanofiber-shaped particle, or a generally nanoplate-shaped particle.

By adjusting the size of the quantum dot, the energy band gap may also be adjusted, thereby obtaining light of various wavelengths in the quantum dot emission layer. By using quantum dots of various sizes, a light-emitting device that may emit light of various wavelengths may be realized. In some embodiments, the size of the quantum dot may be selected such that the quantum dot may emit red, green, and/or blue light. In addition, the size of the quantum dot may be selected such that the quantum dot may emit white light by combining various light colors.

Electron Transport Region in Interlayer 130

The electron transport region may have i) a single-layered structure consisting of a single layer consisting of a single material, ii) a single-layered structure consisting of a single layer including a plurality of different materials, or iii) a multi-layered structure having a plurality of layers including a plurality of different materials. The electron transport region may include a buffer layer, a hole blocking layer, an electron control layer, the electron transport layer 134, or the electron injection layer 135.

In some embodiments, the electron transport region may have an electron transport layer 134/electron injection layer 135 structure, a hole blocking layer/electron transport layer 134/electron injection layer 135 structure, an electron control layer/electron transport layer 134/electron injection layer 135 structure, or a buffer layer/electron transport layer 134/electron injection layer 135 structure, wherein layers of each structure are sequentially stacked on the emission layer 133 in each stated order.

The electron transport region (e.g., a buffer layer, a hole blocking layer, an electron control layer, or an electron transport layer 134 in the electron transport region) may include a metal-free compound including at least one π electron-deficient nitrogen-containing $C_1$-$C_{60}$ cyclic group.

In some embodiments, the electron transport region may include a compound represented by Formula 601:

$$[Ar_{601}]_{xe11}\text{-}[(L_{601})_{xe1}\text{-}R_{601}]_{xe21} \qquad \text{Formula 601}$$

wherein, in Formula 601, $Ar_{601}$ and $L_{601}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xe11 may be 1, 2, or 3, xe1 may be 0, 1, 2, 3, 4, or 5, $R_{601}$ may be a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, $-Si(Q_{601})(Q_{602})(Q_{603})$, $-C(=O)(Q_{601})$, $-S(=O)_2(Q_{601})$, or $-P(=O)(Q_{601})(Q_{602})$, $Q_{601}$ to $Q_{603}$ may each be understood by referring to the description of $Q_1$ provided herein, xe21 may be 1, 2, 3, 4, or 5, and at least one of $Ar_{601}$, $L_{601}$, and $R_{601}$ may independently be a π electron-deficient nitrogen-containing $C_1$-$C_{60}$ cyclic group unsubstituted or substituted with at least one $R_{10a}$.

In some embodiments, when xe11 in Formula 601 is 2 or greater, at least two $Ar_{601}$(s) may be bound via a single bond. In some embodiments, in Formula 601, $Ar_{601}$ may be a substituted or unsubstituted anthracene group. In some embodiments, the electron transport region may include a compound represented by Formula 601-1:

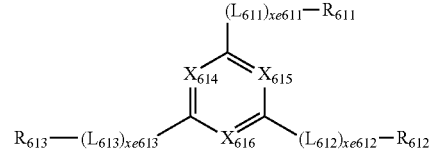

Formula 601-1 wherein, in Formula 601-1, $X_{614}$ may be N or $C(R_{614})$, $X_{615}$ may be N or $C(R_{615})$, $X_{616}$ may be N or $C(R_{616})$, at least one selected from $X_{614}$ to $X_{616}$ may be N, $L_{611}$ to $L_{613}$ may each be understood by referring to the description of $L_{601}$ provided herein, xe611 to xe613 may each be understood by referring to the description of xe1 provided herein, $R_{611}$ to $R_{613}$ may each be understood by referring to the description of $R_{601}$ provided herein, and $R_{614}$ to $R_{616}$ may each independently be hydrogen, deuterium, $-F$, $-Cl$, $-Br$, $-I$, a hydroxyl group, a cyano group, a nitro group, a $C_1$-$C_{20}$ alkyl group, a $C_1$-$C_{20}$ alkoxy group, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$.

For example, xe1 and xe611 to xe613 in Formulae 601 and 601-1 may each independently be 0, 1, or 2.

The electron transport region may include one of Compounds ET1 to ET45, 2,9-dimethyl-4,7-diphenyl-1,10-phenanthroline (BCP), 4,7-diphenyl-1,10-phenanthroline (Bphen), tris-(8-hydroxyquinoline)aluminum ($Alq_3$), bis(2-methyl-8-quinolinolato-N1,O8)-(1,1'-biphenyl-4-olato)aluminum (BAlq), 3-(biphenyl-4-yl)-5-(4-tert-butylphenyl)-4-phenyl-4H-1,2,4-triazole (TAZ), 4-(naphthalen-1-yl)-3,5-diphenyl-4H-1,2,4-triazole (NTAZ), or any combination thereof:
ET1
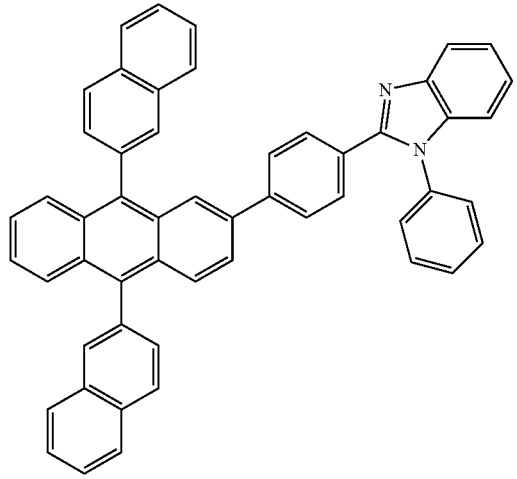
ET2
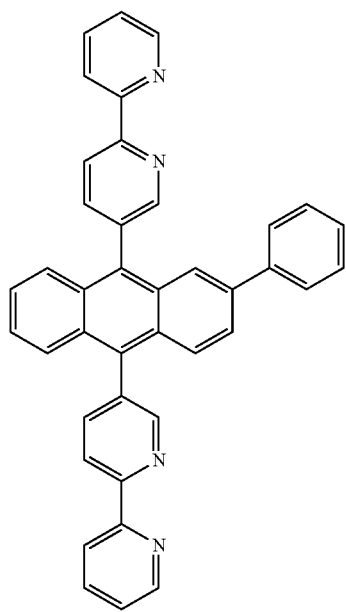
ET3
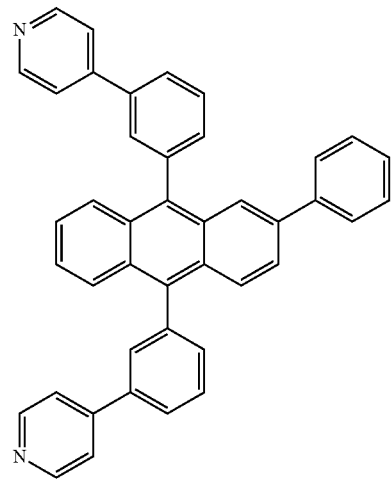
ET4
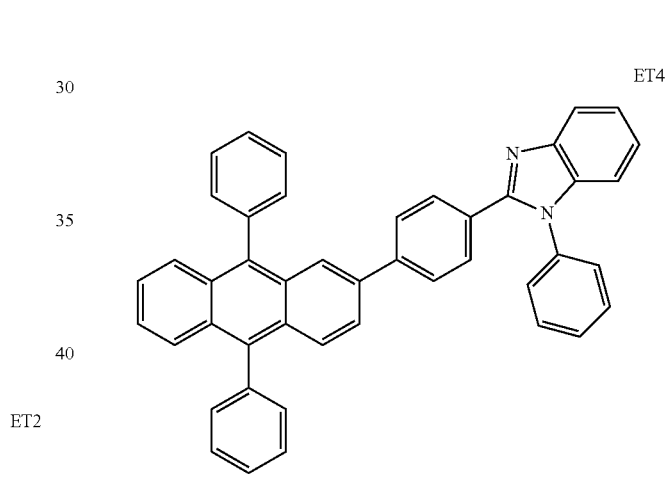
ET5
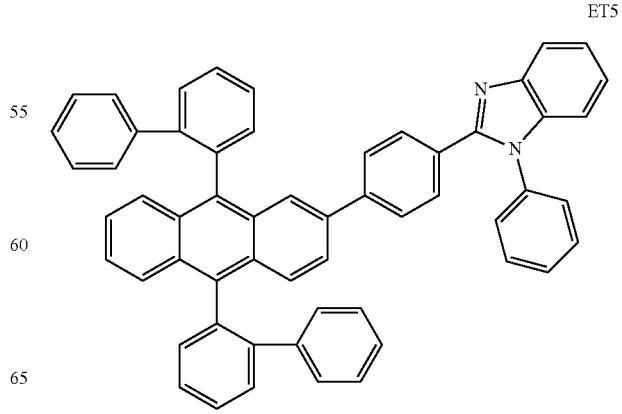

ET6
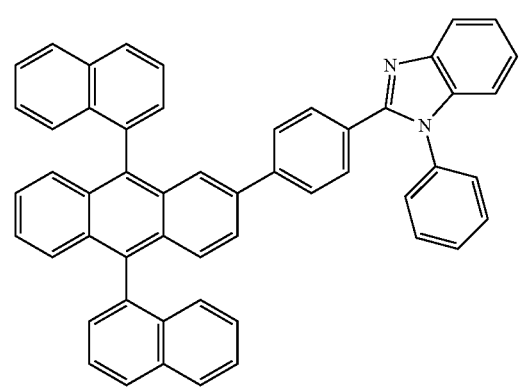
ET7
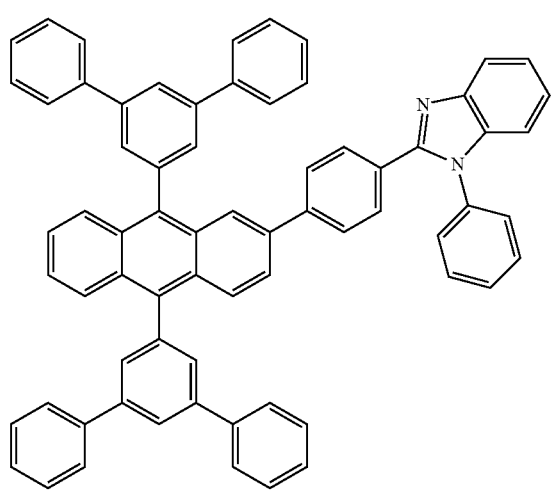
ET8
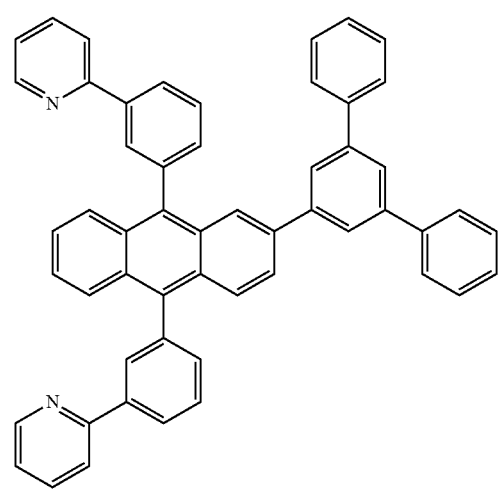
ET9
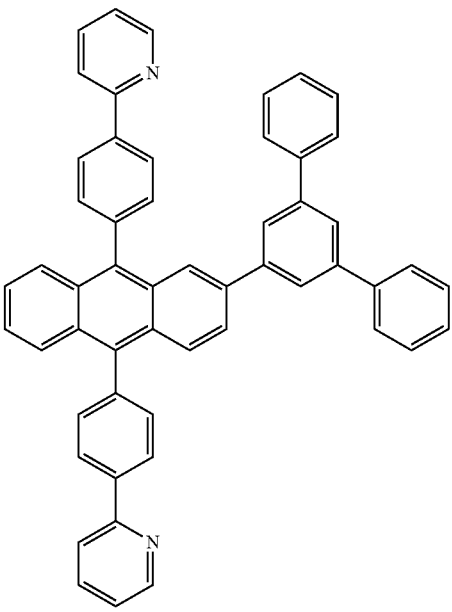
ET10
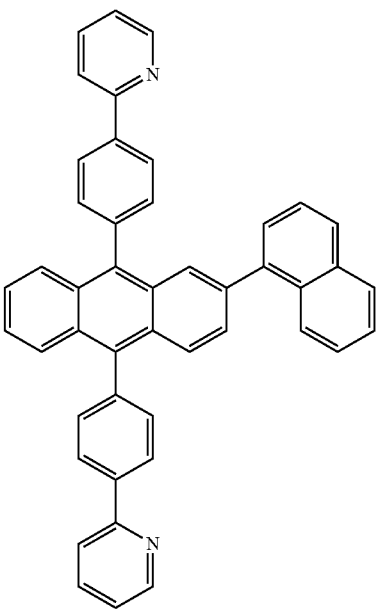

ET11
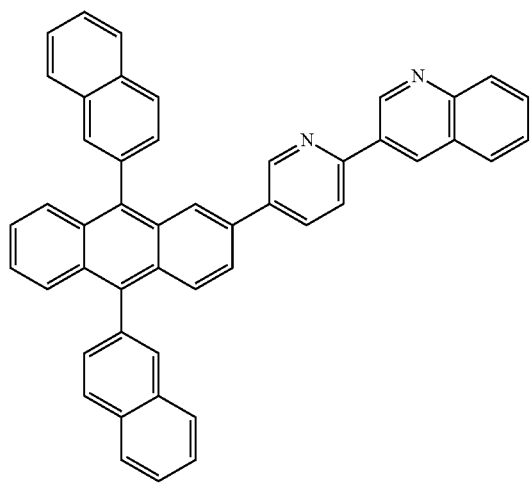
ET12
ET13
ET14
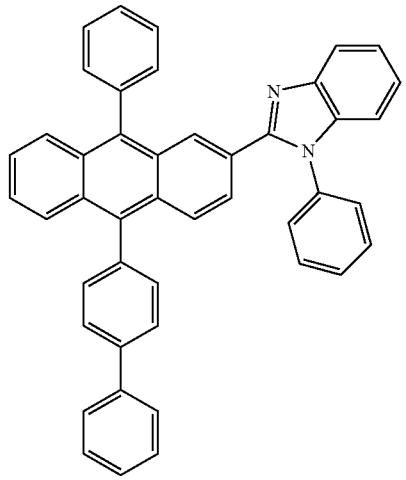
ET15
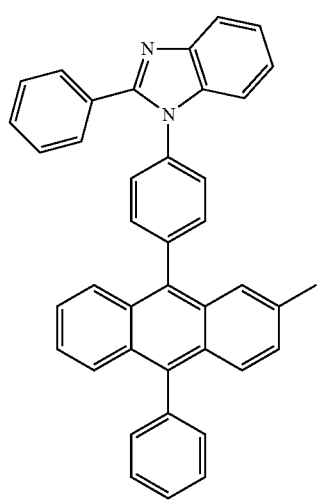
ET16
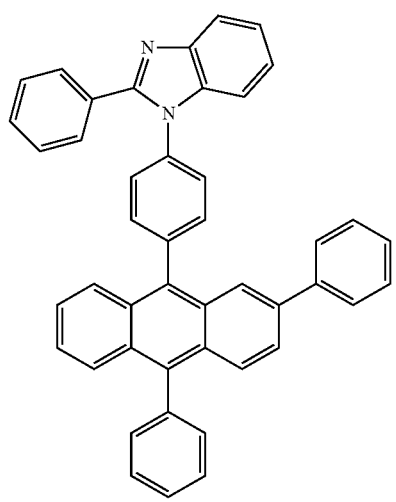

ET17
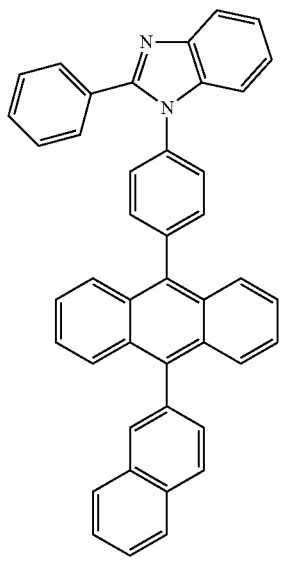
ET18
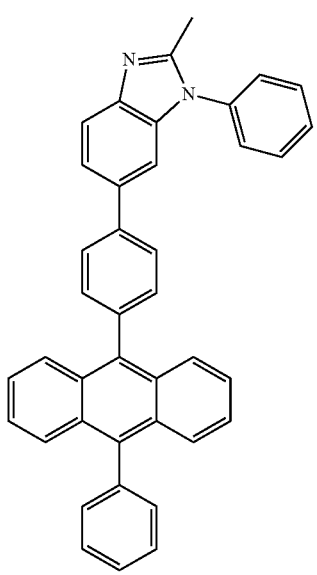
ET19
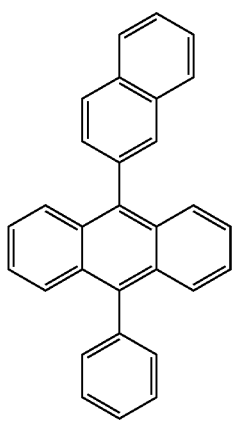
ET20
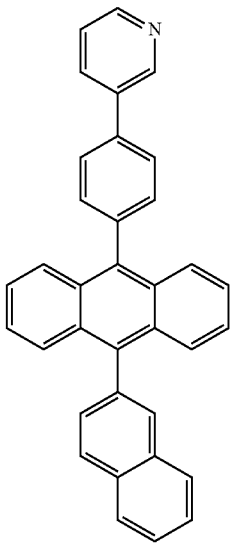
ET21
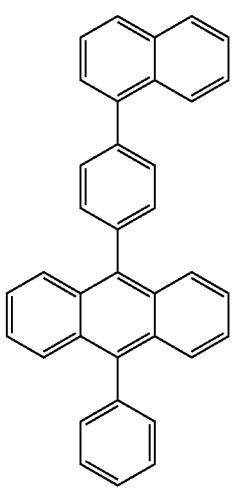
ET22
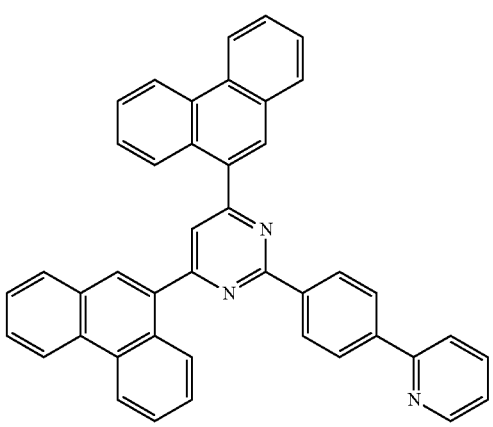

ET23
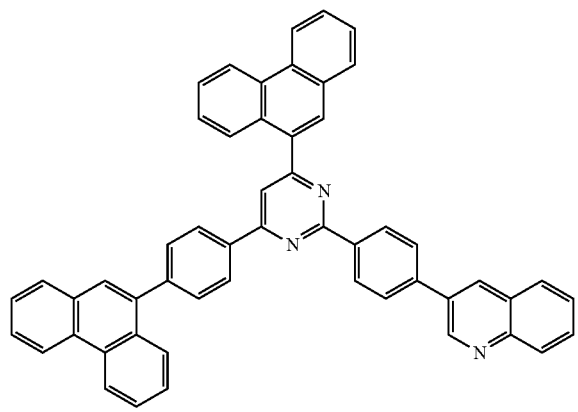
ET26
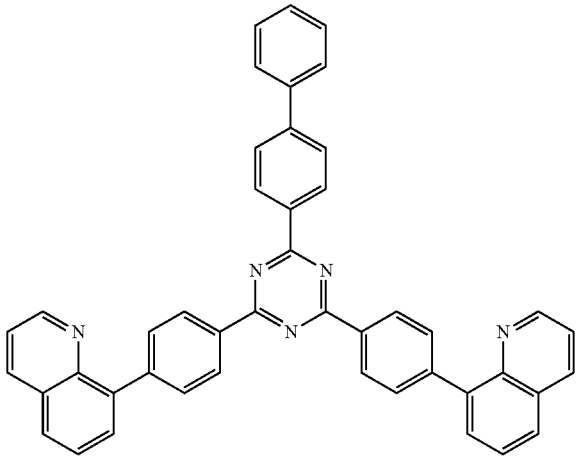
ET24
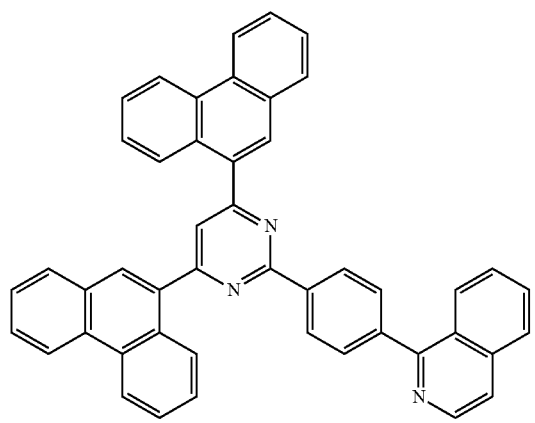
ET27
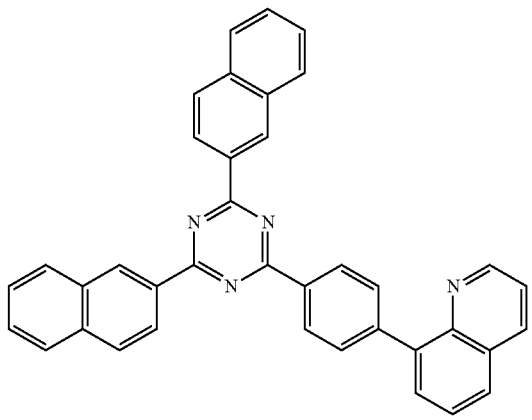
ET25
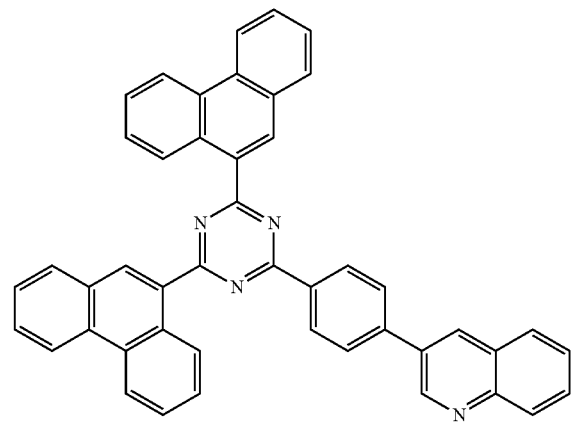
ET28
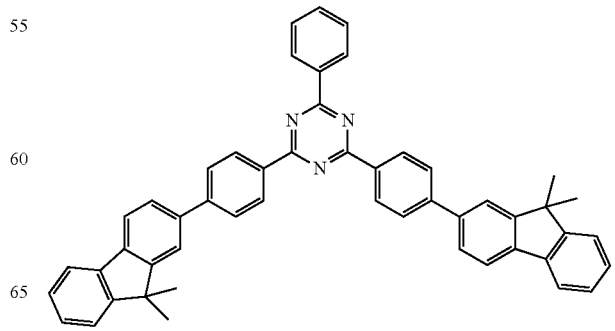

ET29
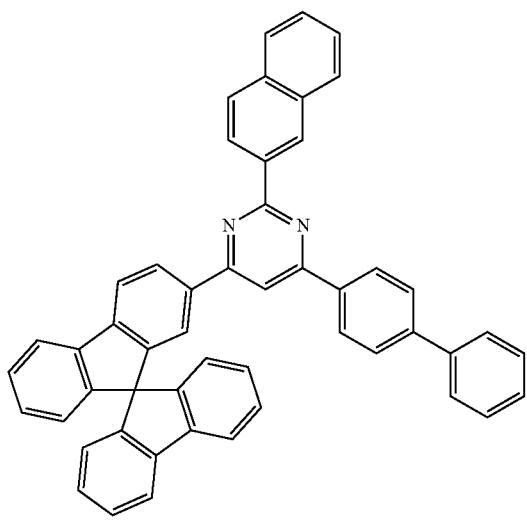
ET32
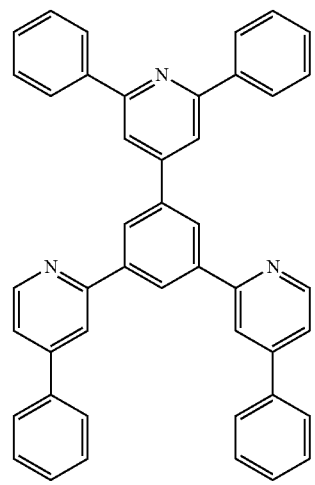
ET30
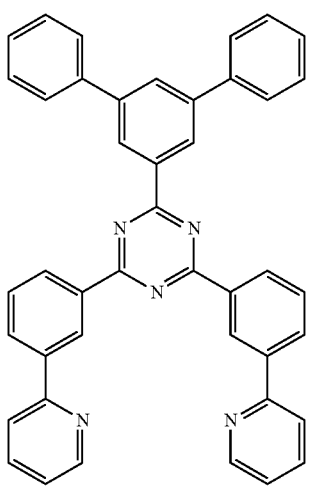
ET33
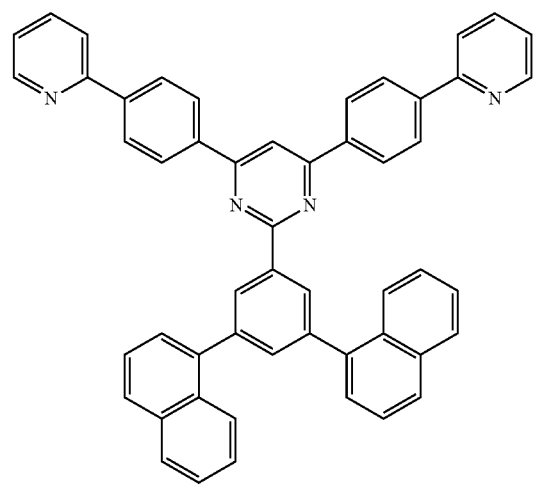
ET31
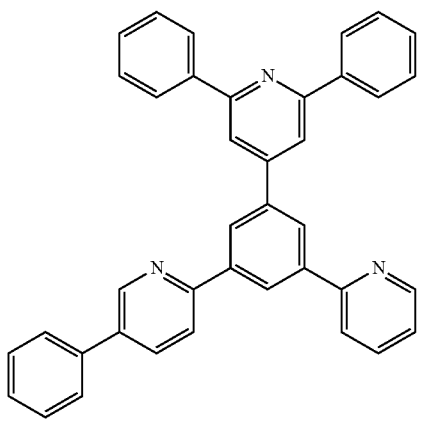
ET34
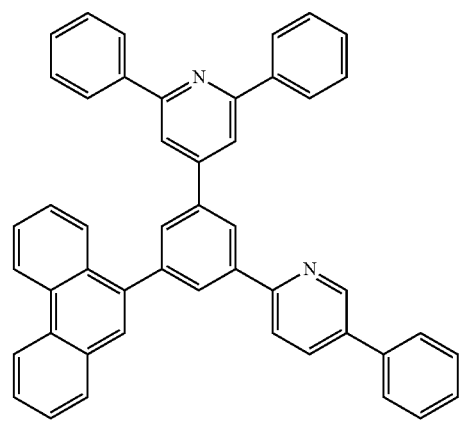

ET35
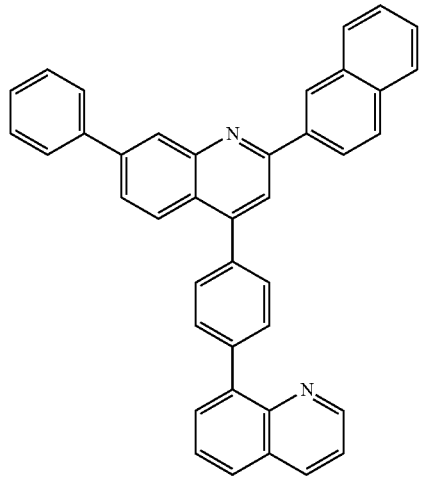
ET36
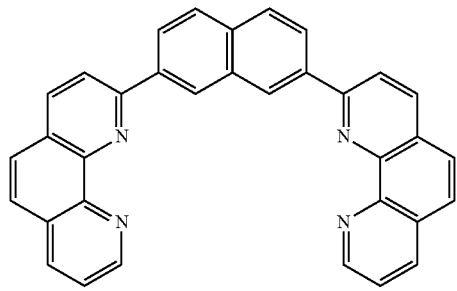
ET37
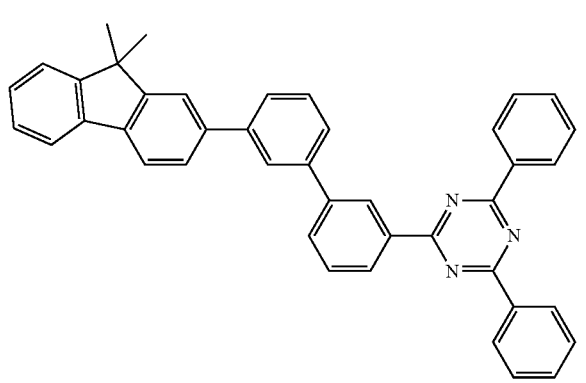
ET38
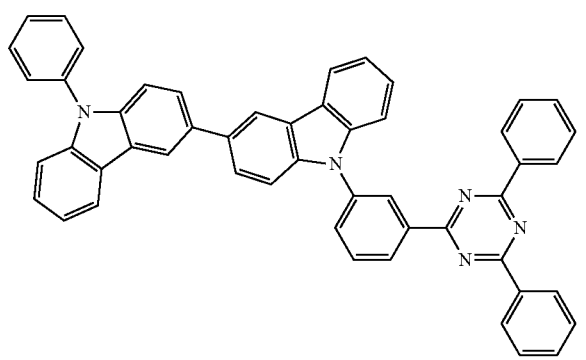
ET39
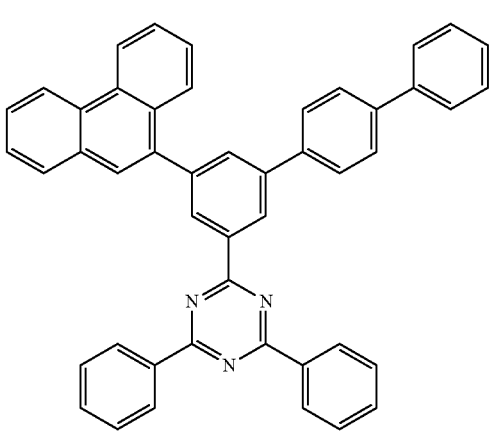
ET40
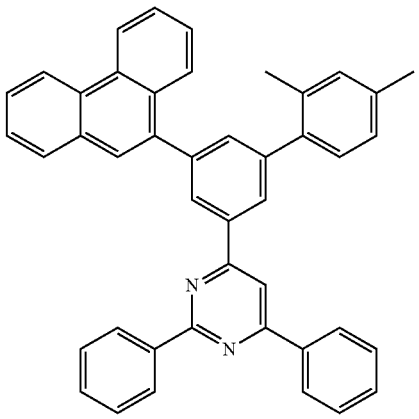
ET41
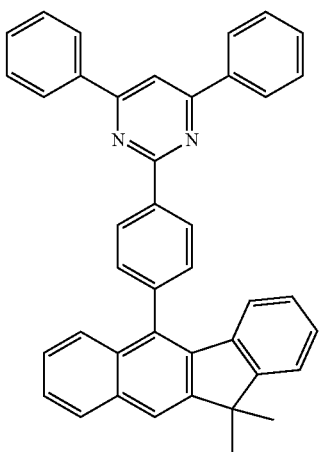

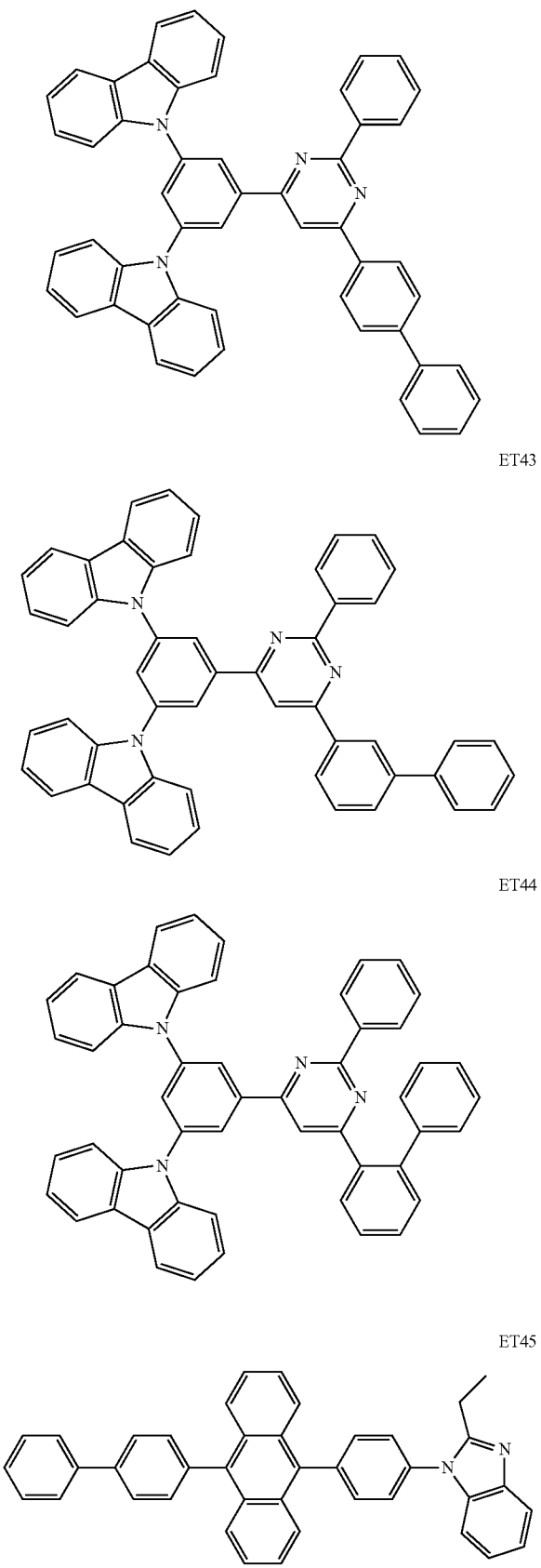

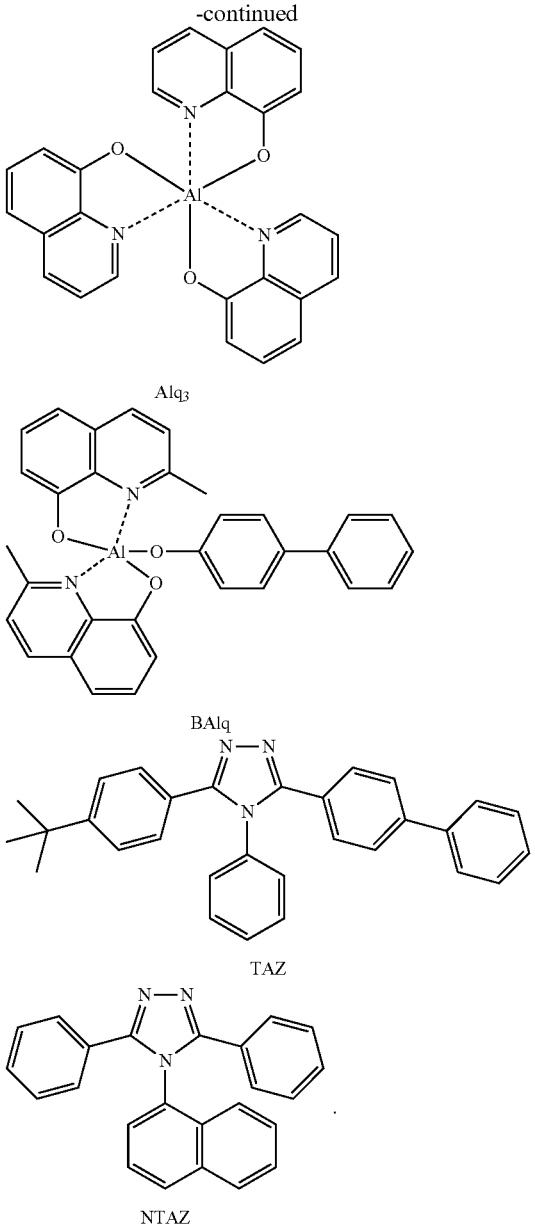

The thickness of the electron transport region may be in a range of about 100 Angstroms (Å) to about 5,000 Å, for example, about 160 Å to about 4,000 Å. When the electron transport region includes the buffer layer, the hole blocking layer, the electron control layer, the electron transport layer 134, or any combination thereof, the thicknesses of the buffer layer, the hole blocking layer, or the electron control layer may each independently be in a range of about 20 Å to about 1,000 Å, for example, about 30 Å to about 300 Å, and the thickness of the electron transport layer 134 may be in a range of about 100 Å to about 1,000 Å, for example, about 150 Å to about 500 Å. When the thicknesses of the buffer layer, the hole blocking layer, the electron control layer, and/or the electron transport layer 134 are each within these ranges, excellent electron transport characteristics may be obtained without a substantial increase in driving voltage.

The electron transport region (for example, the electron transport layer 134 in the electron transport region) may further include, in addition to the materials described above, a metal-containing material.

The metal-containing material may include an alkali metal complex, an alkaline earth metal complex, or any combination thereof. A metal ion of the alkali metal complex may be a lithium (Li) ion, a sodium (Na) ion, a potassium (K) ion, a rubidium (Rb) ion, or a cesium (Cs) ion. A metal ion of the alkaline earth metal complex may be a beryllium (Be) ion, a magnesium (Mg) ion, a calcium (Ca) ion, a strontium (Sr) ion, or a barium (Ba) ion. Each ligand coordinated with the metal ion of the alkali metal complex and the alkaline earth metal complex may independently be a hydroxyquinoline, a hydroxyisoquinoline, a hydroxybenzoquinoline, a hydroxyacridine, a hydroxyphenanthridine, a hydroxyphenyloxazole, a hydroxyphenylthiazole, a hydroxyphenyloxadiazole, a hydroxyphenylthiadiazole, a hydroxyphenylpyridine, a hydroxyphenylbenzimidazole, a hydroxyphenylbenzothiazole, a bipyridine, a phenanthroline, a cyclopentadiene, or any combination thereof.

For example, the metal-containing material may include a Li complex. The Li complex may include, e.g., Compound ET-D1 (lithium quinolate, LiQ) or Compound ET-D2:

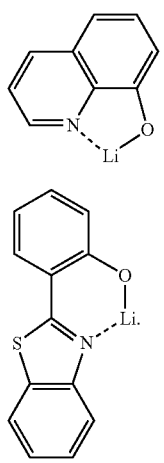

ET-D1

ET-D2

The electron transport region may include an electron injection layer 135 that facilitates electron injection from the second electrode 150. The electron injection layer 135 may be in direct contact with the second electrode 150.

The electron injection layer 135 may have i) a single-layered structure consisting of a single layer consisting of a single material, ii) a single-layered structure consisting of a single layer including a plurality of different materials, or iii) a multi-layered structure having a plurality of layers including a plurality of different materials.

The electron injection layer 135 may include an alkali metal, an alkaline earth metal, a rare earth metal, an alkali metal-containing compound, an alkaline earth metal-containing compound, a rare earth metal-containing compound, an alkali metal complex, an alkaline earth metal complex, a rare earth metal complex, or any combination thereof.

The alkali metal may be Li, Na, K, Rb, Cs or any combination thereof. The alkaline earth metal may be Mg, Ca, Sr, Ba, or any combination thereof. The rare earth metal may be Sc, Y, Ce, Tb, Yb, Gd, or any combination thereof.

The alkali metal-containing compound, the alkaline earth metal-containing compound, and the rare earth metal-containing compound may respectively be oxides, halides (e.g., fluorides, chlorides, bromides, or iodides), tellurides, or any combination thereof of each of the alkali metal, the alkaline earth metal, and the rare earth metal.

The alkali metal-containing compound may be alkali metal oxides such as $Li_2O$, $Cs_2O$, or $K_2O$, alkali metal halides such as LiF, NaF, CsF, KF, LiI, NaI, CsI, or KI, or any combination thereof. The alkaline earth-metal-containing compound may include alkaline earth-metal oxides, such as BaO, SrO, CaO, $Ba_xSr_{1-x}O$ (wherein x is a real number that satisfies 0<x<1), or $Ba_xCa_{1-x}O$ (wherein x is a real number that satisfies 0<x<1). The rare earth metal-containing compound may include $YbF_3$, $ScF_3$, $Sc_2O_3$, $Y_2O_3$, $Ce_2O_3$, $GdF_3$, $TbF_3$, $YbI_3$, $ScI_3$, $TbI_3$, or any combination thereof. In some embodiments, the rare earth metal-containing compound may include a lanthanide metal telluride. Examples of the lanthanide metal telluride may include LaTe, CeTe, PrTe, NdTe, PmTe, SmTe, EuTe, GdTe, TbTe, DyTe, HoTe, ErTe, TmTe, YbTe, LuTe, $La_2Te_3$, $Ce_2Te_3$, $Pr_2Te_3$, $Nd_2Te_3$, $Pm_2Te_3$, $Sm_2Te_3$, $Eu_2Te_3$, $Gd_2Te_3$, $Tb_2Te_3$, $Dy_2Te_3$, $Ho_2Te_3$, $Er_2Te_3$, $Tm_2Te_3$, $Yb_2Te_3$, $Lu_2Te_3$, and the like.

The alkali metal complex, the alkaline earth metal complex, and the rare earth metal complex may include: i) one of ions of the alkali metal, alkaline earth metal, and rare earth metal described above and ii) a ligand bound to the metal ion, e.g., a hydroxyquinoline, a hydroxyisoquinoline, a hydroxybenzoquinoline, a hydroxyacridine, a hydroxyphenanthridine, a hydroxyphenyloxazole, a hydroxyphenylthiazole, a hydroxyphenyloxadiazole, a hydroxyphenylthiadiazole, a hydroxyphenylpyridine, a hydroxyphenylbenzimidazole, a hydroxyphenylbenzothiazole, a bipyridine, a phenanthroline, a cyclopentadiene, or any combination thereof.

The electron injection layer 135 may include an alkali metal, an alkaline earth metal, a rare earth metal, an alkali metal-containing compound, an alkaline earth metal-containing compound, a rare earth metal-containing compound, an alkali metal complex, an alkaline earth metal complex, a rare earth metal complex, or any combination thereof as described above, or may further include an organic material (e.g., a compound represented by Formula 601).

In some embodiments, the electron injection layer 135 may consist of i) an alkali metal-containing compound (e.g., an alkali metal halide), or ii) a) an alkali metal-containing compound (e.g., an alkali metal halide); and b) an alkali metal, an alkaline earth metal, a rare earth metal, or any combination thereof. In some embodiments, the electron injection layer 135 may be a KI:Yb co-deposition layer, a RbI:Yb co-deposition layer, and the like.

When the electron injection layer 135 further includes an organic material, the alkali metal, the alkaline earth metal, the rare earth metal, the alkali metal-containing compound, the alkaline earth metal-containing compound, the rare earth metal-containing compound, the alkali metal complex, the alkaline earth metal complex, the rare earth metal complex, or any combination thereof may be homogeneously or non-homogeneously dispersed in a matrix including the organic material.

The thickness of the electron injection layer 135 may be in a range of about 1 Å to about 100 Å, and in some embodiments, about 3 Å to about 90 Å. When the thickness of the electron injection layer 135 is within any of these ranges, excellent electron injection characteristics may be obtained without a substantial increase in driving voltage.

Second Electrode 150

The second electrode 150 may be on the interlayer 130. In an embodiment, the second electrode 150 may be a cathode that is an electron injection electrode. In this embodiment, a material for forming the second electrode 150 may be a material having a low work function, for example, a metal, an alloy, an electrically conductive compound, or any combination thereof.

The second electrode 150 may include lithium (Li), silver (Ag), magnesium (Mg), aluminum (Al), aluminum-lithium (Al—Li), calcium (Ca), magnesium-indium (Mg—In), magnesium-silver (Mg—Ag), ytterbium (Yb), silver-ytterbium (Ag—Yb), an ITO, an IZO, or any combination thereof. The second electrode 150 may be a transmissive electrode, a semi-transmissive electrode, or a reflective electrode. The second electrode 150 may have a single-layered structure, or a multi-layered structure including two or more layers.

Capping Layer

A first capping layer may be located outside the first electrode 110, and/or a second capping layer may be located outside the second electrode 150. In some embodiments, the light-emitting device 10 may have a structure in which the first capping layer, the first electrode 110, the interlayer 130, and the second electrode 150 are sequentially stacked in this stated order, a structure in which the first electrode 110, the interlayer 130, the second electrode 150, and the second capping layer are sequentially stacked in this stated order, or a structure in which the first capping layer, the first electrode 110, the interlayer 130, the second electrode 150, and the second capping layer are sequentially stacked in this stated order.

In the light-emitting device 10, light emitted from the emission layer 133 in the interlayer 130 may pass through the first electrode 110 (which may be a semi-transmissive electrode or a transmissive electrode) and through the first capping layer to the outside. In the light-emitting device 10, light emitted from the emission layer 133 in the interlayer 130 may pass through the second electrode 150 (which may be a semi-transmissive electrode or a transmissive electrode) and through the second capping layer to the outside.

The first capping layer and the second capping layer may improve the external luminescence efficiency based on the principle of constructive interference. Accordingly, the optical extraction efficiency of the light-emitting device 10 may be increased, thus improving the luminescence efficiency of the light-emitting device 10. The first capping layer and the second capping layer may each include a material having a refractive index of about 1.6 or higher (at 589 nm). The first capping layer and the second capping layer may each independently be a capping layer including an organic material, an inorganic capping layer including an inorganic material, or a composite capping layer including an organic material and an inorganic material.

At least one of the first capping layer and the second capping layer may each independently include carbocyclic compounds, heterocyclic compounds, amine group-containing compounds, porphine derivatives, phthalocyanine derivatives, naphthalocyanine derivatives, alkali metal complexes, alkaline earth metal complexes, or any combination thereof. The carbocyclic compound, the heterocyclic compound, and the amine group-containing compound may optionally be substituted with a substituent of O, N, S, Se, Si, F, Cl, Br, I, or any combination thereof. In some embodiments, at least one of the first capping layer and the second capping layer may each independently include an amine group-containing compound.

In some embodiments, at least one of the first capping layer and the second capping layer may each independently include the compound represented by Formula 201, the compound represented by Formula 202, or any combination thereof. In one or more embodiments, at least one of the first capping layer and the second capping layer may each independently include one of Compounds HT28 to HT33, one of Compounds CP1 to CP6, N4,N4'-di(naphthalen-2-yl)-N4,N4'-diphenyl-[1,1'-biphenyl]-4,4'-diamine (β-NPB), or any combination thereof:

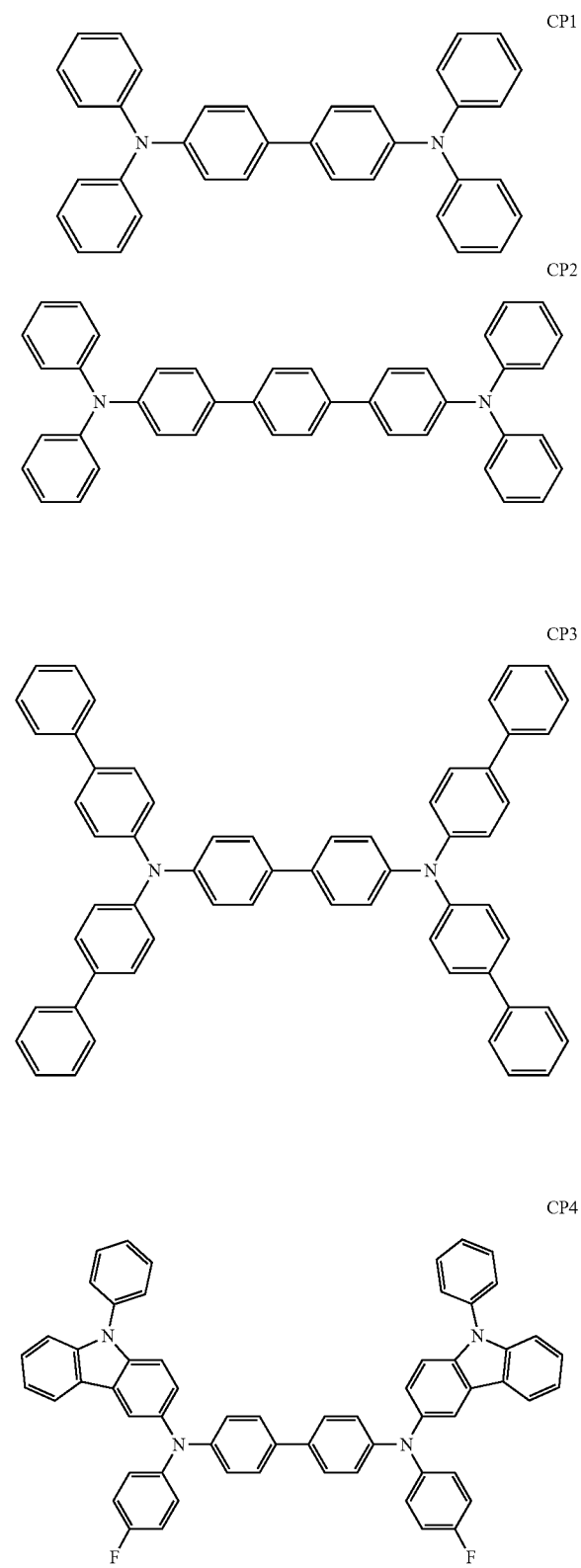

-continued

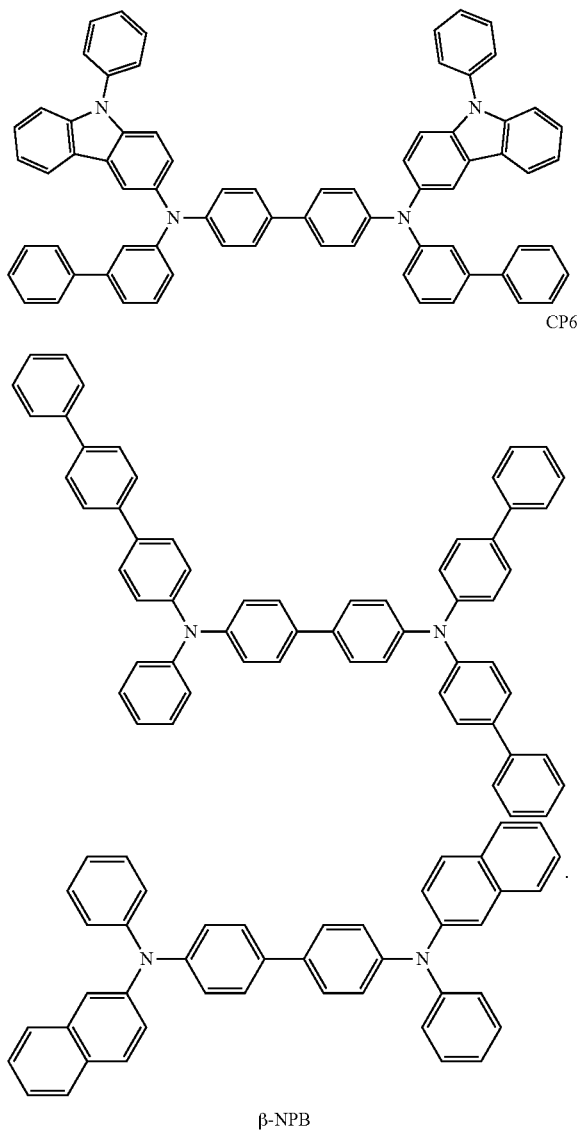

β-NPB

Figure 2:
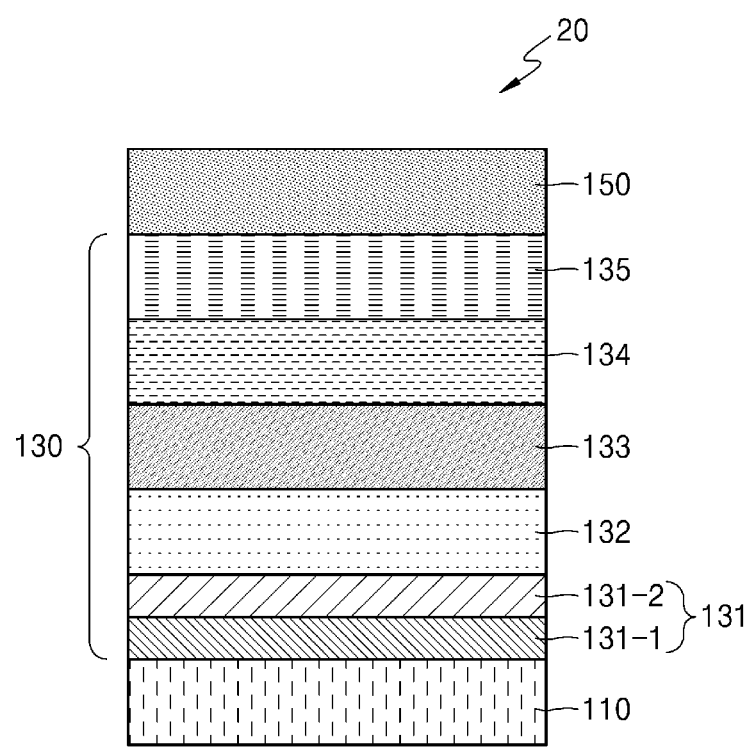
FIG. 2 is a schematic cross-sectional view of another embodiment illustrating a light-emitting device constructed according to the principles of the invention.
Figure 3:
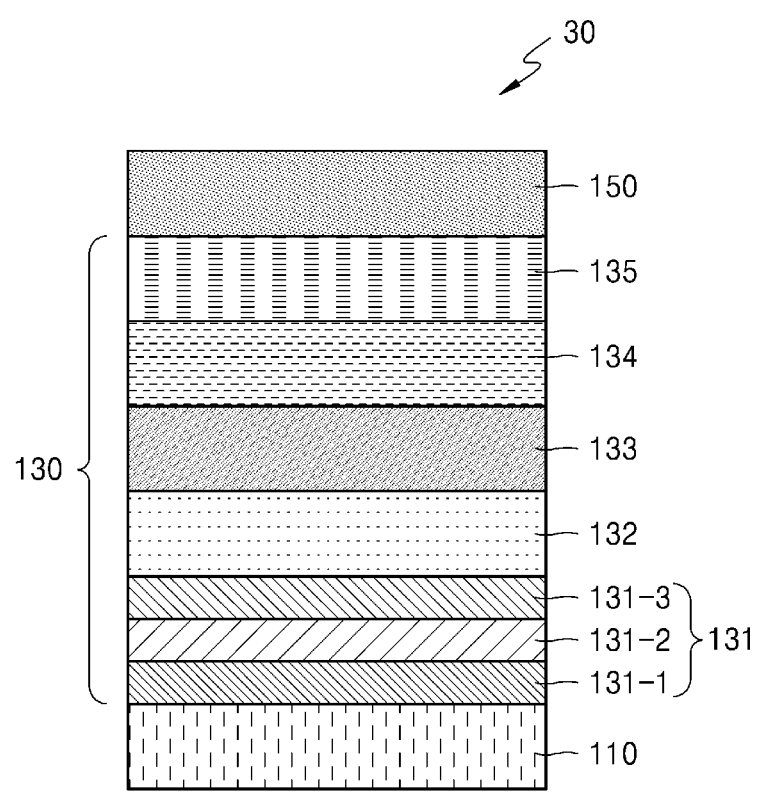
FIG. 3 is a schematic cross-sectional view of a further embodiment illustrating a light-emitting device constructed according to the principles of the invention.

Descriptions of FIGS. 2 and 3

FIG. 2 is a schematic cross-sectional view of another embodiment illustrating a light-emitting device constructed according to the principles of the invention.

The light-emitting device 20 may include the hole injection layer 131, and the hole injection layer 131 may include a first hole injection layer 131-1 and a second hole injection layer 131-2 sequentially stacked on the first electrode 110. In an embodiment, the first hole injection layer 131-1 may consist of the inorganic material, and the second hole injection layer 131-2 may include the inorganic material and a hole transporting material.

In one or more embodiments, the first hole injection layer 131-1 may include the inorganic material and a hole transporting material, and the second hole injection layer 131-2 may consist of the inorganic material. Descriptions of the inorganic material and the hole transporting material included in the first hole injection layer 131-1 and the second hole injection layer 131-2 may be understood by referring to the descriptions of the inorganic material and the hole transporting material provided herein.

FIG. 3 is a schematic cross-sectional view of a further embodiment illustrating a light-emitting device constructed according to the principles of the invention.

The light-emitting device 30 may include the hole injection layer 131, and the hole injection layer 131 may include the first hole injection layer 131-1, the second hole injection layer 131-2, and a third hole injection layer 131-3 sequentially stacked on the first electrode 110.

In an embodiment, the first hole injection layer 131-1 and the third hole injection layer 131-3 may each independently consist of the inorganic material, and the second hole injection layer 131-2 may include the inorganic material and a hole transporting material. In one or more embodiments, the first hole injection layer 131-1 and the third hole injection layer 131-3 may each independently include the inorganic material and a hole transporting material, and the second hole injection layer 131-2 may consist of the inorganic material. Descriptions of the inorganic material and the hole transporting material included in the first hole injection layer 131-1, the second hole injection layer 131-2, and the third hole injection layer 131-3 may each be understood by referring to the descriptions of the inorganic material and the hole transporting material provided herein.

Descriptions of other layers other than the hole injection layer in the light-emitting devices 20 and 30 shown in FIGS. 2 and 3 may respectively be understood by referring to the descriptions of the corresponding other layers provided herein.

Figure 4:
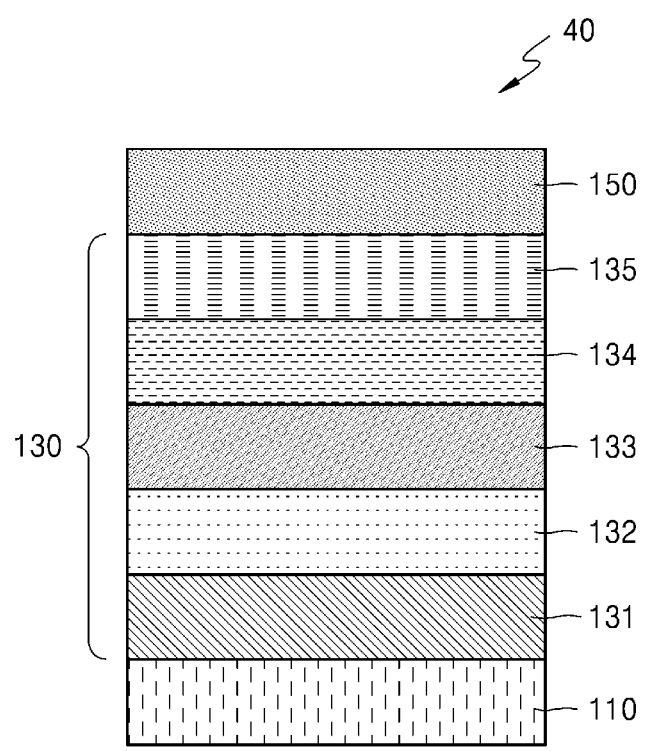
FIG. 4 is a schematic cross-sectional view of yet another embodiment illustrating a light-emitting device constructed according to the principles of the invention.

Description of FIG. 4

FIG. 4 is a schematic cross-sectional view of yet another embodiment illustrating a light-emitting device constructed according to the principles of the invention.

The light-emitting device 40 may include the hole injection layer 131, and the hole injection layer 131 may be a single layer in direct contact with the first electrode 110. The hole injection layer 131 may include the inorganic material. The inorganic material may be understood by referring to the description of the inorganic material provided herein.

The emission layer 133 in the light-emitting device 40 may include a host and a dopant, wherein the host may include an anthracene compound including a π electron-rich $C_3$-$C_{60}$ cyclic group, —N(Q$_1$)(Q$_2$), or a combination thereof, and the dopant may include the condensed-cyclic compound represented by Formula 2. The anthracene compound and the condensed-cyclic compound represented by Formula 2 may respectively be understood by referring to the descriptions of the anthracene compound and the condensed-cyclic compound provided herein. Descriptions of other layers than the hole injection layer in the light-emitting device 40 shown in FIG. 4 may respectively be understood by referring to the descriptions of the corresponding other layers provided herein.

In an embodiment, the hole injection layer 131 in the light-emitting device 40 may consist of the inorganic material. In this embodiment, the hole injection layer 131 may be a single layer consisting of a single material. In one or more embodiments, the hole injection layer 131 in the light-emitting device 40 may further include the hole transporting material. In this embodiment, the hole injection layer 131 may be a single layer including at least two different materials.

As the light-emitting device 40 according to one or more embodiments includes at least one inorganic material selected from the group consisting of a post-transition metal, a metalloid, a compound including at least two post-transition metal elements, a compound including at least two metalloid elements, and a compound including a post-transition metal element and a metalloid element in the hole injection layer 131, the light-emitting device 40 may have excellent characteristics such as a low driving voltage, a high current density at the same voltage, and a color purity and luminescence efficiency equal to or higher than those of a device in the related art.

In addition, the light-emitting device 40 may use a boron-based condensed-cyclic compound having a narrow FWHM in the emission layer 133 as a dopant, and thus the light-emitting device 40 may have an optical resonance efficiency, as compared with a light-emitting device using a non-boron-based compound as a dopant. Accordingly, the light-emitting device 40 may have a structure in which the hole injection layer 131 and the emission layer 133 each include the inorganic material and a light-emitting dopant, thus improving luminescence efficiency.

Electronic Apparatus

The light-emitting device 10, 20, 30, or 40 may be included in various electronic apparatuses. In some embodiments, an electronic apparatus including the light-emitting device 10, 20, 30, or 40 may be an emission apparatus or an authentication apparatus.

The electronic apparatus (e.g., an emission apparatus) may further include, in addition to the light-emitting device 10, 20, 30, or 40, i) a color filter, ii) a color-conversion layer, or iii) a color filter and a color-conversion layer. The color filter and/or the color-conversion layer may be disposed on at least one traveling direction of light emitted from the light-emitting device 10, 20, 30, or 40. For example, light emitted from the light-emitting device 10, 20, 30, or 40 may be blue light or white light. The light-emitting device 10, 20, 30, or 40 may be understood by referring to the descriptions provided herein. In some embodiments, the color-conversion layer may include quantum dots. The quantum dot may be, for example, the quantum dot described herein.

The electronic apparatus may include a first substrate. The first substrate may include a plurality of sub-pixels, the color filter may include a plurality of color filter areas respectively corresponding to the plurality of sub-pixels, and the color-conversion layer may include a plurality of color-conversion areas respectively corresponding to the plurality of sub-pixels.

A pixel-defining film may be located between the plurality of sub-pixels to define each sub-pixel. The color filter may further include a plurality of color filter areas and light-blocking patterns between the plurality of color filter areas, and the color-conversion layer may further include a plurality of color-conversion areas and light-blocking patterns between the plurality of color-conversion areas.

The plurality of color filter areas (or a plurality of color-conversion areas) may include: a first area emitting first color light; a second area emitting second color light; and/or a third area emitting third color light, and the first color light, the second color light, and/or the third color light may have different maximum emission wavelengths. In some embodiments, the first color light may be red light, the second color light may be green light, and the third color light may be blue light. In some embodiments, the plurality of color filter areas (or the plurality of color-conversion areas) may each include quantum dots. In some embodiments, the first area may include red quantum dots, the second area may include green quantum dots, and the third area may not include a quantum dot. The quantum dot may be understood by referring to the description of the quantum dot provided herein. The first area, the second area, and/or the third area may each further include an emitter.

In some embodiments, the light-emitting device 10, 20, 30, or 40 may emit first light, the first area may absorb the first light to emit 1-1 color light, the second area may absorb the first light to emit 2-1 color light, and the third area may absorb the first light to emit 3-1 color light. In this embodiment, the 1-1 color light, the 2-1 color light, and the 3-1 color light may each have a different maximum emission wavelength. In some embodiments, the first light may be blue light, the 1-1 color light may be red light, the 2-1 color light may be green light, and the 3-1 light may be blue light.

The electronic apparatus may further include a thin-film transistor, in addition to the light-emitting device 10, 20, 30, or 40. The thin-film transistor may include a source electrode, a drain electrode, and an active layer, wherein one of the source electrode and the drain electrode may be electrically connected to one of the first electrode and the second electrode of the light-emitting device 10, 20, 30, or 40.

The thin-film transistor may further include a gate electrode, a gate insulating film, or the like. The active layer may include a crystalline silicon, an amorphous silicon, an organic semiconductor, and an oxide semiconductor.

The electronic apparatus may further include an encapsulation unit for sealing the light-emitting device 10, 20, 30, or 40. The encapsulation unit may be located between the color filter and/or the color-conversion layer and the light-emitting device 10, 20, 30, or 40. The encapsulation unit may allow light to pass to the outside from the light-emitting device 10, 20, 30, or 40 and prevent the air and moisture to permeate to the light-emitting device 10, 20, 30, or 40 at the same time. The encapsulation unit may be a sealing substrate including transparent glass or a plastic substrate. The encapsulation unit may be a thin-film encapsulating layer including at least one of an organic layer and/or an inorganic layer. When the encapsulation unit a thin film encapsulating layer, the electronic apparatus may be flexible.

In addition to the color filter and/or the color-conversion layer, various functional layers may be disposed on the encapsulation unit depending on the use of an electronic apparatus. Examples of the functional layer may include a touch screen layer, a polarization layer, or the like. The touch screen layer may be a resistive touch screen layer, a capacitive touch screen layer, or an infrared beam touch screen layer. The authentication apparatus may be, for example, a biometric authentication apparatus that identifies an individual according to biometric information (e.g., a fingertip, a pupil, or the like).

The authentication apparatus may further include a biometric information collecting unit, in addition to the light-emitting device 10, 20, 30, or 40 described above.

The electronic apparatus may take the form of or be applied to various displays, an optical source, lighting, a personal computer (e.g., a mobile personal computer), a cellphone, a digital camera, an electronic note, an electronic dictionary, an electronic game console, a medical device (e.g., an electronic thermometer, a blood pressure meter, a glucometer, a pulse measuring device, a pulse wave measuring device, an electrocardiograph recorder, an ultrasonic diagnosis device, or an endoscope display device), a fish finder, various measurement devices, gauges (e.g., gauges of an automobile, an airplane, or a ship), and a projector.

Figure 5:
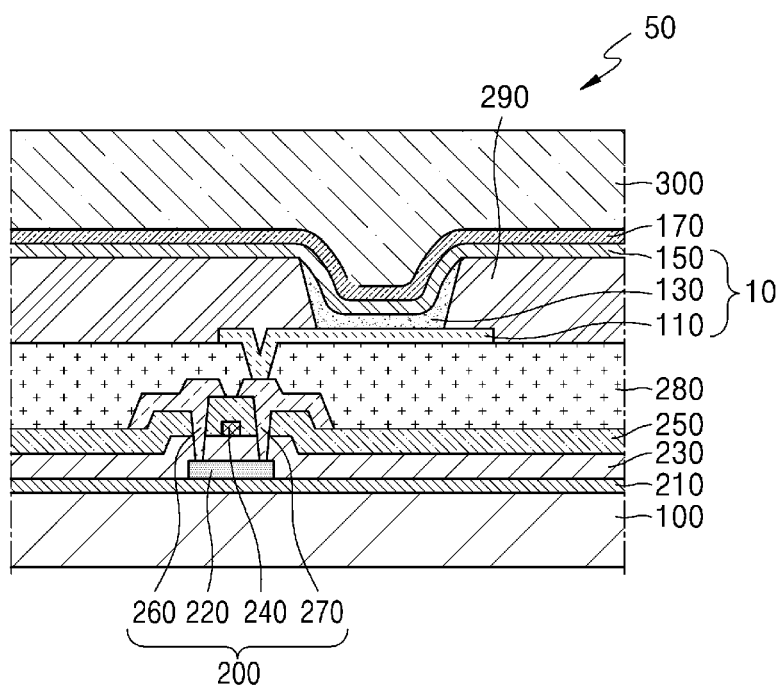
FIG. 5 is a schematic cross-sectional view of an embodiment illustrating an electronic apparatus including a light-emitting device constructed according to the principles of the invention.
Figure 6:
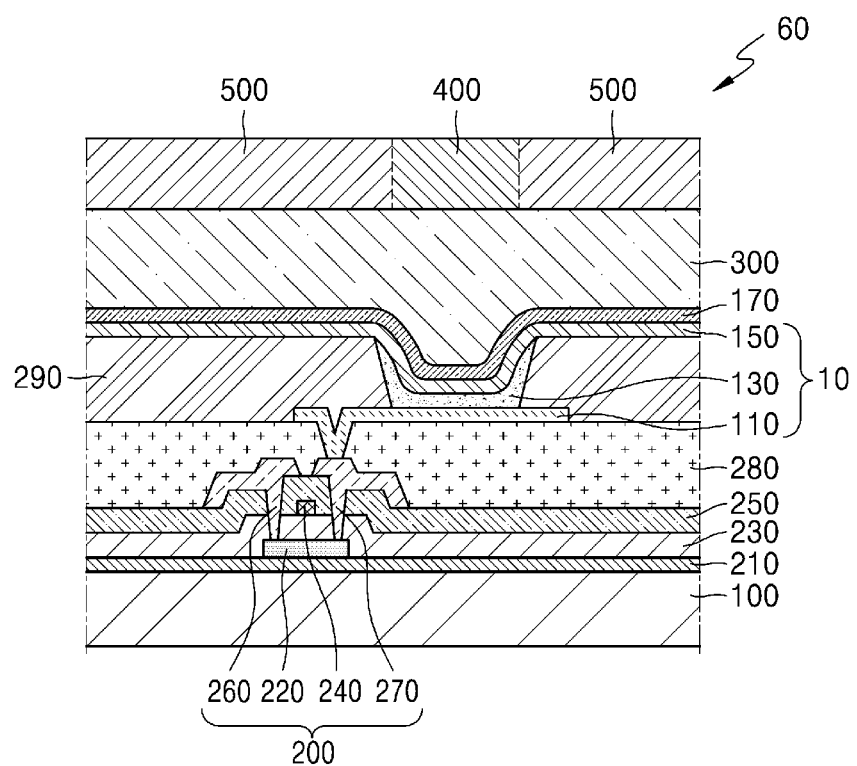
FIG. 6 is a schematic cross-sectional view of another embodiment illustrating an electronic apparatus including a light-emitting device constructed according to the principles of the invention.

Descriptions of FIGS. 5 and 6

FIG. 5 is a schematic cross-sectional view of an embodiment illustrating an electronic apparatus including a light-emitting device constructed according to the principles of the invention.

The electronic apparatus 50 in FIG. 5 may include a substrate 100, a thin-film transistor 200, a light-emitting device 10, and an encapsulation unit 300 sealing the light-emitting device 10.

The substrate 100 may be a flexible substrate, a glass substrate, or a metal substrate. A buffer layer 210 may be on the substrate 100. The buffer layer 210 may prevent penetration of impurities through the substrate 100 and provide a substantially flat surface on the substrate 100.

The thin-film transistor 200 may be on the buffer layer 210. The thin-film transistor 200 may include an active layer 220, a gate electrode 240, a source electrode 260, and a drain electrode 270.

The active layer 220 may include an inorganic semiconductor such as silicon or polysilicon, an organic semiconductor, or an oxide semiconductor and include a source area, a drain area, and a channel area.

A gate insulating film 230 for insulating the active layer 220 and the gate electrode 240 may be on the active layer 220, and the gate electrode 240 may be on the gate insulating film 230. An interlayer insulating film 250 may be on the gate electrode 240. The interlayer insulating film 250 may be between the gate electrode 240 and the source electrode 260 and between the gate electrode 240 and the drain electrode 270 to provide insulation therebetween.

The source electrode 260 and the drain electrode 270 may be on the interlayer insulating film 250. The interlayer insulating film 250 and the gate insulating film 230 may be formed to expose the source area and the drain area of the active layer 220, and the source electrode 260 and the drain electrode 270 may be adjacent to the exposed source area and the exposed drain area of the active layer 220.

Such a thin-film transistor 200 may be electrically connected to a light-emitting device 10 to drive the light-emitting device 10 and may be protected by a passivation layer 280. The passivation layer 280 may include an inorganic insulating film, an organic insulating film, or a combination thereof. The light-emitting device 10 may be on the passivation layer 280. The light-emitting device 10 may include a first electrode 110, an interlayer 130, and a second electrode 150.

The first electrode 110 may be on the passivation layer 280. The passivation layer 280 may not fully cover the drain electrode 270 and expose a specific area of the drain electrode 270, and the first electrode 110 may be disposed to connect to the exposed area of the drain electrode 270. A pixel-defining film 290 may be on the first electrode 110. The pixel-defining film 290 may expose a specific area of the first electrode 110, and the interlayer 130 may be formed in the exposed area of the first electrode 110. The pixel-defining film 290 may be a polyimide or a polyacryl organic film. Some or more layers of the interlayer 130 may extend to the upper portion of the pixel-defining film 290 and may be disposed in the form of a common layer.

The second electrode 150 may be on the interlayer 130, and a capping layer 170 may be additionally formed on the second electrode 150. The capping layer 170 may be formed to cover the second electrode 150.

The encapsulation unit 300 may be on the capping layer 170. The encapsulation unit 300 may be on the light-emitting device to protect a light-emitting device from moisture or oxygen. The encapsulation unit 300 may include: an inorganic film including a silicon nitride ($SiN_x$), a silicon oxide ($SiO_x$), an indium tin oxide, an indium zinc oxide, or any combination thereof; an organic film including PET, a polyethylene naphthalate, a polycarbonate, a polyimide, a polyethylene sulfonate, a polyoxymethylene, a polyarylate, a hexamethyl disiloxane, an acrylic resin (e.g., a polymethyl methacrylate, a polyacrylic acid, and the like), an epoxy resin (e.g., an aliphatic glycidyl ether (AGE) and the like), or any combination thereof; or a combination of the inorganic film and the organic film.

FIG. 6 is a schematic cross-sectional view of another embodiment illustrating an electronic apparatus including a light-emitting device constructed according to the principles of the invention.

The electronic apparatus 60 shown in FIG. 6 may be substantially identical to the electronic apparatus 50 shown in FIG. 5, except that a light-shielding pattern 500 and a functional area in the form of a functional layer 400 are additionally located on the encapsulation unit 300. The functional layer 400 may be i) a color filter area, ii) a color-conversion area, or iii) a combination of a color filter area and a color-conversion area. In some embodiments, the light-emitting device 10 shown in FIG. 6 included in the electronic apparatus 60 may be a tandem light-emitting device.

Manufacturing Method

The layers constituting the hole transport region, the emission layer 133, and the layers constituting the electron transport region may be formed in a specific region by using one or more suitable methods such as vacuum deposition, spin coating, casting, Langmuir-Blodgett (LB) deposition, ink-jet printing, laser printing, and laser-induced thermal imaging.

When layers constituting the hole transport region, an emission layer 133, and layers constituting the electron transport region are each independently formed by vacuum-deposition, the vacuum-deposition may be performed at a deposition temperature in a range of about 100° C. to about 500° C., at a vacuum degree in a range of about $10^{-8}$ torr to about $10^{-3}$ torr, and at a deposition rate in a range of about 0.01 Angstroms per second (Å/sec) to about 100 Å/sec, depending on the material to be included in each layer and the structure of each layer to be formed.

General Definitions of Terms

The term "interlayer" as used herein refers to a single layer and/or a plurality of all layers located between a first electrode and a second electrode in a light-emitting device.

The expression that an "(interlayer and/or a capping layer) includes at least one heterocyclic compound" as used herein may be construed as meaning that the "(interlayer and/or the capping layer) may include one heterocyclic compound of Formula 1 or two different heterocyclic compounds of Formula 1".

The term "quantum dot" as used herein refers to a crystal of a semiconductor compound and may include any suitable material capable of emitting emission wavelengths of various lengths according to the size of the crystal.

As used herein, the term "atom" may mean an element or its corresponding radical bonded to one or more other atoms.

The terms "hydrogen" and "deuterium" refer to their respective atoms and corresponding radicals with the deuterium radical abbreviated "-D", and the terms "—F, —Cl, —Br, and —I" are radicals of, respectively, fluorine, chlorine, bromine, and iodine.

As used herein, a substituent for a monovalent group, e.g., alkyl, may also be, independently, a substituent for a corresponding divalent group, e.g., alkylene.

As used herein, the term "metalloid" may refer to an element or a compound, and be referred to as a "semiconductor".

As used herein, the term "metal" may refer to an element or a compound.

The term "$C_3$-$C_{60}$ carbocyclic group" as used herein refers to a cyclic group consisting of carbon atoms only and having 3 to 60 carbon atoms. The term "$C_1$-$C_{60}$ heterocyclic group" as used herein refers to a cyclic group having 1 to 60 carbon atoms in addition to a heteroatom other than carbon atoms. The $C_3$-$C_{60}$ carbocyclic group and the $C_1$-$C_{60}$ heterocyclic group may each be a monocyclic group consisting of one ring or a polycyclic group in which at least two rings are fused. For example, the number of ring-forming atoms in the $C_1$-$C_{60}$ heterocyclic group may be in a range of 3 to 61.

The term "cyclic group" as used herein may include the $C_3$-$C_{60}$ carbocyclic group and the $C_1$-$C_{60}$ heterocyclic group.

The term "π electron-rich $C_3$-$C_{60}$ cyclic group" refers to a cyclic group having 3 to 60 carbon atoms and not including *—N=*' as a ring-forming moiety. The term "π electron-deficient nitrogen-containing $C_1$-$C_{60}$ cyclic group" as used herein refers to a heterocyclic group having 1 to 60 carbon atoms and *—N=*' as a ring-forming moiety.

In some embodiments, the $C_3$-$C_{60}$ carbocyclic group may be i) a T1 group or ii) a group in which at least two T1 groups are fused, for example, a cyclopentadiene group, an adamantane group, a norbornane group, a benzene group, a pentalene group, a naphthalene group, an azulene group, an indacene group, an acenaphthylene group, a phenalene group, a phenanthrene group, an anthracene group, a fluoranthene group, a triphenylene group, a pyrene group, a chrysene group, a perylene group, a pentaphene group, a heptalene group, a naphthacene group, a picene group, a hexacene group, a pentacene group, a rubicene group, a coronene group, an ovalene group, an indene group, a fluorene group, a spiro-bifluorene group, a benzofluorene group, an indenophenanthrene group, or an indenoanthracene group.

The $C_1$-$C_{60}$ heterocyclic group may be i) a T2 group, ii) a group in which at least two T2 groups are fused, or iii) a group in which at least one T2 group is fused with at least one T1 group, for example, a pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonapthothiophene group, a benzonaphthosilole group, a benzofurodibenzofuran group, a benzofurodibenzothiophene group, a benzothienodibenzothiophene group, a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, an azadibenzofuran group, and the like.

The π electron-rich $C_3$-$C_{60}$ cyclic group may be i) a T1 group, ii) a fused group in which at least two T1 groups are fused, iii) a T3 group, iv) a fused group in which at least two T3 groups are fused, or v) a fused group in which at least one T3 group is fused with at least one T1 group, for example, a $C_3$-$C_{60}$ carbocyclic group, a pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonapthothiophene group, a benzonaphthosilole group, a benzofurodibenzofuran group, a benzofurodibenzothiophene group, a benzothienodibenzothiophene group, and the like.

The π electron-deficient nitrogen-containing $C_1$-$C_{60}$ cyclic group may be i) a T4 group, ii) a group in which at least two T4 groups are fused, iii) a group in which at least one T4 group is fused with at least one T1 group, iv) a group in which at least one T4 group is fused with at least one T3 group, or v) a group in which at least one T4 group, at least one T1 group, and at least one T3 group are fused, for example, a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, an azadibenzofuran group, and the like.

The T1 group may be a cyclopropane group, a cyclobutane group, a cyclopentane group, a cyclohexane group, a cycloheptane group, a cyclooctane group, a cyclobutene group, a cyclopentene group, a cyclopentadiene group, a cyclohexene group, a cyclohexadiene group, a cycloheptene group, an adamantane group, a norbornane (or bicyclo[2.2.1]heptane) group, a norbornene group, a bicyclo[1.1.1]pentane group, a bicyclo[2.1.1]hexane group, a bicyclo[2.2.2]octane group, or a benzene group, the T2 group may be a furan group, a thiophene group, a 1H-pyrrole group, a silole group, a borole group, a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, or a tetrazine group, the T3 group may be a furan group, a thiophene group, a 1H-pyrrole group, a silole group, or a borole group, and the T4 group may be a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, or a tetrazine group.

The term "cyclic group", "$C_3$-$C_{60}$ carbocyclic group", "$C_1$-$C_{60}$ heterocyclic group", "π electron-rich $C_3$-$C_{60}$ cyclic group", or "π electron-deficient nitrogen-containing $C_1$-$C_{60}$ cyclic group" as used herein may be a group fused with any suitable cyclic group, a monovalent group, or a polyvalent group (e.g., a divalent group, a trivalent group, a quadvalent group, or the like), depending on the structure of the formula to which the term is applied. For example, a "benzene group" may be a benzo group, a phenyl group, a phenylene group, or the like, and this may be understood by one of ordinary skill in the art, depending on the structure of the formula including the "benzene group".

Examples of the monovalent $C_3$-$C_{60}$ carbocyclic group and the monovalent $C_1$-$C_{60}$ heterocyclic group may include a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic fused polycyclic group, and a monovalent non-aromatic fused heteropolycyclic group. Examples of the divalent $C_3$-$C_{60}$ carbocyclic group and the monovalent $C_1$-$C_{60}$ heterocyclic group may include a $C_3$-$C_{10}$ cycloalkylene group, a $C_1$-$C_{10}$ heterocycloalkylene group, a $C_3$-$C_{10}$ cycloalkenylene group, a $C_1$-$C_{10}$ heterocycloalkenylene group, a $C_6$-$C_{60}$ arylene group, a $C_1$-$C_{60}$ heteroarylene group, a divalent non-aromatic fused polycyclic group, and a substituted or unsubstituted divalent non-aromatic fused heteropolycyclic group.

The term "$C_1$-$C_{60}$ alkyl group" as used herein refers to a linear or branched aliphatic hydrocarbon monovalent group having 1 to 60 carbon atoms, and examples thereof include a methyl group, an ethyl group, an n-propyl group, an iso-propyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an iso-hexyl group, a sec-hexyl group, a tert-hexyl group, an n-heptyl group, an iso-heptyl group, a sec-heptyl group, a tert-heptyl group, an n-octyl group, an iso-octyl group, a sec-octyl group, a tert-octyl group, an n-nonyl group, an iso-nonyl group, a sec-nonyl group, a tert-nonyl group, an n-decyl group, an iso-decyl group, a sec-decyl group, and a tert-decyl group. The term "$C_1$-$C_{60}$ alkylene group" as used herein refers to a divalent group having a structure corresponding to the $C_1$-$C_{60}$ alkyl group.

The term "$C_2$-$C_{60}$ alkenyl group" as used herein refers to a hydrocarbon group having at least one carbon-carbon double bond in the middle or at the terminus of the $C_2$-$C_{60}$ alkyl group. Examples thereof include an ethenyl group, a propenyl group, and a butenyl group. The term "$C_2$-$C_{60}$ alkenylene group" as used herein refers to a divalent group having a structure corresponding to the $C_2$-$C_{60}$ alkenyl group.

The term "$C_2$-$C_{60}$ alkynyl group" as used herein refers to a monovalent hydrocarbon group having at least one carbon-carbon triple bond in the middle or at the terminus of the $C_2$-$C_{60}$ alkyl group. Examples thereof include an ethynyl group and a propynyl group. The term "$C_2$-$C_{60}$ alkynylene group" as used herein refers to a divalent group having a structure corresponding to the $C_2$-$C_{60}$ alkynyl group.

The term "$C_1$-$C_{60}$ alkoxy group" as used herein refers to a monovalent group represented by —$OA_{101}$ (wherein $A_{101}$ is a $C_1$-$C_{60}$ alkyl group). Examples thereof include a methoxy group, an ethoxy group, and an isopropyloxy group.

The term "$C_3$-$C_{10}$ cycloalkyl group" as used herein refers to a monovalent saturated hydrocarbon monocyclic group including 3 to 10 carbon atoms. Examples of the $C_3$-$C_{10}$ cycloalkyl group as used herein include a cyclopropyl group, a cyclobutyl group, a cyclopentyl group, a cyclohexyl group, a cycloheptyl group, a cyclooctyl group, an adamantanyl group, a norbornanyl (bicyclo[2.2.1]heptyl) group, a bicyclo[1.1.1]pentyl group, a bicyclo[2.1.1]hexyl group, or a bicyclo[2.2.2]octyl group. The term "$C_3$-$C_{10}$ cycloalkylene group" as used herein refers to a divalent group having a structure corresponding to the $C_3$-$C_{10}$ cycloalkyl group.

The term "$C_1$-$C_{10}$ heterocycloalkyl group" as used herein refers to a monovalent cyclic group including at least one heteroatom other than carbon atoms as a ring-forming atom and having 1 to 10 carbon atoms. Examples thereof include a 1,2,3,4-oxatriazolidinyl group, a tetrahydrofuranyl group, and a tetrahydrothiophenyl group. The term "$C_1$-$C_{10}$ heterocycloalkylene group" as used herein refers to a divalent group having a structure corresponding to the $C_1$-$C_{10}$ heterocycloalkyl group.

The term "$C_3$-$C_{10}$ cycloalkenyl group" as used herein refers to a monovalent cyclic group that has 3 to 10 carbon atoms and at least one carbon-carbon double bond in its ring, and is not aromatic. Examples thereof include a cyclopentenyl group, a cyclohexenyl group, and a cycloheptenyl group. The term "$C_3$-$C_{10}$ cycloalkenylene group" as used herein refers to a divalent group having a structure corresponding to the $C_3$-$C_{10}$ cycloalkenyl group.

The term "$C_1$-$C_{10}$ heterocycloalkenyl group" as used herein refers to a monovalent cyclic group including at least one heteroatom other than carbon atoms as a ring-forming atom, 1 to 10 carbon atoms, and at least one double bond in its ring. Examples of the $C_1$-$C_{10}$ heterocycloalkenyl group include a 4,5-dihydro-1,2,3,4-oxatriazolyl group, a 2,3-dihydrofuranyl group, and a 2,3-dihydrothiophenyl group. The term "$C_1$-$C_{10}$ heterocycloalkylene group" as used herein refers to a divalent group having a structure corresponding to the $C_1$-$C_{10}$ heterocycloalkyl group.

The term "$C_6$-$C_{60}$ aryl group" as used herein refers to a monovalent group having a carbocyclic aromatic system having 6 to 60 carbon atoms. The term "$C_6$-$C_{60}$ arylene group" as used herein refers to a divalent group having a carbocyclic aromatic system having 6 to 60 carbon atoms. Examples of the $C_6$-$C_{60}$ aryl group include a phenyl group, a pentalenyl group, a naphthyl group, an azulenyl group, an indacenyl group, an acenaphthyl group, a phenalenyl group, a phenanthrenyl group, an anthracenyl group, a fluoranthenyl group, a triphenylenyl group, a pyrenyl group, a chrysenyl group, a perylenyl group, a pentaphenyl group, a heptalenyl group, a naphthacenyl group, a picenyl group, a hexacenyl group, a pentacenyl group, a rubicenyl group, a coronenyl group, and an ovalenyl group. When the $C_6$-$C_{60}$ aryl group and the $C_6$-$C_{60}$ arylene group each independently include two or more rings, the respective rings may be fused.

The term "$C_1$-$C_{60}$ heteroaryl group" as used herein refers to a monovalent group having a heterocyclic aromatic system further including at least one heteroatom other than carbon atoms as a ring-forming atom and 1 to 60 carbon atoms. The term "$C_1$-$C_{60}$ heteroarylene group" as used herein refers to a divalent group having a heterocyclic aromatic system further including at least one heteroatom other than carbon atoms as a ring-forming atom and 1 to 60 carbon atoms. Examples of the $C_1$-$C_{60}$ heteroaryl group include a pyridinyl group, a pyrimidinyl group, a pyrazinyl group, a pyridazinyl group, a triazinyl group, a quinolinyl group, a benzoquinolinyl group, an isoquinolinyl group, a benzoisoquinolinyl group, a quinoxalinyl group, a benzoquinoxalinyl group, a quinazolinyl group, a benzoquinazolinyl group, a cinnolinyl group, a phenanthrolinyl group, a phthalazinyl group, and a naphthyridinyl group. When the $C_1$-$C_{60}$ heteroaryl group and the $C_1$-$C_{60}$ heteroarylene group each independently include two or more rings, the respective rings may be fused.

The term "monovalent non-aromatic fused polycyclic group" as used herein refers to a monovalent group that has two or more rings fused and only carbon atoms (e.g., 8 to 60 carbon atoms) as ring-forming atoms, wherein the molecular structure when considered as a whole is non-aromatic. Examples of the monovalent non-aromatic fused polycyclic group include an indenyl group, a fluorenyl group, a spirobifluorenyl group, a benzofluorenyl group, an indenophenanthrenyl group, and an indenoanthracenyl group. The term "divalent non-aromatic fused polycyclic group" as used herein refers to a divalent group having substantially the same structure as the monovalent non-aromatic fused polycyclic group.

The term "monovalent non-aromatic fused heteropolycyclic group" as used herein refers to a monovalent group that has two or more fused rings and at least one heteroatom other than carbon atoms (e.g., 1 to 60 carbon atoms), as a ring-forming atom, wherein the molecular structure when considered as a whole is non-aromatic. Examples of the monovalent non-aromatic fused heteropolycyclic group include a 9,10-dihydroacridinyl group and a 9H-xanthenyl group. The term "divalent non-aromatic fused heteropolycyclic group" as used herein refers to a divalent group having substantially the same structure as the monovalent non-aromatic fused heteropolycyclic group.

The term "$C_6$-$C_{60}$ aryloxy group" as used herein is represented by —$OA_{102}$ (wherein $A_{102}$ is the $C_6$-$C_{60}$ aryl group). The term "$C_6$-$C_{60}$ arylthio group" as used herein is represented by —$SA_{103}$ (wherein $A_{103}$ is the $C_6$-$C_{60}$ aryl group).

The term "$R_{10a}$" as used herein may be:
deuterium (-D), —F, —Cl, —Br, —I, a hydroxyl group, a cyano group, or a nitro group;
a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$), —P(=O)($Q_{11}$)($Q_{12}$), or any combination thereof;
a $C_3$-$C_{60}$ carbocyclic group, a $C_1$-$C_{60}$ heterocyclic group, a $C_6$-$C_{60}$ aryloxy group, or a $C_6$-$C_{60}$ arylthio group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{21}$)($Q_{22}$)($Q_{23}$), —N($Q_{21}$)($Q_{22}$), —B($Q_{21}$)($Q_{22}$), —C(=O)($Q_{21}$), —S(=O)$_2$($Q_{21}$), —P(=O)($Q_{21}$)($Q_{22}$), or any combination thereof or
—Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), or —P(=O)($Q_{31}$)($Q_{32}$).

$Q_1$ to $Q_3$, $Q_{11}$ to $Q_{13}$, $Q_{21}$ to $Q_{23}$, and $Q_{31}$ to $Q_{33}$ may each independently be hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof.

The term "heteroatom" as used herein refers to any atom other than a carbon atom. Examples of the heteroatom may include O, S, N, P, Si, B, Ge, Se, or any combination thereof.

As used herein, the term "Ph" represents a phenyl group, "Me" represents a methyl group, "Et" represents an ethyl group, "ter-Bu" or "Bu$^t$" represents a tert-butyl group, and "OMe" represents a methoxy group.

The term "biphenyl group" as used herein refers to a phenyl group substituted with a phenyl group. The "biphenyl group" belongs to "a substituted phenyl group" having a "$C_6$-$C_{60}$ aryl group" as a substituent.

The term "terphenyl group" as used herein refers to a phenyl group substituted with a biphenyl group. The "terphenyl group" belongs to "a substituted phenyl group" having a "$C_6$-$C_{60}$ aryl group substituted with a $C_6$-$C_{60}$ aryl group" as a substituent.

The symbols * and *' as used herein, unless defined otherwise, refer to a binding site to an adjacent atom in a corresponding formula.

Hereinafter, a light-emitting device constructed according to the principles and one or more embodiments of the invention will be described in more detail with reference to Examples.

EXAMPLES

Example 1

As for a substrate and an anode, a 15 Ω/cm² ITO (100 Å)/Ag (1,000 Å)/ITO (100 Å) glass substrate manufactured by Corning Inc. of Corning, New York, was cut to a size of 50 millimeters (mm)×50 mm×0.7 mm, sonicated by using isopropyl alcohol and deionized water for 5 minutes, respectively, and cleaned by exposure to ultraviolet rays and ozone, respectively. Then, the glass substrate was mounted on a vacuum deposition device.

Compounds HT3 and $Bi_2Te_3$ were co-deposited at a weight ratio of 100:5 on the anode as a hole injection layer to a thickness of 50 Å to form the hole injection layer. HT3 was deposited on the hole injection layer to a thickness of 1,200 Å to form a hole transport layer.

Compound $Bi_2Te_3$ was deposited to a thickness of 5 Å on the hole transport layer to form an electron blocking layer.

Compounds BH8 and BD5 were co-deposited as a host and a dopant on the hole blocking layer to a thickness of 200 Å at a weight ratio of 100:1 to form an emission layer.

Compound ET28 was deposited on the emission layer to a thickness of 50 Å to form a buffer layer, and compounds ET1 and LiQ were co-deposited on the buffer layer at a weight ratio of 5:5 to a thickness of 310 Å to form an electron transport layer. Next, Yb was deposited at a thickness of 13 Å to form an electron injection layer.

Metals Ag and Mg (a content of Mg was 10 wt %) were co-deposited on the electron injection layer to a thickness of 85 Å to form a cathode, and compound HT28 (700 Å) was deposited on the cathode to form a capping layer, thereby completing the manufacture of a light-emitting device.

Example 2

A light-emitting device was manufactured in substantially the same manner as in Example 1, except that compound HT3 was not used, and $Bi_2Te_3$ was only deposited in formation of a hole injection layer.

Example 3

A light-emitting device was manufactured in substantially the same manner as in Example 1, except that a multi-layered structure of a hole injection layer was formed, the multi-layered structure including a first hole injection layer of a $Bi_2Te_3$ single layer having a thickness of 5 Å/a second hole injection layer of compounds HT3 and $Bi_2Te_3$ mixed layer having a thickness of 50 Å.

Example 4

A light-emitting device was manufactured in substantially the same manner as in Example 1, except that a multi-layered structure of a hole injection layer was formed, the multi-layered structure including a first hole injection layer of compounds HT3 and $Bi_2Te_3$ mixed layer having a thickness of 50 Å/a second hole injection layer of a $Bi_2Te_3$ single layer having a thickness of 5 Å.

Example 5

A light-emitting device was manufactured in substantially the same manner as in Example 1, except that a multi-layered structure of a hole injection layer was formed, the multi-layered structure including a first hole injection layer of $Bi_2Te_3$ single layer having a thickness of 5 Å/a second hole injection layer of compounds HT3 and $Bi_2Te_3$ mixed layer having a thickness of 50 Å/a third hole injection layer of a $Bi_2Te_3$ single layer having a thickness of 5 Å.

Example 6

A light-emitting device was manufactured in substantially the same manner as in Example 1, except that a multi-layered structure of a hole injection layer was formed, the multi-layered structure including a first hole injection layer of compounds HT3 and $Bi_2Te_3$ mixed layer having a thickness of 50 Å/a second hole injection layer of a $Bi_2Te_3$ single layer having a thickness of 5 Å/a third hole injection layer of compounds HT3 and $Bi_2Te_3$ mixed layer having a thickness of 50 Å.

Comparative Example 1

A light-emitting device was manufactured in substantially the same manner as in Example 1, except that compounds HT3 and F4-TCNQ were co-deposited at a weight ratio of 100:2 to form a hole injection layer, and compounds H8 and FD5 were respectively used as a host and a dopant to form an emission layer.

Comparative Example 2

A light-emitting device was manufactured in substantially the same manner as in Example 1, except that compounds H8 and FD5 were respectively used as a host and a dopant to form an emission layer.

Comparative Example 3

A light-emitting device was manufactured in substantially the same manner as in Example 1, except that compound HT3 was only deposited to form a hole injection layer (20 Å), compounds HT3 and $Bi_2Te_3$ were co-deposited at a weight ratio of 100:1 to form a hole transport layer, and compounds H8 and FD5 were respectively used as a host and a dopant to form an emission layer.

Comparative Example 4

A light-emitting device was manufactured in substantially the same manner as in Example 1, except that compound HT3 was only deposited to form a hole injection layer, and compounds HT3 and $Bi_2Te_3$ were co-deposited at a weight ratio of 100:1 to form a hole transport layer.

Evaluation Example 1

The luminescence efficiency (Cd/A) of the light-emitting devices of Examples 1 to 6 and Comparative Examples 1 to 4 were measured at a current density of 10 milliamperes per square centimeter ($mA/cm^2$). The results thereof are shown in Table 3 in percentage (%) relative to Comparative Example 1.

TABLE 3

| | Hole injection layer | | | | Emission layer | | Luminescence efficiency |
| | First hole injection layer | Second hole injection layer | Third hole injection layer | Hole transport layer | Host | Dopant | (%) |
|---|---|---|---|---|---|---|---|
| Example 1 | | $HT3:Bi_2Te_3$ | | HT3 | BH8 | BD5 | 126 |
| Example 2 | | $Bi_2Te_3$ | | HT3 | BH8 | BD5 | 103 |
| Example 3 | $Bi_2Te_3$ | $HT3:Bi_2Te_3$ | — | HT3 | BH8 | BD5 | 107 |
| Example 4 | $HT3:Bi_2Te_3$ | $Bi_2Te_3$ | — | HT3 | BH8 | BD5 | 115 |
| Example 5 | $Bi_2Te_3$ | $HT3:Bi_2Te_3$ | $Bi_2Te_3$ | HT3 | BH8 | BD5 | 109 |
| Example 6 | $HT3:Bi_2Te_3$ | $Bi_2Te_3$ | $HT3:Bi_2Te_3$ | HT3 | BH8 | BD5 | 106 |
| Comparative Example 1 | | HT3:F4-TCNQ | | HT3 | H8 | FD5 | 100 |
| Comparative Example 2 | | $HT3:Bi_2Te_3$ | | HT3 | H8 | FD5 | 101 |

TABLE 3-continued

| | Hole injection layer | | | | Emission layer | | Luminescence efficiency (%) |
|---|---|---|---|---|---|---|---|
| | First hole injection layer | Second hole injection layer | Third hole injection layer | Hole transport layer | Host | Dopant | |
| Comparative Example 3 | | HT3 | | HT3:Bi$_2$Te$_3$ | H8 | FD5 | 103 |
| Comparative Example 4 | | HT3 | | HT3:Bi$_2$Te$_3$ | BH8 | BD5 | 108 |

As shown in Table 3, the light-emitting devices of Examples 1 to 6 were found to exhibit significant and unexpectedly excellent luminescence efficiency, as compared with the light-emitting devices of Comparative Examples 1 to 3. In addition, the light-emitting device of Example 1 including the hole injection layer of a Bi$_2$Te$_3$-containing layer may have significantly and unexpectedly improved luminescence efficiency, as compared with the light-emitting device of Comparative Example 4 including the hole transport layer of a Bi$_2$Te$_3$-containing layer.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A light-emitting device comprising:
a first electrode;
a second electrode facing the first electrode; and
an interlayer between the first electrode and the second electrode and comprising an emission layer,
wherein the interlayer comprises a hole injection layer and a hole transport layer between the first electrode and the emission layer,
the hole injection layer directly contacts the first electrode,
the hole injection layer has a multi-layered structure of at least two different layers that are stacked on each other,
the hole injection layer comprises at least one inorganic material of a post-transition metal, a metalloid, a compound comprising at least two post-transition metal elements, a compound comprising at least two metalloid elements, or a compound comprising a post-transition metal element and a metalloid element,
the post-transition metal comprises aluminum, gallium, indium, thallium, tin, lead, flerovium, bismuth, polonium, or a combination thereof, and
the metalloid comprises boron, silicon, germanium, arsenic, antimony, tellurium, astatine, or a combination thereof, and
wherein the hole injection layer comprises a first hole injection layer and a second hole injection layer sequentially stacked on the first electrode, and
a composition of the first hole injection layer is separate and different from a composition of the second hole injection layer.

2. The light-emitting device of claim 1, wherein the inorganic material includes an alloy of a post-transition metal and a metalloid or a compound comprising a post-transition metal element and a metalloid element.

3. The light-emitting device of claim 1, wherein the inorganic material is Bi$_2$Te$_3$, Bi$_7$Te$_3$, Bi$_2$Te, Bi$_4$Te$_3$, BiTe, Bi$_6$Te$_7$, Bi$_4$Te$_5$, Bi$_x$Te$_y$, wherein $0<x<100$, $0<y<100$, and $0<x+y\leq100$, Sb$_2$Te$_3$, In$_2$Te$_3$, Ga$_2$Te$_2$, Al$_2$Te$_3$, T$_2$Te$_3$, As$_2$Te$_3$, GeSbTe, SnTe, PbTe, SiTe, GeTe, FlTe, SiGe, AlInSb, AlGaSb, AlAsSb, GaAs, InSb, AlSb, AlAs, Al$_a$In$_a$Sb, wherein $0<a<1$, Al$_b$In$_{(1-b)}$Sb, wherein $0<b<1$, AlSb, GaSb, AlInGaAs, or a combination thereof.

4. The light-emitting device of claim 1, wherein the inorganic material comprises a compound comprising a post-transition metal element and a metalloid element, wherein the metalloid element in the inorganic material has a metal content greater than about 0 wt % and less than about 50 wt %.

5. The light-emitting device of claim 1, wherein the inorganic material has a work function with an absolute value of 4.0 eV or greater.

6. The light-emitting device of claim 1, wherein the hole injection layer comprises a hole transporting material.

7. The light-emitting device of claim 6, wherein the hole injection layer has inorganic material with a weight content in a range of about 0.01 wt % to about 49.9 wt %, based on the total weight of the hole injection layer.

8. The light-emitting device of claim 1, wherein the emission layer comprises a host and a dopant, and the host comprises an anthracene compound comprising a π electron-rich C$_3$-C$_{60}$ cyclic group, —N(Q$_1$)(Q$_2$), or a combination thereof,
wherein Q$_1$ and Q$_2$ are each, independently from one another, hydrogen; deuterium; —F; —Cl; —Br; —I; a hydroxyl group; a cyano group; a nitro group; a C$_1$-C$_{60}$ alkyl group; a C$_2$-C$_{60}$ alkenyl group; a C$_2$-C$_{60}$ alkynyl group; a C$_1$-C$_{60}$ alkoxy group; a C$_3$-C$_{60}$ carbocyclic group; or a C$_1$-C$_{60}$ heterocyclic group, each, independently from one another, unsubstituted or substituted with deuterium, —F, a cyano group, a C$_1$-C$_{60}$ alkyl group, a C$_1$-C$_{60}$ alkoxy group, a phenyl group, a biphenyl group, or any combination thereof.

9. The light-emitting device of claim 8, wherein the host comprises an anthracene compound represented by Formula 1-1:

Formula 1-1

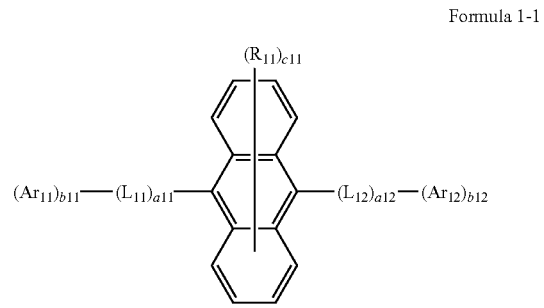

wherein, in Formula 1-1, $L_{11}$ and $L_{12}$ are each, independently from one another, a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, a11 and a12 are each, independently from one another, an integer from 0 to 5, $Ar_{11}$ and $Ar_{12}$ are each, independently from one another, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a π electron-rich $C_3$-$C_{60}$ cyclic group unsubstituted or substituted with at least one $R_{10a}$, or —N($Q_1$)($Q_2$), b11 and b12 are each, independently from one another, an integer from 1 to 5, $R_{11}$ is hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, —Si($Q_1$)($Q_2$)($Q_3$), —N($Q_1$)($Q_2$), —B($Q_1$)($Q_2$), —C(=O)($Q_1$), —S(=O)$_2$($Q_1$), or —P(=O)($Q_1$)($Q_2$), c11 is an integer from 1 to 8, and $R_{10a}$ is:

deuterium, —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each, independently from one another, unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$), —P(=O)($Q_{11}$)($Q_{12}$), or any combination thereof;

a $C_3$-$C_{60}$ carbocyclic group, a $C_1$-$C_{60}$ heterocyclic group, a $C_6$-$C_{60}$ aryloxy group, or a $C_6$-$C_{60}$ arylthio group, each, independently from one another, unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, Si($Q_{21}$)($Q_{22}$)($Q_{23}$), —N($Q_{21}$)($Q_{22}$), —B($Q_{21}$)($Q_{22}$), —C(=O)($Q_{21}$), —S(=O)$_2$($Q_{21}$), —P(=O)($Q_{21}$)($Q_{22}$), or any combination thereof; or —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), or —P(=O)($Q_{31}$)($Q_{32}$), wherein $Q_1$ to $Q_3$, $Q_{11}$ to $Q_{13}$, $Q_{21}$ to $Q_{23}$, and $Q_{31}$ to $Q_{33}$ are each, independently from one another, hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; a $C_3$-$C_{60}$ carbocyclic group; or a $C_1$-$C_{60}$ heterocyclic group, each, independently from one another, unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof.

10. The light-emitting device of claim 1, wherein the emission layer comprises a host and a dopant, and the dopant comprises a condensed-cyclic compound represented by Formula 2:

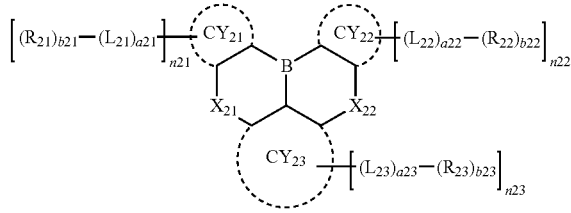

Formula 2 wherein, in Formula 2, $X_{21}$ is $C(R_{24})(R_{25})$, $N(R_{24})$, O, or S, $X_{22}$ is $C(R_{26})(R_{27})$, $N(R_{26})$, O, or S, $CY_{21}$ to $CY_{23}$ and $L_{21}$ to $L_{23}$ are each, independently from one another, a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, a21 to a23 are each, independently from one another, an integer from 0 to 5, $R_{21}$ to $R_{27}$ are each, independently from one another, hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, —Si($Q_1$)($Q_2$)($Q_3$), —N($Q_1$)($Q_2$), —B($Q_1$)($Q_2$), —C(=O)($Q_1$), —S(=O)$_2$($Q_1$), or —P(=O)($Q_1$)($Q_2$), b21 to b23 and n21 to n23 are each, independently from one another, an integer from 1 to 10, and $R_{10a}$ is:

deuterium, —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each, independently from one another, unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$), —P(=O)($Q_{11}$)($Q_{12}$), or any combination thereof;

a $C_3$-$C_{60}$ carbocyclic group, a $C_1$-$C_{60}$ heterocyclic group, a $C_6$-$C_{60}$ aryloxy group, or a $C_6$-$C_{60}$ arylthio group, each, independently from one another, unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-Coo aryloxy group, a $C_6$-$C_{60}$ arylthio group, —Si($Q_{21}$)($Q_{22}$)($Q_{23}$), —N($Q_{21}$)($Q_{22}$), —B($Q_{21}$)($Q_{22}$), —C(=O)($Q_{21}$), —S(=O)$_2$($Q_{21}$), —P(=O)($Q_{21}$)($Q_{22}$), or any combination thereof; or —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), or —P(=O)($Q_{31}$)($Q_{32}$), wherein $Q_1$ to $Q_3$, $Q_{11}$ to $Q_{13}$, $Q_{21}$ to $Q_{23}$, and $Q_{31}$ to $Q_{33}$ are each, independently from one another, hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; a $C_3$-$C_{60}$ carbocyclic group; or a $C_1$-$C_{60}$ heterocyclic group, each, independently from one another, unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof.

11. The light-emitting device of claim 1, wherein the hole transport layer comprises a hole transporting material and does not comprise the inorganic material.

12. The light-emitting device of claim 1, wherein the first hole injection layer consists of the inorganic material, and the second hole injection layer comprises the inorganic material and a hole transporting material.

13. The light-emitting device of claim 1, wherein the hole injection layer comprises a first hole injection layer and a second hole injection layer that are sequentially stacked on the first electrode, the first hole injection layer comprises the inorganic material and a hole transporting material, and the second hole injection layer consists of the inorganic material.

14. The light-emitting device of claim 1, wherein the hole injection layer comprises a first hole injection layer, a second hole injection layer, and a third hole injection layer sequentially stacked on the first electrode, the first hole injection layer and the third hole injection layer each, independently from one another, consist of the inorganic material, and the second hole injection layer comprises the inorganic material and a hole transporting material.

15. The light-emitting device of claim 1, wherein the hole injection layer comprises a first hole injection layer, a second hole injection layer, and a third hole injection layer sequentially stacked on the first, independently from one another, electrode, the first hole injection layer and the third hole injection layer each, independently from one another, comprise the inorganic material and a hole transport material, and the second hole injection layer consists of the inorganic material.

16. An electronic apparatus comprising the light-emitting device of claim 1.

17. The electronic apparatus of claim 16, further comprising a functional area in the form of a touchscreen layer, a polarization layer, a color filter, a color-conversion layer, or any combination thereof.

18. The electronic apparatus of claim 16, further comprising a color-conversion layer disposed in at least one traveling direction of light configured to be emitted from the light-emitting device.

19. A light-emitting device comprising:

a first electrode;

a second electrode facing the first electrode; and an interlayer between the first electrode and the second electrode and comprising an emission layer, wherein the interlayer comprises a hole injection layer and a hole transport layer between the first electrode and the emission layer, the hole injection layer directly contacts the first electrode, the hole injection layer has a multi-layered structure of at least two different layers that are stacked on each other, the hole injection layer comprises at least one inorganic material of a post-transition metal, a metalloid, a compound comprising at least two post-transition metal elements, a compound comprising at least two metalloid elements, or a compound comprising a post-transition metal element and a metalloid element, the post-transition metal comprises aluminum, gallium, indium, thallium, tin, lead, flerovium, bismuth, polonium, or a combination thereof, and the metalloid comprises boron, silicon, germanium, arsenic, antimony, tellurium, astatine, or a combination thereof, wherein the hole injection layer comprises a hole transporting material, and wherein the hole transporting material comprises at least one group represented by Formulae CY201 to CY217:

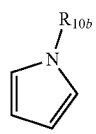
CY201

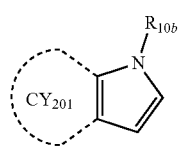
CY202

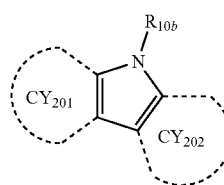
CY203

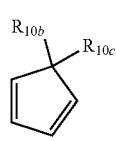
CY204

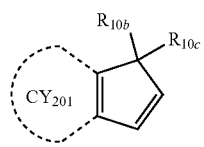
CY205

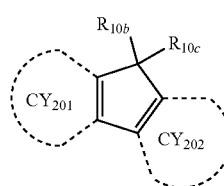
CY206

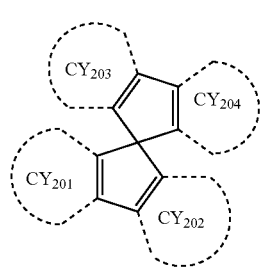
CY207

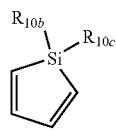
CY208

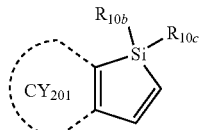
CY209

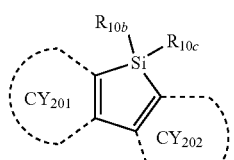
CY210

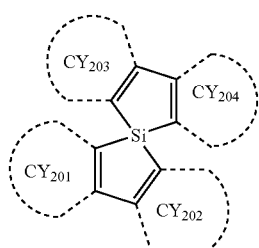
CY211

CY212

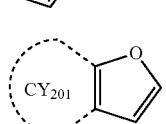
CY213

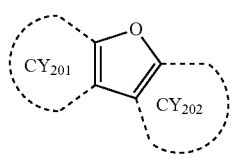
CY214

CY215

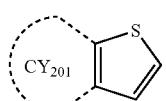
CY216

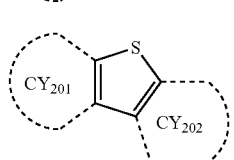
CY217 wherein, in Formulae CY201 to CY217, ring $CY_{201}$ to ring $CY_{204}$ are each, independently from one another, a $C_3$-$C_{20}$ carbocyclic group unsubstituted or substituted with at least one $R_{10a}$ or a $C_1$-$C_{20}$ heterocyclic group unsubstituted or substituted with at least one $R_{10a}$, $R_{10a}$, $R_{10b}$, and $R_{10c}$ are each, independently from one another: deuterium, —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each, independently from one another, unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$), —P(=O)($Q_{11}$)($Q_{12}$), or any combination thereof;

a $C_3$-$C_{60}$ carbocyclic group, a $C_1$-$C_{60}$ heterocyclic group, a $C_6$-$C_{60}$ aryloxy group, or a $C_6$-$C_{60}$ arylthio group, each, independently from one another, unsubstituted or substituted with deuterium, —F, —Cl, the post-transition metal comprises aluminum, gallium, indium, thallium, tin, lead, flerovium, bismuth, polonium, or a combination thereof, the metalloid comprises boron, silicon, germanium, arsenic, antimony, tellurium, astatine, or a combination thereof, the emission layer comprises a host and a dopant, the host comprises an anthracene compound comprising a π electron-rich $C_3$-$C_{60}$ cyclic group, —N($Q_1$)($Q_2$), or a combination thereof, and the dopant comprises a condensed-cyclic compound represented by Formula 2:

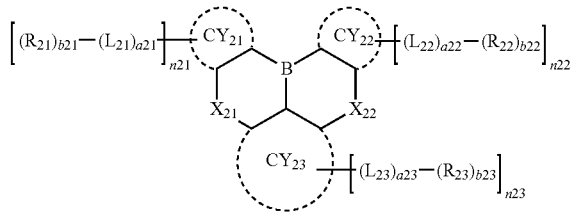

Formula 2

—Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{21}$)($Q_{22}$)($Q_{23}$), —N($Q_{21}$)($Q_{22}$), —B($Q_{21}$)($Q_{22}$), —C(=O)($Q_{21}$), —S(=O)$_2$($Q_{21}$), —P(=O)($Q_{21}$)($Q_{22}$), or any combination thereof; or Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), or —P(=O)($Q_{31}$)($Q_{32}$), wherein $Q_{11}$ to $Q_{13}$, $Q_{21}$ to $Q_{23}$, and $Q_{31}$ to $Q_{33}$ are each, independently from one another, hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; a $C_3$-$C_{60}$ carbocyclic group; or a $C_1$-$C_{60}$ heterocyclic group, each, independently from one another, unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof.

20. A light-emitting device comprising:

a first electrode;

a second electrode facing the first electrode; and an interlayer between the first electrode and the second electrode and comprising an emission layer, wherein the interlayer comprises a hole injection layer and a hole transport layer between the first electrode and the emission layer, the hole injection layer comprises a single layer directly contacting the first electrode, the hole injection layer comprises at least one inorganic material of a post-transition metal, a metalloid, a compound comprising at least two post-transition metal elements, a compound comprising at least two metalloid elements, or a compound comprising a post-transition metal element and a metalloid element, wherein, in Formula 2, $X_{21}$ is C($R_{24}$)($R_{25}$), N($R_{24}$), O, or S, $X_{22}$ is C($R_{26}$)($R_{27}$), N($R_{26}$), O, or S, $CY_{21}$ to $CY_{23}$ and $L_{21}$ to $L_{23}$ are each, independently from one another, a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, a21 to a23 are each, independently from one another, an integer from 0 to 5, $R_{21}$ to $R_{27}$ are each, independently from one another, hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, —Si($Q_1$)($Q_2$)($Q_3$), —N($Q_1$)($Q_2$), —B($Q_1$)($Q_2$), —C(=O)($Q_1$), —S(=O)$_2$($Q_1$), or —P(=O)($Q_1$)($Q_2$), b21 to b23 and n21 to n23 are each, independently from one another, an integer from 1 to 10, and $R_{10a}$ is:

deuterium, —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each, independently from one another, unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{11}$)($Q_{12}$)($Q_{13}$), —$N(Q_{11})(Q_{12})$, —$B(Q_{11})(Q_{12})$, —$C(=O)(Q_{11})$, —$S(=O)_2(Q_{11})$, —$P(=O)(Q_{11})(Q_{12})$, or any combination thereof;

a $C_3$-$C_{60}$ carbocyclic group, a $C_1$-$C_{60}$ heterocyclic group, a $C_6$-$C_{60}$ aryloxy group, or a $C_6$-$C_{60}$ arylthio group, each, independently from one another, unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —$Si(Q_{21})(Q_{22})(Q_{23})$, —$N(Q_{21})(Q_{22})$, —$B(Q_{21})(Q_{22})$, —$C(=O)(Q_{21})$, —$S(=O)_2(Q_{21})$, —$P(=O)(Q_{21})(Q_{22})$, or any combination thereof; or —$Si(Q_{31})(Q_{32})(Q_{33})$, —$N(Q_{31})(Q_{32})$, —$B(Q_{31})(Q_{32})$, —$C(=O)(Q_{31})$, —$S(=O)_2(Q_{31})$, or —$P(=O)(Q_{31})(Q_{32})$, wherein $Q_1$ to $Q_3$, $Q_{11}$ to $Q_{13}$, $Q_{21}$ to $Q_{23}$, and $Q_{31}$ to $Q_{33}$ are each, independently from one another, hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; a $C_3$-$C_{60}$ carbocyclic group; or a $C_1$-$C_{60}$ heterocyclic group, each, independently from one another, unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof.

\* \* \* \* \*